(12) United States Patent
Yamazaki et al.

(10) Patent No.: US 8,253,138 B2
(45) Date of Patent: Aug. 28, 2012

(54) THIN FILM TRANSISTOR AND DISPLAY DEVICE HAVING THE THIN FILM TRANSISTOR

(75) Inventors: Shunpei Yamazaki, Tokyo (JP); Satoshi Kobayashi, Kanagawa (JP); Yoshiyuki Kurokawa, Kanagawa (JP); Hiromichi Godo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 402 days.

(21) Appl. No.: 12/263,702

(22) Filed: Nov. 3, 2008

(65) Prior Publication Data
US 2009/0114917 A1 May 7, 2009

(30) Foreign Application Priority Data
Nov. 5, 2007 (JP) .................................. 2007-286942

(51) Int. Cl.
*H01L 29/04* (2006.01)
(52) U.S. Cl. .................................. 257/59; 257/E29.004
(58) Field of Classification Search .................... 257/57, 257/59, 61, 66, 72, E29.117, E29.294
See application file for complete search history.

(56) References Cited

U.S. PATENT DOCUMENTS

| 4,409,134 | A |   | 10/1983 | Yamazaki |  |
|---|---|---|---|---|---|
| 5,294,811 | A | * | 3/1994 | Aoyama et al. | 257/59 |
| 5,453,858 | A |   | 9/1995 | Yamazaki |  |
| 5,532,180 | A | * | 7/1996 | den Boer et al. | 438/30 |
| 5,561,074 | A |   | 10/1996 | Koide et al. |  |
| 5,591,987 | A |   | 1/1997 | Yamazaki et al. |  |
| 5,701,167 | A |   | 12/1997 | Yamazaki |  |
| 5,849,601 | A |   | 12/1998 | Yamazaki |  |
| 6,023,075 | A |   | 2/2000 | Yamazaki |  |
| 6,252,249 | B1 |   | 6/2001 | Yamazaki |  |

(Continued)

FOREIGN PATENT DOCUMENTS
JP 04-242724 8/1992
(Continued)

OTHER PUBLICATIONS

Arai et al., "41.2: Micro Silicon Technology for Active Matrix OLED Display," SID Digest '07: SID International Symposium Digest of Technical Papers, 2007, vol. XXXVIII, pp. 1370-1373.

(Continued)

*Primary Examiner* — Ha Tran T Nguyen
*Assistant Examiner* — Vongsavanh Sengdara
(74) *Attorney, Agent, or Firm* — Eric J. Robinson; Robinson Intellectual Property Law Office, P.C.

(57) ABSTRACT

A thin film transistor includes a gate electrode, a gate insulating layer covering the gate electrode, a microcrystalline semiconductor layer over the gate insulating layer, an amorphous semiconductor layer over the microcrystalline semiconductor layer, source and drain regions over the amorphous semiconductor layer, source and drain electrodes in contact with and over the source and drain regions, and a part of the amorphous semiconductor layer overlapping with the source and drain regions is thicker than a part of the amorphous semiconductor layer overlapping with a channel formation region. The side face of the source and drain regions and the side face of the amorphous semiconductor form a tapered shape together with an outmost surface of the amorphous semiconductor layer. The taper angle of the tapered shape is such an angle that decrease electric field concentration around a junction portion between the source and drain regions and the amorphous semiconductor layer.

36 Claims, 53 Drawing Sheets

U.S. PATENT DOCUMENTS

| | | | |
|---|---|---|---|
| 6,306,213 | B1 | 10/2001 | Yamazaki |
| 7,067,844 | B2 | 6/2006 | Yamazaki |
| 7,098,479 | B1 | 8/2006 | Yamazaki |
| 7,115,902 | B1 | 10/2006 | Yamazaki |
| 2002/0033907 | A1* | 3/2002 | Oke et al. .................. 349/46 |
| 2002/0047825 | A1* | 4/2002 | Yamazaki .................. 345/99 |
| 2002/0171085 | A1* | 11/2002 | Suzawa et al. .................. 257/72 |
| 2003/0164908 | A1* | 9/2003 | Wang .................. 349/113 |
| 2005/0230685 | A1* | 10/2005 | Oishi et al. .................. 257/72 |
| 2007/0018165 | A1 | 1/2007 | Yamazaki |
| 2009/0061573 | A1 | 3/2009 | Miyairi et al. |

FOREIGN PATENT DOCUMENTS

| | | |
|---|---|---|
| JP | 05-226656 | 9/1993 |
| JP | 5226656 A * | 9/1993 |
| JP | 08-008440 | 1/1996 |
| JP | 08-088397 | 4/1996 |
| JP | 2002-258324 | 9/2002 |
| JP | 2005-049832 | 2/2005 |

OTHER PUBLICATIONS

International Search Report (Application No. PCT/JP2008/070254) Dated Jan. 27, 2009.

Written Opinion (Application No. PCT/JP2008/070254) Dated Jan. 27, 2009.

* cited by examiner

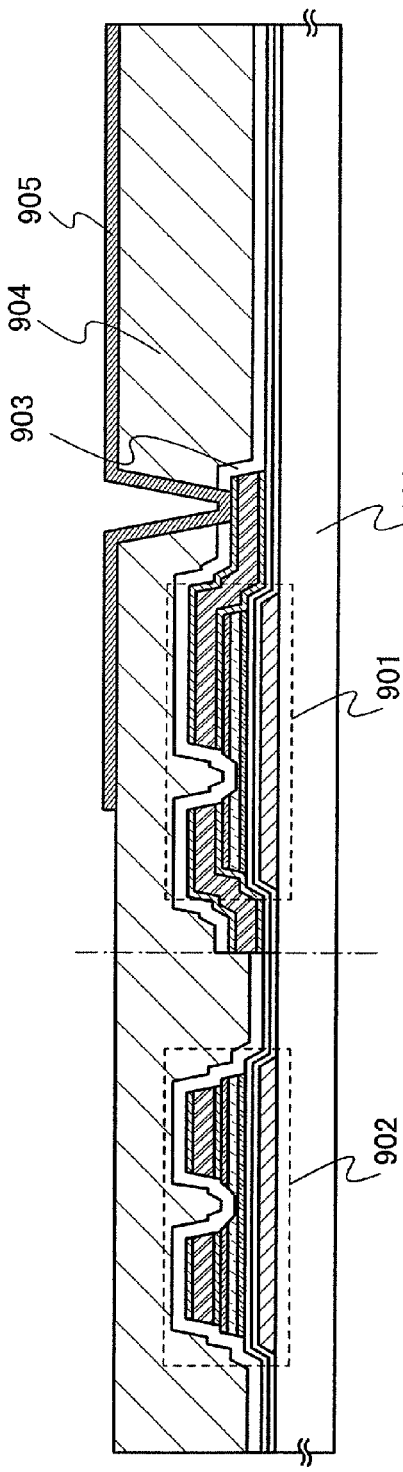
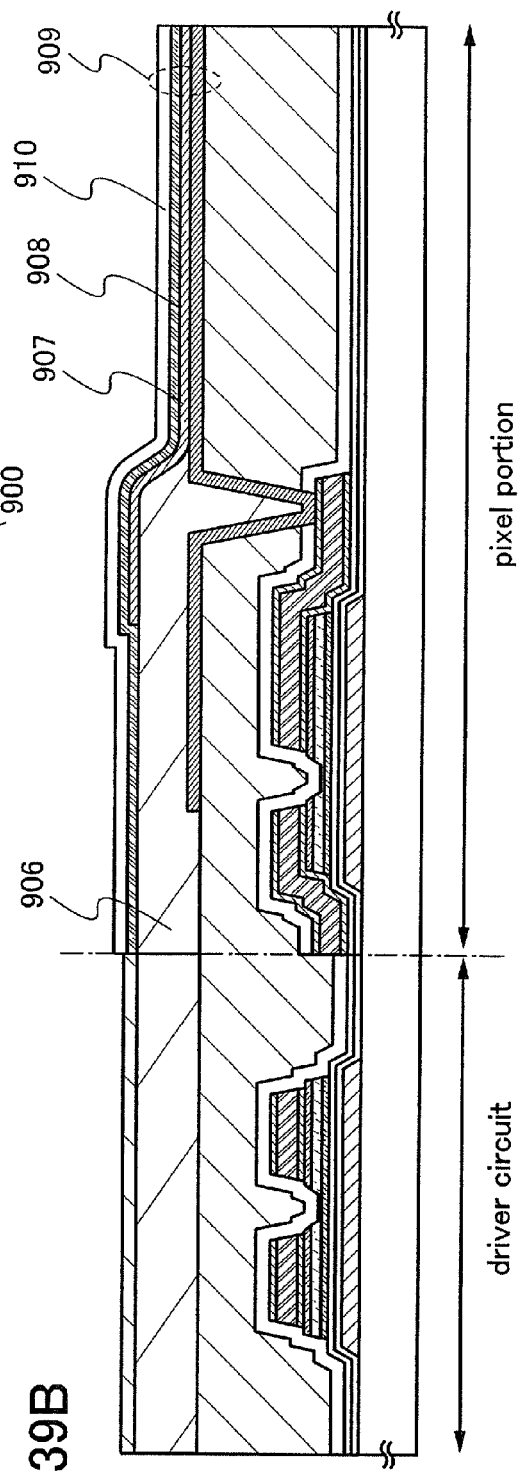
FIG. 39A
FIG. 39B

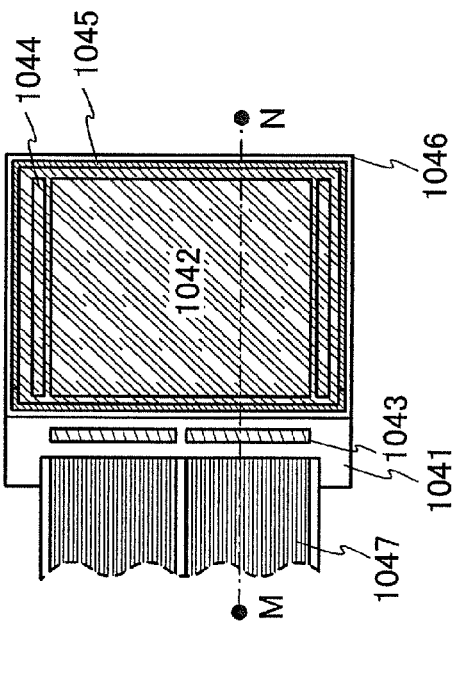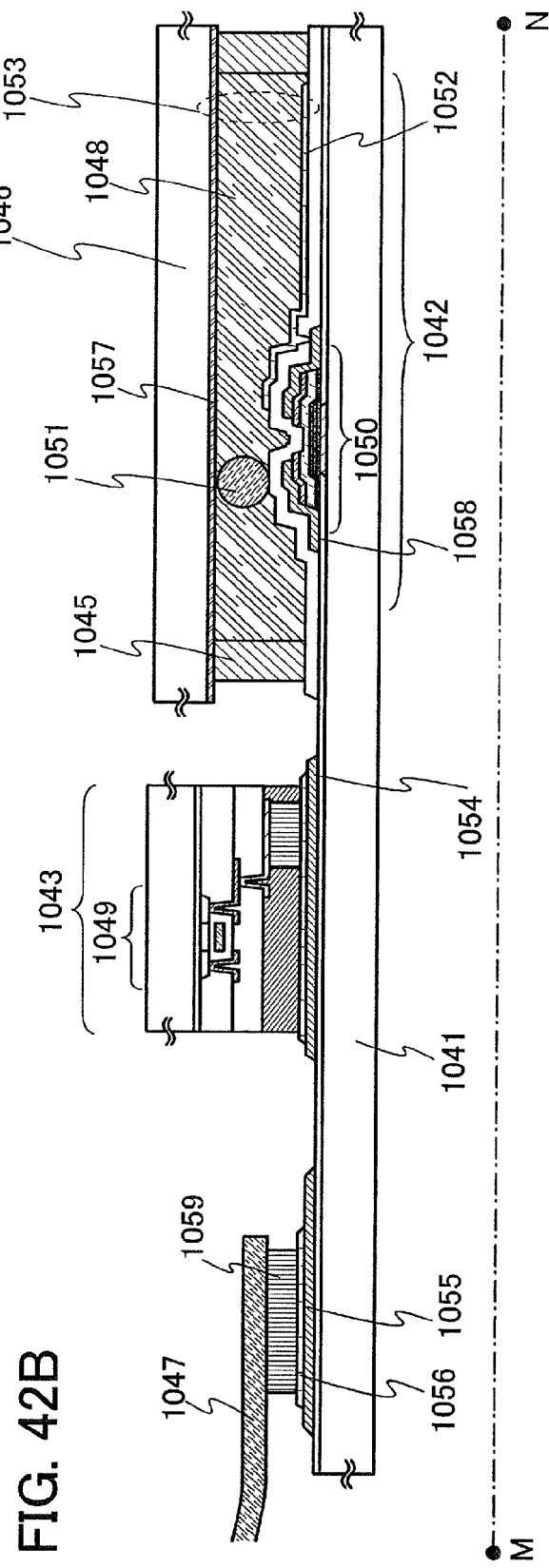
FIG. 42A
FIG. 42B

Id-Vg curve for each d1 when d2=10nm, $\theta$ =10°

Id-Vg curve for each d1 when d2=10nm, $\theta$ =30°

Id-Vg curve for each d1 when d2=10nm, $\theta$=50°

Id-Vg curve for each d1 when d2=10nm, $\theta$=70°

Id-Vg curve for each d1 when d2=10nm, $\theta$ =90°

On current to d1 for each d2 when $\theta=10°$, Vds=14V, Vg=+20V

On current to d1 for each d2 when $\theta=90°$, Vds=14V, Vg=+20V

Off current to d1 for each d2 when $\theta = 10°$, Vds=14V, Vg=-20V

Off current to d1 for each d2 when $\theta = 30°$, Vds=14V, Vg=-20V

Off current to d1 for each d2 when $\theta = 50°$, Vds=14V, Vg=-20V

Off current to d1 for each d2 when $\theta = 70°$, Vds=14V, Vg=-20V

Off current to d1 for each d2 when $\theta = 90°$, Vds=14V, Vg=−20V

THIN FILM TRANSISTOR AND DISPLAY DEVICE HAVING THE THIN FILM TRANSISTOR

TECHNICAL FIELD

The present invention relates to a method for manufacturing thin film transistors. Further, the present invention relates to display devices including the thin film transistors.

BACKGROUND ART

In recent years, thin film transistors formed using a semiconductor thin film (having a thickness of several nanometers to several hundreds of nanometers) formed over a substrate having an insulating surface (e.g., a glass substrate) have been attracting attentions. Thin film transistors are widely used for ICs (integrated circuits) and electronic devices such as electrooptical devices. In particular, thin film transistors are urgently developed as switching elements of image display devices typified by liquid crystal display devices, EL display devices and the like. In a liquid crystal display device (active matrix liquid crystal display device) which adopts a method in which display patterns are shown on a screen by driving a pixel electrode arranged in matrix with use of a switching element, specifically, a voltage is applied between a selected pixel electrode and a counter electrode arranged to be opposite the pixel electrode, optical modulation occurs in a liquid crystal layer provided between the pixel electrode and the counter electrode, whereby a display pattern is formed by the optical modulation and is recognized by a user.

Such active matrix liquid crystal display devices have been used more widely and there are growing demands for larger area of screens, higher definition, and higher aperture ratio. Further, higher reliability is required.

It is very important for such active matrix display devices to suppress off current which is one of thin film transistor characteristics. For example, if off current (leakage current flowing between a source electrode and a drain electrode in turning off) of a thin film transistor formed in a pixel portion is large, stable and excellent display is difficult. It is thought that one cause of off current in an inverted staggered thin film transistor (in particular, a channel etched thin film transistor) which is widely used for an active matrix display device is that current flows in a back channel. A variety of devices are made to prevent current from flowing in a back channel (for example, Reference 1: Japanese Published Patent Application No. H8-8440).

In addition, as a switching element of an image display device, a thin film transistor using microcrystalline semiconductor is known, as well as such a thin film transistor using amorphous semiconductor or such a thin film transistor using polycrystalline semiconductor film (for example, Reference 2: Japanese Published Patent Application No. H4-242724, Reference 3: Japanese Published Patent Application No. 2005-49832, Reference 4: U.S. Pat. No. 4,409,134, and Reference 5: U.S. Pat. No. 5,591,987).

As a method for manufacturing a thin film transistor using microcrystalline semiconductor, a technique is known in which an amorphous silicon film is formed over a gate insulating film, a metal film is formed over the amorphous silicon film, and the metal film is irradiated with a diode laser to modify the amorphous silicon film into a microcrystalline silicon film. With this manufacturing method, the metal film formed over the amorphous silicon film only converts light energy of the diode laser into thermal energy and is removed in a later step. That is, the amorphous silicon film is heated only by heat conducted from the metal film and the microcrystalline silicon film is formed by this heat (for example, see Reference 6: Troshiaki ARAI and others, SID '07 DIGEST, 2007, pp. 1370 to 1373).

DISCLOSURE OF INVENTION

The present invention provides a thin film transistor having a small amount of off current.

Further, the present invention provides a method for manufacturing a thin film transistor having a small amount of off current.

A thin film transistor according to an aspect of the present invention includes a gate electrode, a gate insulating layer formed covering the gate electrode, a microcrystalline semiconductor layer formed over the gate insulating layer, an amorphous semiconductor layer formed over the microcrystalline semiconductor layer, a source region and a drain region formed over the amorphous semiconductor layer, a source electrode and a drain electrode formed in contact with and over the source region and the drain region, and a part of the amorphous semiconductor layer overlapping with the source region and the drain region is thicker than a part of the amorphous semiconductor layer overlapping with a channel formation region. In other words, the amorphous semiconductor layer has a structure similar to a structure of a so-called channel etched thin film transistor, and the part of the amorphous semiconductor layer overlapping with the channel formation region has an etched portion (a back channel portion). Further, the etched portion has a tapered shape. In this case, a taper angle of the tapered shape is such an angle that can release an electric field concentration around or at the interface between the amorphous semiconductor layer and the source region and the drain region.

In manufacturing the above thin film transistor, a multitone mask (a halftone mask or a gray tone mask) is preferably used. The use of such a multitone mask for manufacturing the above thin film transistor makes it possible to manufacture a thin film transistor with a small amount of leakage current in the small number of steps. In addition, the multitone mask is recessed by an ashing process or the like. The ashing process is generally conducted with use of oxygen plasma. In the manufacture of the above thin film transistor, a method in which an oxygen gas is mixed to an etching gas is given as one method for allowing the back channel portion to have a tapered shape. By supplying the oxygen plasma used for recessing the multitone mask and the oxygen gas mixed into the etching gas through the same path, a configuration of the apparatus is not complicated, and thus a thin film transistor having excellent electric characteristics can be manufactured without a complicated manufacturing process.

The microcrystalline semiconductor layer of the thin film transistor may include an impurity element having one conductivity type. When an impurity element having one conductivity type is included in the microcrystalline semiconductor layer of the above thin film transistor, on current of the thin film transistor can be increased.

In formation of the microcrystalline semiconductor layer of the thin film transistor, the microcrystalline semiconductor layer may be formed while etching an amorphous semiconductor portion included in the microcrystalline semiconductor layer. By forming the microcrystalline semiconductor layer while etching the amorphous semiconductor layer portion, a highly crystalline microcrystalline semiconductor layer in which less amorphous semiconductor is included can be formed.

In formation of the microcrystalline semiconductor layer of the thin film transistor, the microcrystalline semiconductor layer may be directly or indirectly irradiated with laser light after the formation of the microcrystalline semiconductor layer. By directly or indirectly irradiating the microcrystalline semiconductor layer with laser light after the formation of the microcrystalline semiconductor layer, a thin film transistor having a microcrystalline semiconductor layer with improved crystallinity and a large amount of on current can be formed.

A thin film transistor according to an aspect of the present invention can be used for one or both of a pixel portion and a driver circuit portion. By using a microcrystalline semiconductor layer for a thin film transistor according to an aspect of the present invention, a part or the whole of a driver circuit can be formed over the same substrate as a pixel portion, whereby a system-on-panel can be obtained. The mobility of the thin film transistor using a microcrystalline semiconductor layer for a channel formation region is high, and is 5 to 20 times the mobility of the thin film transistor formed using an amorphous semiconductor layer for a channel formation region.

Note that the term "display device" includes a light-emitting device and a liquid crystal display device. A light-emitting element is provided for a light-emitting device, while a liquid crystal element is provided for a liquid crystal display device. A light-emitting element includes, in its category, an element whose luminance is controlled with current or voltage, specifically, an organic electroluminescent (EL) element and an inorganic EL element.

A display device in this specification means an image display device, a light-emitting device, or a light source (including a lighting device). Further, the display device includes any of the following modules in its category: a module including a connector such as a flexible printed circuit (FPC), a tape automated bonding (TAB) tape, or a tape carrier package (TCP) film; a module having TAB tape or a TCP film which is provided with a printed wiring board at the end thereof; and a module having an integrated circuit (IC) which is directly mounted on a display element by a chip on glass (COG) method.

Note that a "film" means a film which is entirely formed over an object and is not patterned. As for each layer of stacked films, a "film" and a "layer" are used in an indistinguishable manner in some cases.

Note that a drain voltage ($V_d$) means a drain potential (a potential difference between a source and a drain) with respect to a source potential as a reference potential, while a gate voltage ($V_g$) means a gate potential (a potential difference between a source and a gate) with respect to a source potential as a reference potential. Further, a drain current ($I_d$) means a current flowing between a source and a drain.

In accordance with the present invention, a thin film transistor having high withstand-voltage, a small amount of off current and excellent electrical characteristics can be obtained.

By applying the present invention to a thin film transistor having a large amount of on current, a thin film transistor having a large amount of on current and a small amount of off current and excellent switching characteristics can be obtained. By applying such a thin film transistor to an active matrix display device, the display device can have high contrast ratio.

BRIEF DESCRIPTION OF DRAWINGS

In the accompanying drawings:

FIGS. 39A and 39B illustrate a light-emitting device to which the present invention can be applied;

FIGS. 42A and 42B are a top view and a cross-sectional view, respectively, illustrating a liquid crystal display panel according to an aspect of the present invention;

BEST MODE FOR CARRYING OUT THE INVENTION

Embodiment Mode

Figure 1:
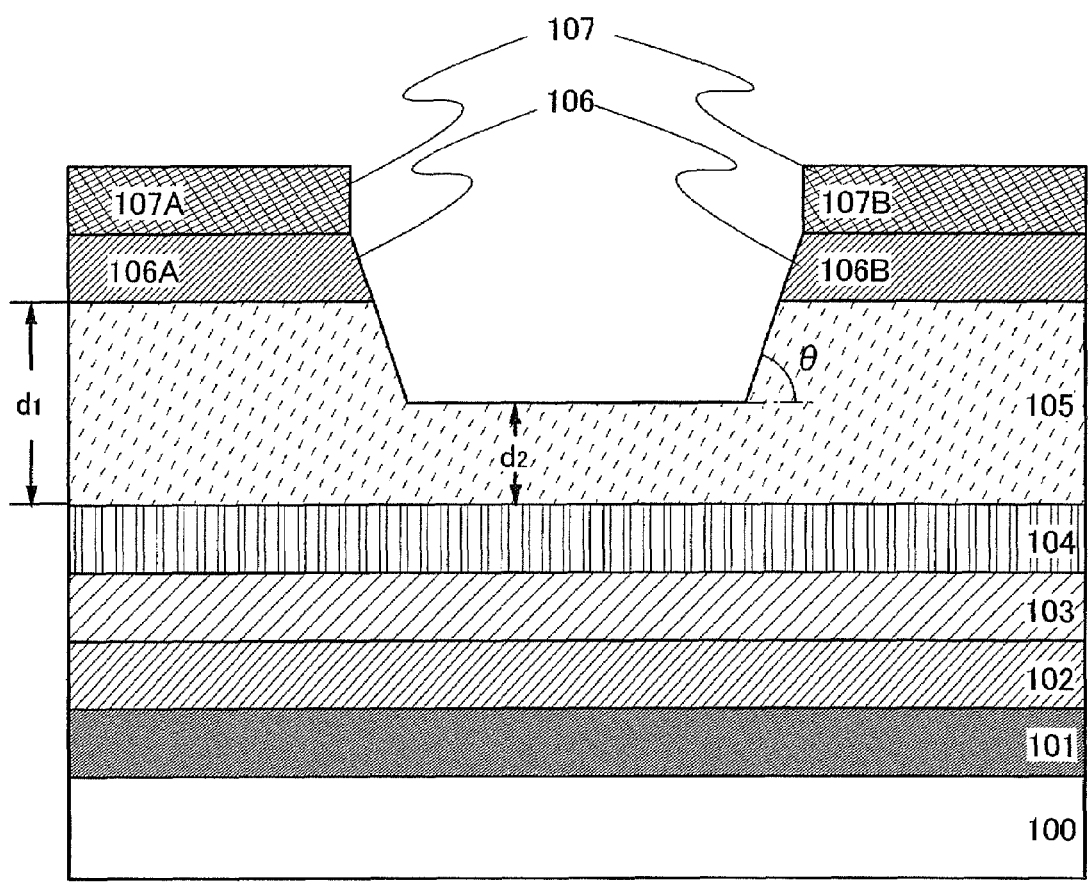
FIG. 1 illustrates a structure of a thin film transistor according to an aspect of the present invention.

Embodiment Modes of the present invention will be described below with reference to the accompanying drawings. However, the present invention is not limited to the following description. It is easily understood by those skilled in the art that the mode and detail can be variously changed unless departing from the scope and spirit of the present invention. Therefore, the present invention should not be interpreted as being limited to the description of the embodiment modes to be given below. Note that in the description made with reference to the drawings, the same reference numerals denoting like portions are used in common in different drawings. The same hatching pattern is applied to like portions, and the like portions are not especially denoted by reference numerals in some cases. In addition, in some top views, there may be a case where an insulating layer or the like is not especially shown.

Embodiment Mode 1

In Embodiment Mode 1, a structure of a thin film transistor according to an aspect of the present invention will be described with reference to computational (device simulation) results as appropriate FIG. 1 illustrates a device structure of a thin film transistor according to an aspect of the present invention, and the thin film transistor is adopted for computation. As an insulating substrate 100, a glass substrate containing mainly silicon oxide, for example, can be used. In this case, the dielectric constant of the insulating substrate 100 is 4.1 and the thickness of the glass substrate is 0.5 µm. Note that in many actual manufacturing processes of thin film transistors, a glass substrate having a thickness of about 0.5 mm to 0.7 mm is used. However, in the device simulation, the thickness may be sufficiently large such that an electric field below the insulating substrate 100 does not adversely affect on electric characteristics of a thin film transistor, and may be determined in consideration of computation efficiency.

A first conductive layer 101 serving as a gate electrode is formed over an insulating substrate 100. The first conductive layer 101 is not limited to one formed of a particular material, and typically, a conductive layer formed of a metal material, or the like can be used. For example, a stacked layer of aluminum and molybdenum can be used as the first conductive layer 101.

In the device structure of the thin film transistor illustrated in FIG. 1, when the first conductive layer 101 is formed of plural layers which are stacked, electric characteristics of the thin film transistor are not influenced by a material of the lower layer of the first conductive layer (aluminum in a case where a molybdenum layer is stacked over the aluminum layer as a conductive layer). Therefore, computation is conducted to molybdenum only for the sake of simple computation. In the device simulation, the first conductive layer 101 is 150 nm thick and the work function of molybdenum is 4.6 eV.

An insulating layer serving as a gate insulating layer is provided over the first conductive layer 101. The insulating layer is not limited to a particular material, for example, silicon nitride or the like can be used. In this case, as the gate insulating layer, a stacked layer is used, in which a second insulating layer 103 is formed over the first insulating layer 102. Silicon nitride having a thickness of 110 nm and a dielectric constant of 7.0 is used as the first insulating layer 102, while silicon oxynitride having a thickness of 110 nm and a dielectric constant of 4.1 is used as the second insulating layer 103.

Over the second insulating layer 103, a microcrystalline semiconductor layer 104 and an amorphous semiconductor layer 105 are stacked. Note that the amorphous semiconductor layer is also referred to as buffer in some cases, because the amorphous semiconductor layer serves as a buffer layer. In the device simulation, a stacked layer is used, in which the microcrystalline semiconductor layer 104 having a thickness of 20 nm and the amorphous semiconductor layer 105 having a thickness of 60 nm are stacked over the second insulating layer 103.

A recession portion having a depth of 30 nm is provided in the center portion (back channel portion) of the amorphous semiconductor layer 105. The side face of the recession portion is tapered. Computation is conducted to a case where the taper angle θ is 10° to 90°, inclusive. Note that the taper angle θ is an angle which is made by a bottom (which is parallel to the insulating substrate 100) of the recession portion and the side face of the recession portion, and the taper angle θ is 0° to 90°, as illustrated in FIG. 1. Note that an inverse tapered shape is not included in this case.

An impurity semiconductor layer 106 serving as a source region 106A and a drain region 106B is present in a region not overlapping with the recession portion, over the amorphous semiconductor layer 105. In the device simulation, the thickness of the impurity semiconductor layer 106 is 50 nm. In this case, the distance between the source region 106A and the drain region 106B is a channel length of the thin film transistor and is 6 μm. In addition, the impurity concentration (donor concentration) of the impurity semiconductor layer 106 is set to $1\times10^{19}$ cm$^{-3}$ so as to exhibit high conductivity.

A second conductive layer 107 serving as the source electrode 107A and the drain electrode 107B is present over the impurity semiconductive layer 106. The second conductive layer 107 serving as the source electrode 107A and the drain electrode 107B is not limited to one formed of a particular material, and one formed of a metal material, or the like can be used. For example, a stacked layer in which aluminum is formed over molybdenum can be used as the second conductive layer 107. In the device simulation, the thickness of the second conductive layer 107 is 300 nm and it is assumed that the second conductive layer 107 and the impurity semiconductor layer 106 have an ohmic contact with each other. Note that side faces of the amorphous semiconductor layer 105 and the impurity semiconductor layer 106 are present in substantially the same plane.

In the device structure illustrated in FIG. 1, electric characteristics of the thin film transistor are not influenced by the material of the upper layer of the source electrode 107A and the drain electrode 107B (aluminum in a case where aluminum is stacked over molybdenum as the second conductive layer 107). For the reason, computation is conducted to a single layer of molybdenum for the sake of simple computation. In this device simulation, the thickness of the second conductive layer 107 is 300 nm.

Results of the device simulation are described below. In this case, simulation software "ATLAS" made by Silvaco is used for computation. Note that the carrier (electrons) generation rate $G_{BBT}$ is a value calculated by the expression $G_{BBT}=(BB\cdot A)*E^{(BB\cdot GAMMA)}\exp\{-(BB\cdot B)/E\}$, wherein E denotes electric field intensity and BB·A, BB·GAMMA, and BB·B are parameters. In the case of a crystalline semiconductor, BB·A=$5.0\times10^{15}$, BB·GAMMA=2.0, BB·B=$3.0\times10^{7}$ are used. In the case of an amorphous semiconductor used to form a buffer, BB·A=$9.7\times10^{12}$, BB·GAMMA=1.6, and BB·B=$3.0\times10^{7}$ are used.

Figure 2:
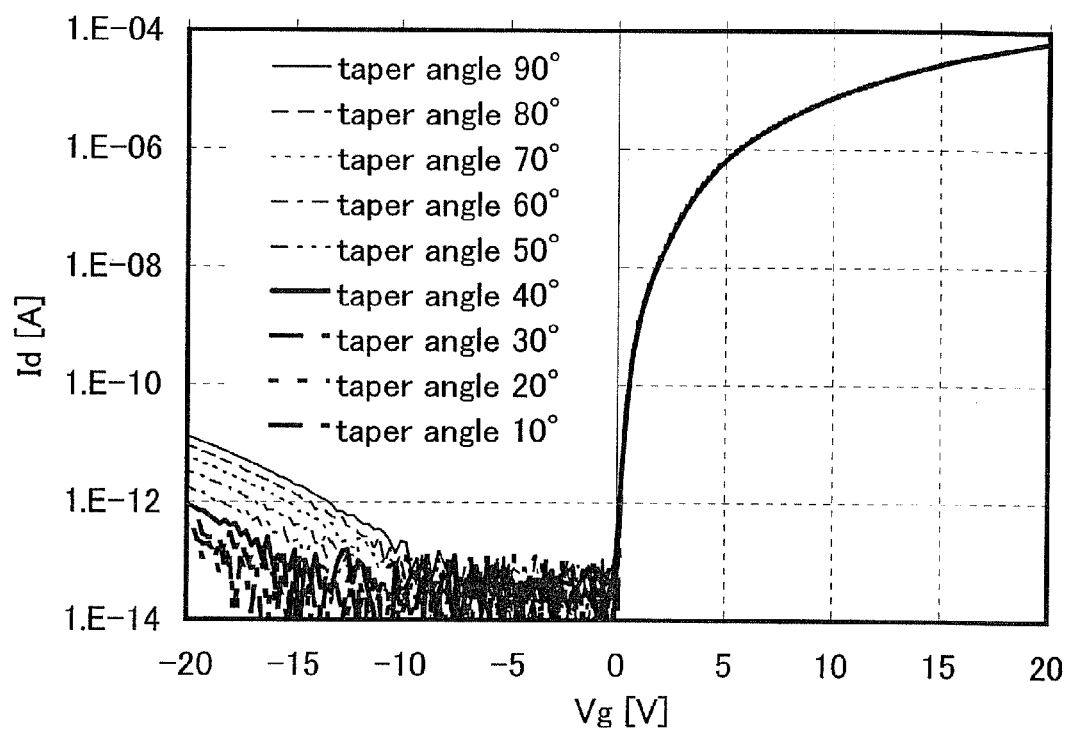
FIG. 2 shows DC characteristics of the thin film transistor illustrated in FIG. 1.
Figure 3:
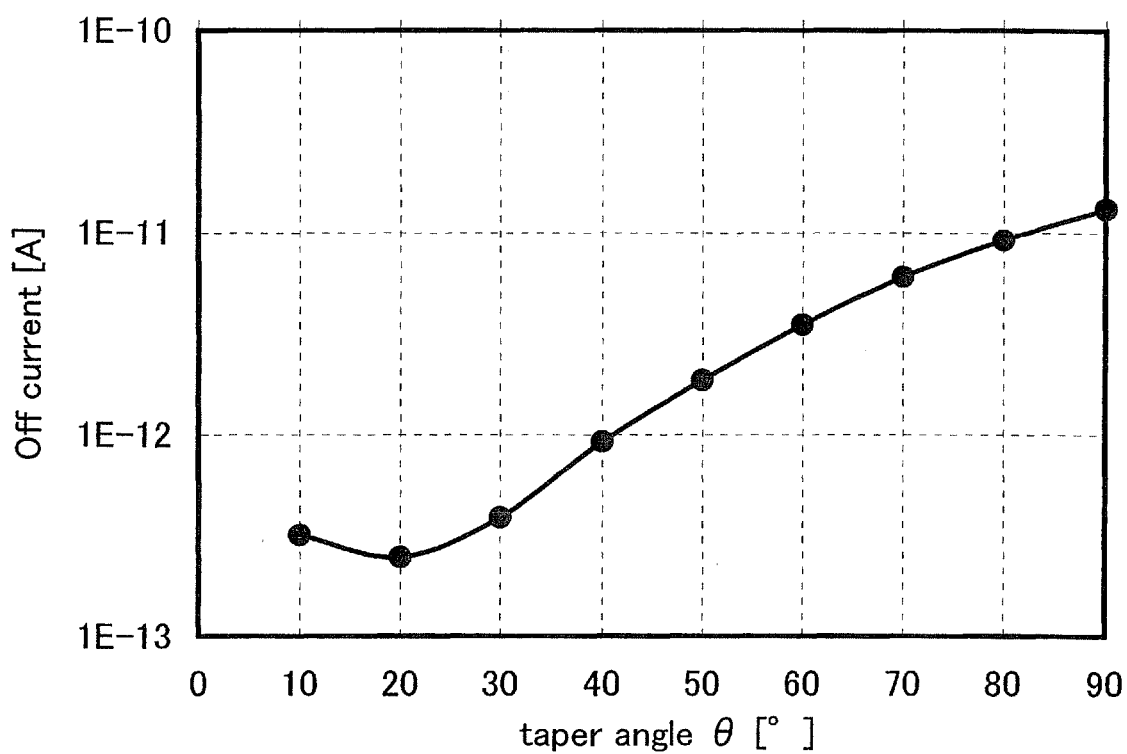
FIG. 3 shows dependency of off current on a taper angle, in the thin film transistor illustrated in FIG. 1.
Figure 4:
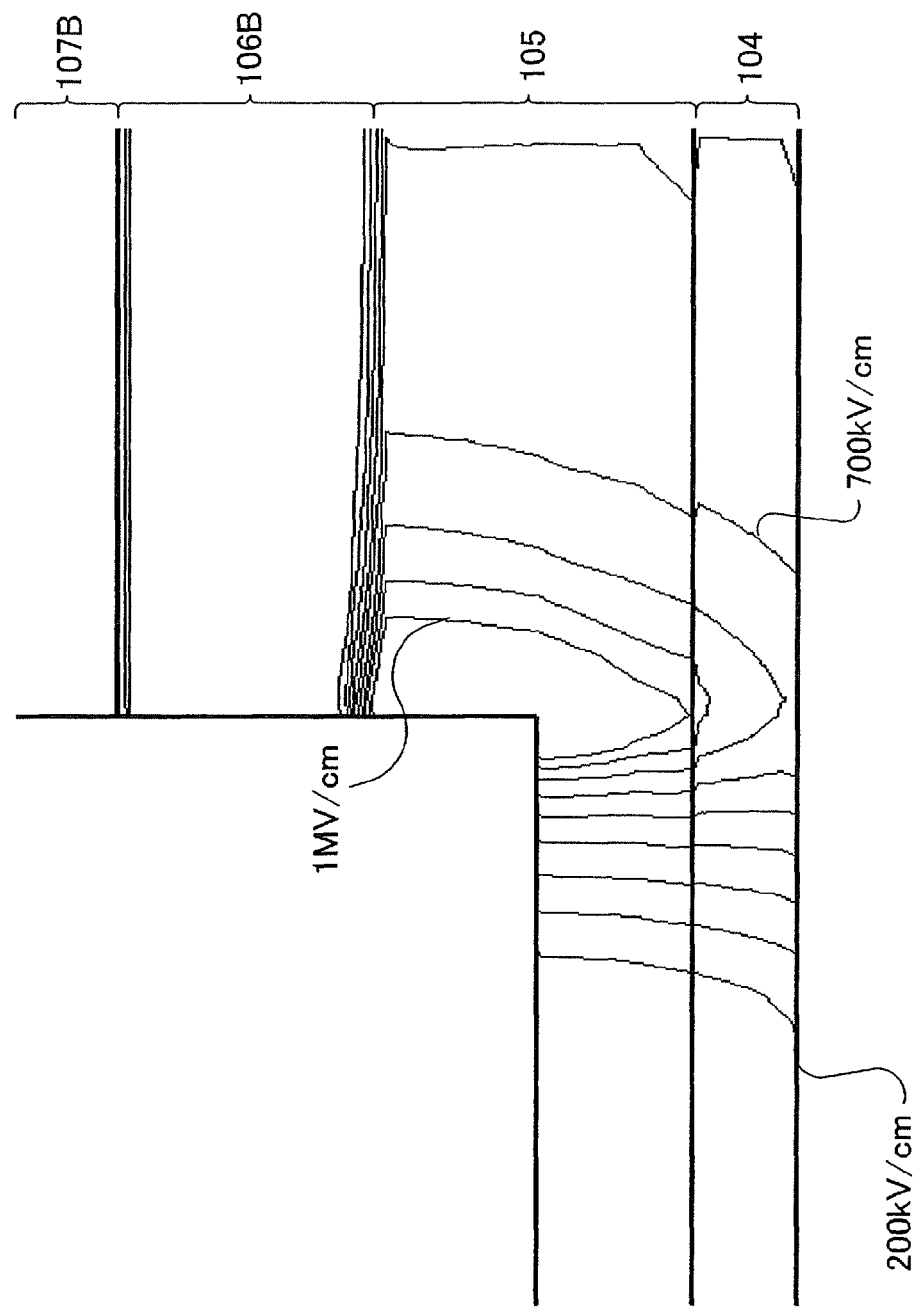
FIG. 4 illustrates distribution of an electric field intensity of the thin film transistor illustrated in FIG. 1.
Figure 5:
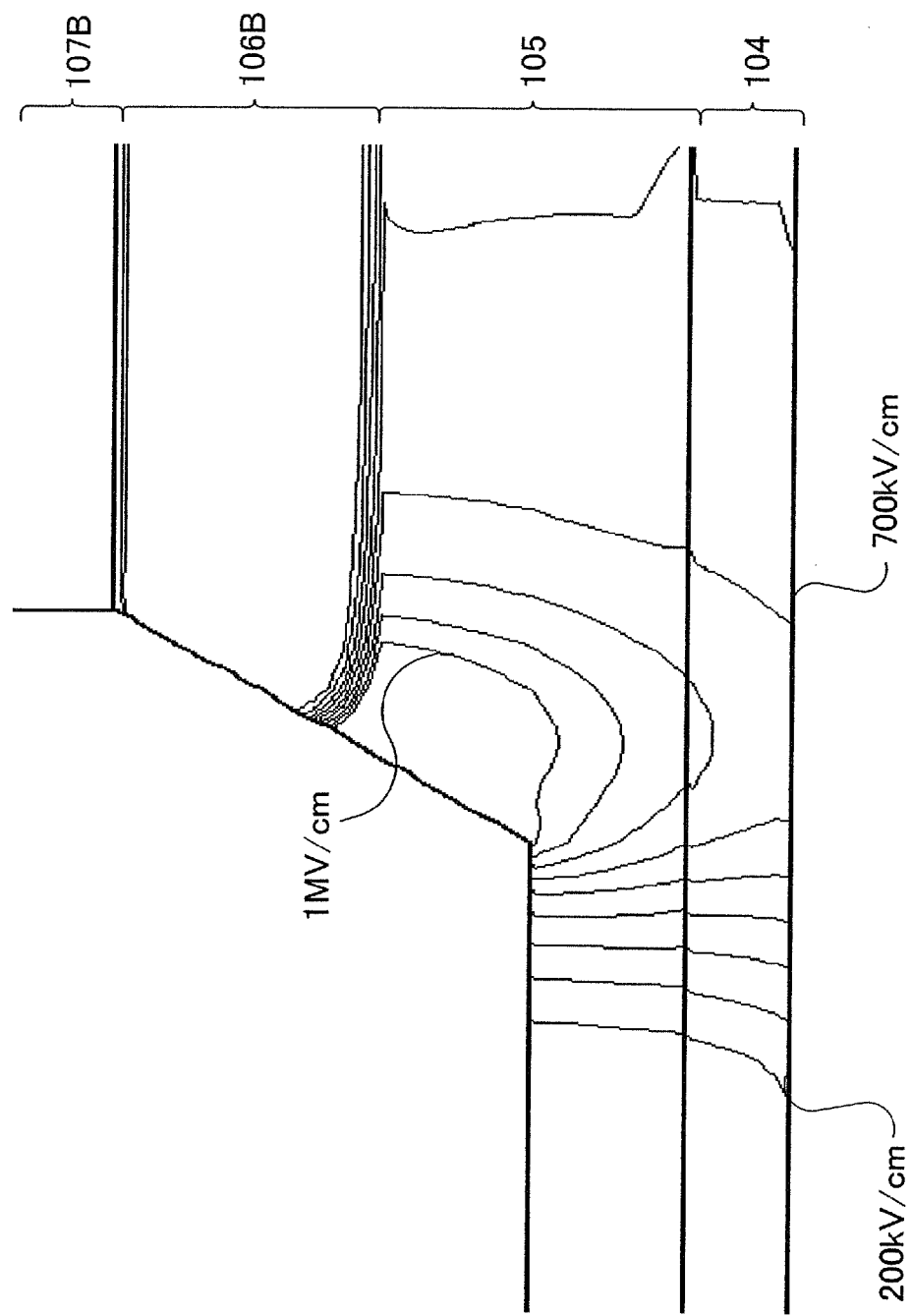
FIG. 5 illustrates distribution of an electric field intensity of the thin film transistor illustrated in FIG. 1.
Figure 6:
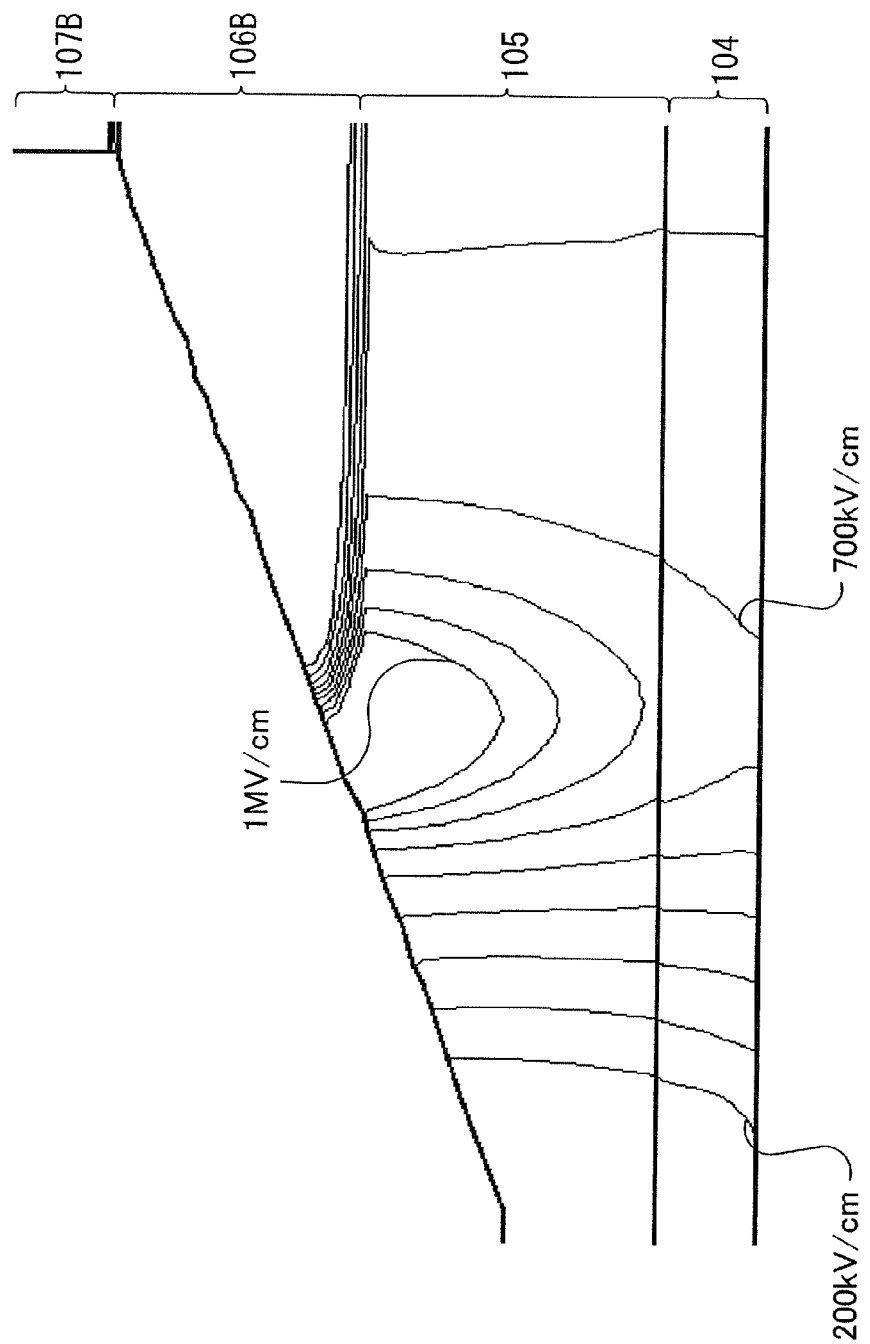
FIG. 6 illustrates distribution of an electric field intensity of the thin film transistor illustrated in FIG. 1.

FIG. 2 shows DC characteristic results of a device simulation when the taper angle θ is changed ($V_g$-$I_d$ characteristics, $V_d$=14V). FIG. 3 shows dependency on the taper angle θ of off current (drain current at $V_g$=−20V, $V_d$=14V). Further, FIG. 4, FIG. 5, and FIG. 6 illustrate distribution of electric filed intensity in the vicinity of the side face of the back channel portion (side face of the recession portion) at the taper angle θ of 90°, 40° and 10°, respectively.

According to FIG. 2, it is found that drain current $I_d$ in an on region ($V_g$>0V) is nearly independent of the taper angle θ. In other words, a threshold voltage, a mobility and an S value (subthreshold swing) and the like are nearly independent of the taper angle θ. Therefore, only an off region ($V_g$<0V) is considered.

Here, the term "S value or subthreshold swing" is a gate voltage necessary for increasing a current (subthreshold current) between the source electrode 107A and the drain electrode 107B by one digit, and the smaller a subthreshold swing is, the steeper the slope of the subthreshold current with respect to the gate voltage is and the more excellent the switching characteristics are. Note that the "gate voltage" means a gate potential with respect to a source potential serving as a reference.

According to FIG. 2, it is found that drain current becomes smaller, as the taper angle θ is smaller in the off region ($V_g$<0V), in particular, $V_g$<−10V. This is evident in FIG. 3. In FIG. 3, in the range of 10° to 20° of the taper angle θ, off current increases more as the taper angle θ is smaller. This is caused by insufficiency of computation accuracy in the device simulation, because the drain current is too small, and never impairs an effect of decrease of drain current accompanying decrease of the taper angle θ.

Next, a principle of the decrease of drain current accompanying decrease of the taper angle θ is described with reference to FIG. 4, FIG. 5 and FIG. 6. In the thin film transistor having a microcrystalline semiconductor layer of the present invention, a cause of off current generation is mainly a tunnel current between bands on the drain side of the microcrystalline semiconductor layer. The tunnel current between bands increases or decreases in accordance with the size of a curve of the energy band, i.e., the intensity of electric field. In other words, reduction of electric field on the drain side of the microcrystalline semiconductor layer can reduce off current.

As illustrated in FIG. 4, at the taper angle θ of 90°, the electric field intensity is high at a corner portion of the recession portion of the amorphous semiconductor layer 105, and electric field is concentrated at this portion. Note that the electric field intensity on the drain side of the microcrystalline semiconductor layer 104 reaches 1 MV·cm$^{-1}$ at maximum.

As illustrated in FIG. 5, at the taper angle θ of 40°, the electric field intensity is high in the vicinity of the side face of the recession portion, but is not concentrated at the corner portion. The electric field intensity on the drain side of the microcrystalline semiconductor layer 104 is about 800 kV·cm$^{-1}$ (0.8 MV·cm$^{-1}$) at maximum, and is about 80% of that in the case of taper angle θ of 90° illustrated in FIG. 4. Accordingly, it is found that the tunnel current between bands decreases.

As illustrated in FIG. 6, at the taper angle θ of 10°, the electric field is lower than that in the vicinity of the side face of the recession portion at the taper angle θ of 40° illustrated in FIG. 5. The electric field intensity on the drain side of the microcrystalline semiconductor layer 104 is lower than 800 kV·cm$^{-1}$ (0.8 MV·cm$^{-1}$) and is lower than 80% of that in the case of taper angle θ of 90° illustrated in FIG. 4. Therefore, the electric field intensity is more decreased than that of the taper angle θ of 40° illustrated in FIG. 5.

From the above, the recession portion provided in the amorphous semiconductor layer 105 of the thin film transistor having the structure illustrated in FIG. 1 is made to have a tapered shape, thereby decreasing the electric field intensity. This is because the recession portion provided in the amorphous semiconductor layer 105 has a tapered shape and thereby, the electric field intensity on the drain side of the microcrystalline semiconductor layer 104 is decreased, and the tunnel current between bands is decreased. In this way, off current can be reduced. In particular, as apparent from FIG. 3, as compared with the case of the taper angle θ of 90°, off current is reduced by one digit at the taper angle of 40° or smaller, which is very preferable.

Next, more detailed computation is conducted, whereby a preferable thickness and a preferable taper angle can be obtained. The results are described below.

In a thin film transistor which is used for a pixel of a display device with excellent display quality, off current of $1.0 \times 10^{-11}$ (A) or lower is required, and off current of $1.0 \times 10^{-12}$ (A) or lower is preferable. The thickness of the back channel and the thickness of a buffer are varied, and it is computed how large the taper angle enough to obtain the above off current is. The computation results are shown in FIGS. 47 to 58. Note that drain voltage $V_d$ (a potential difference between a drain potential and a source potential serving as a reference potential) in all computations in FIGS. 47 to 58 is 14 V. In this case, the thickness of the back channel is a thickness of the portion denoted by $d_2$ in FIG. 1.

Figure 47:
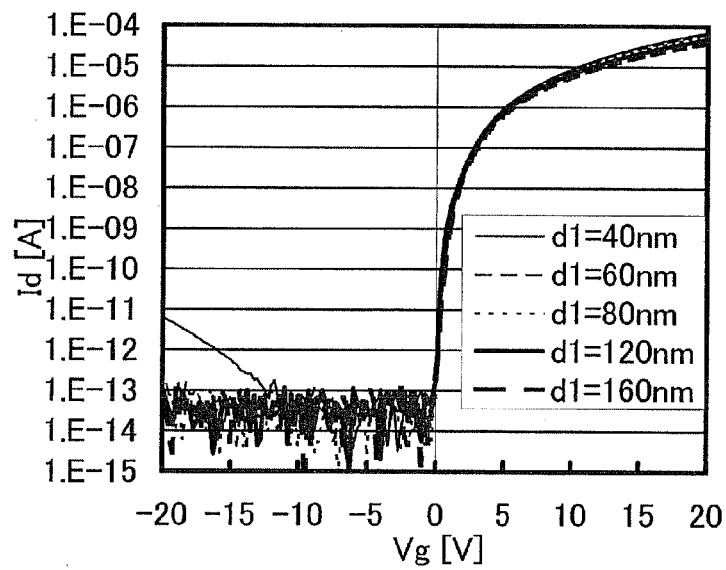
FIG. 47 shows a computational result of a thin film transistor according to an aspect of the present invention.

FIG. 47 shows a computation result of drain current $I_d$ (current flowing between a source and a drain) when gate voltage $V_g$ (a potential difference between a gate potential and a source potential as a reference potential) is varied in the range of ±20 V under the conditions that the thickness $d_1$ of the buffer is 40 nm, 60 nm, 80 nm, 120 nm, and 160 nm, the thickness $d_2$ of the back channel is 10 nm and the taper angle θ is 10°.

Figure 48:
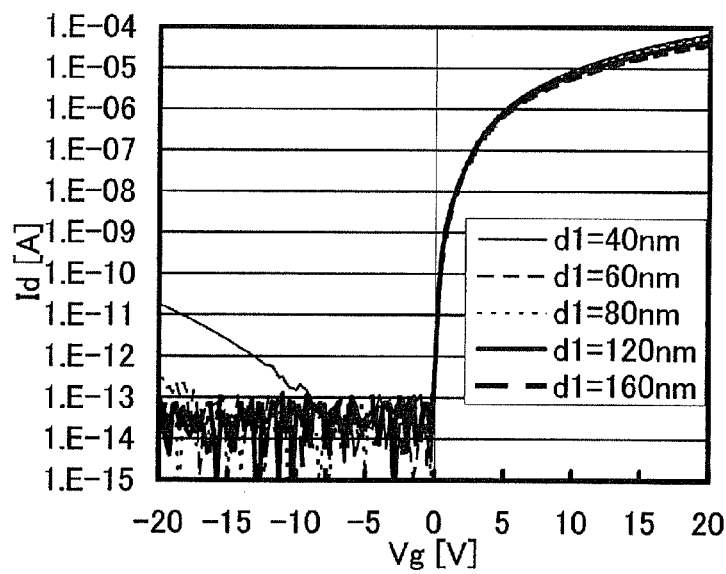
FIG. 48 shows a computational result of a thin film transistor according to an aspect of the present invention.

Similarly, FIG. 48 shows a computation result of drain current $I_d$ at the taper angle θ of 30°.

Figure 49:
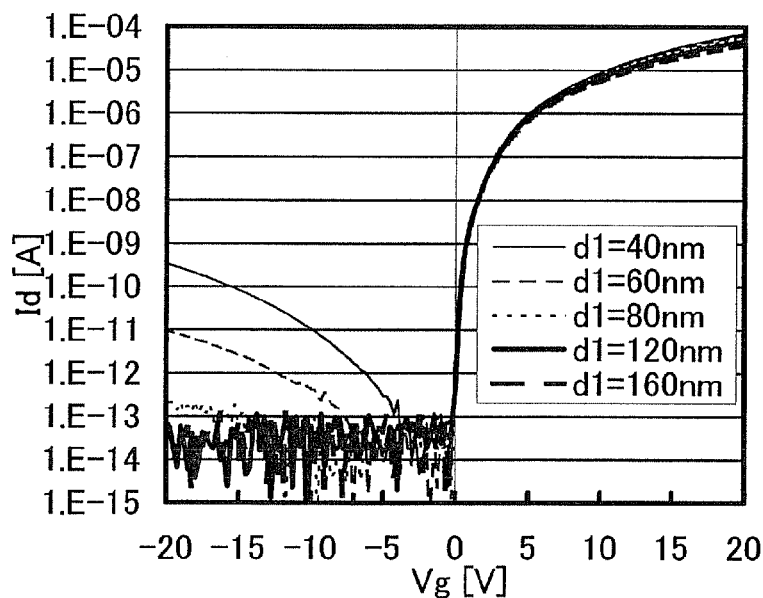
FIG. 49 shows a computational result of a thin film transistor according to an aspect of the present invention.

Similarly, FIG. 49 shows a computation result of drain current $I_d$ at the taper angle θ of 50°.

Figure 50:
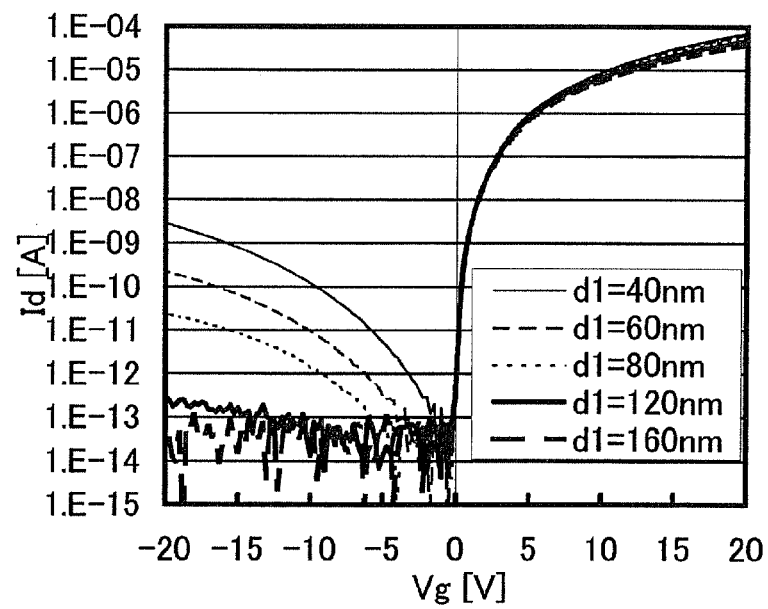
FIG. 50 shows a computational result of a thin film transistor according to an aspect of the present invention.

Similarly, FIG. 50 shows a computation result of drain current $I_d$ at the taper angle θ of 70°.

Figure 51:
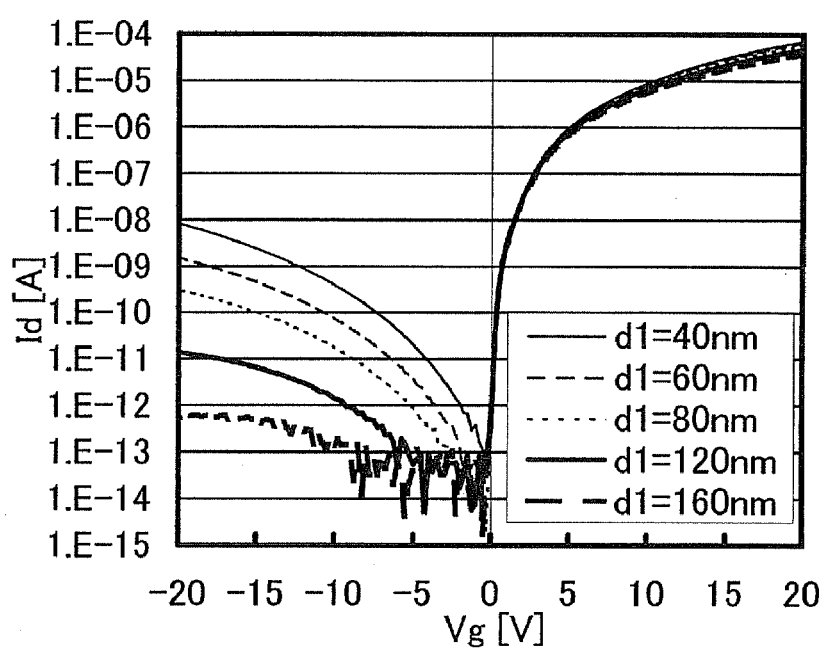
FIG. 51 shows a computational result of a thin film transistor according to an aspect of the present invention.

Similarly, FIG. 51 shows a computation result of drain current $I_d$ at the taper angle θ of 90°.

Figure 52:
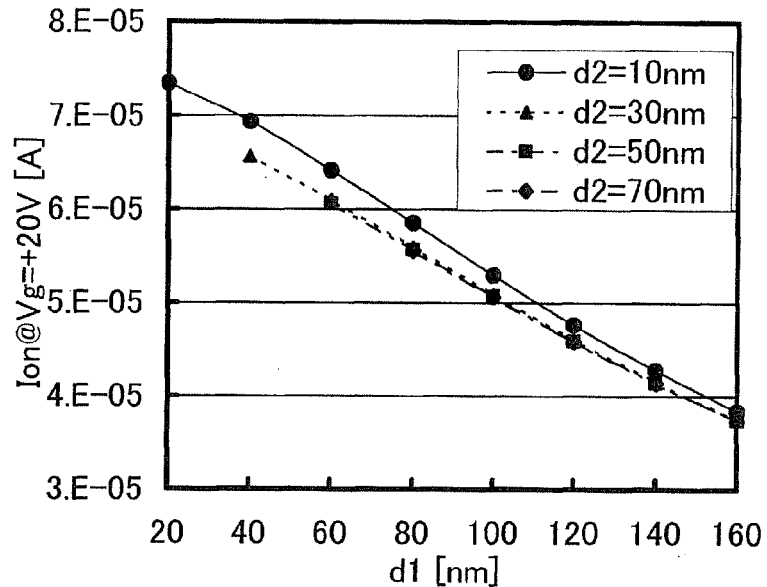
FIG. 52 shows a computational result of a thin film transistor according to an aspect of the present invention.
Figure 53:
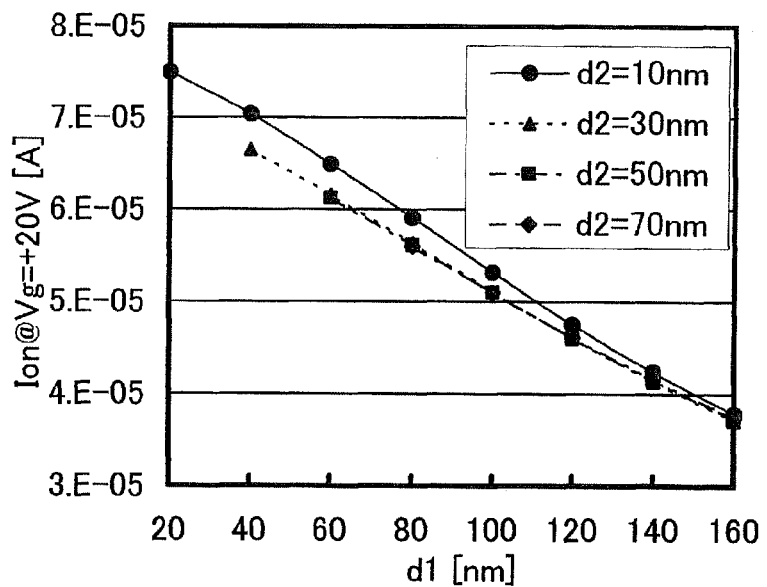
FIG. 53 shows a computational result of a thin film transistor according to an aspect of the present invention.

FIG. 52 shows a computation result of drain current $I_d$ when the thickness $d_1$ of the buffer is varied in the range of 20 nm to 160 nm, under the conditions that the thicknesses $d_2$ of the back channel are 10 nm, 30 nm, 50 nm, and 70 nm, the taper angle θ is 10°, and the gate voltage Vg is 20 V. In addition, FIG. 53 shows a result obtained by computation in a manner similar to the case of the taper angle θ of 10°. In FIGS. 52 and 53, drain current $I_d$ obtained by computation is a current when the thin film transistor is turned on, and the current is denoted by $I_{on}$ in drawings. It is found that current when the thin film transistor is turned on (on current) does not depend so much on the thickness $d_2$ of the back channel. On the contrary, it is found that current when the thin film transistor is turned on (on current) depends greatly on the thickness $d_1$ of the buffer, and on current is smaller as the thickness $d_1$ is larger.

Figure 54:
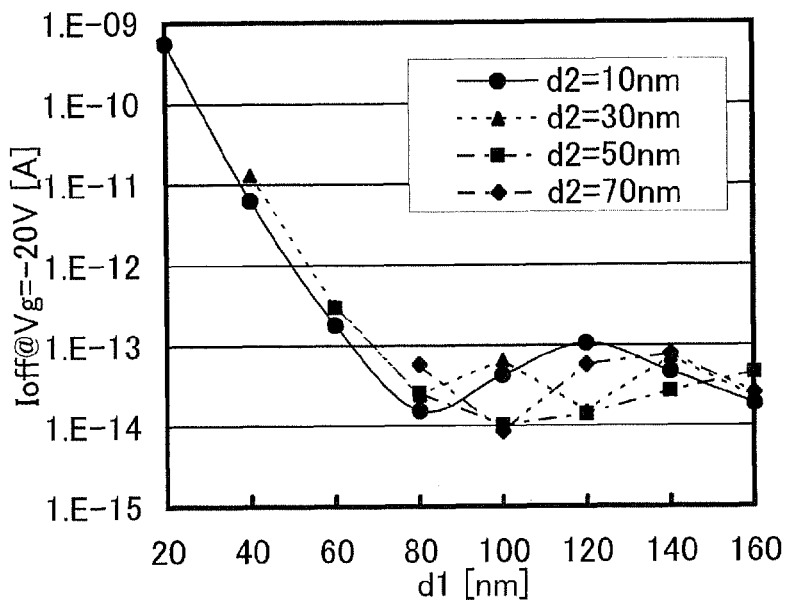
FIG. 54 shows a computational result of a thin film transistor according to an aspect of the present invention.

FIG. 54 shows a computation result of drain current $I_d$ when the thickness $d_1$ of the buffer is varied in the range of 20 nm to 160 nm, under the conditions that the thickness $d_2$ of the back channel is 10 nm, 30 nm, 50 nm, and 70 nm, the taper angle θ is 10°, and the gate voltage $V_g$ is −20 V.

Figure 55:
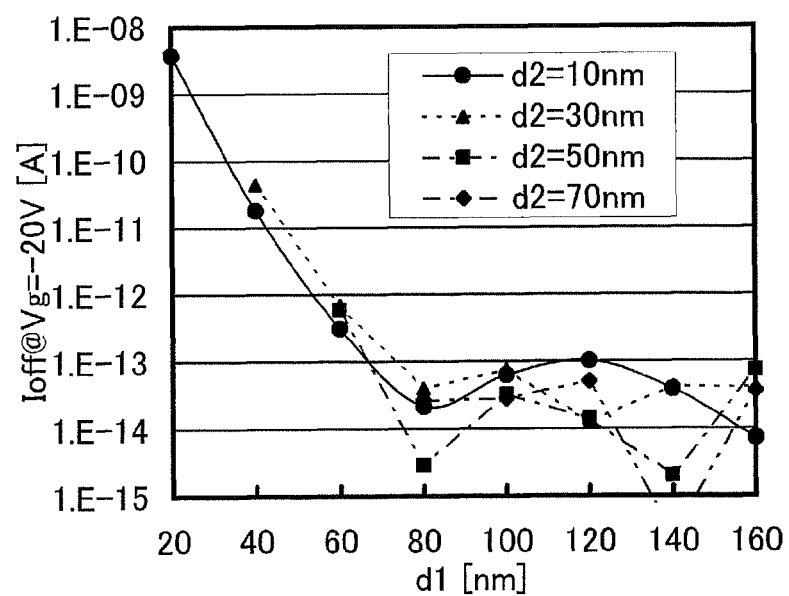
FIG. 55 shows a computational result of a thin film transistor according to an aspect of the present invention.

Similarly, FIG. 55 shows a computation result of drain current $I_d$ at the taper angle θ of 30°.

Figure 56:
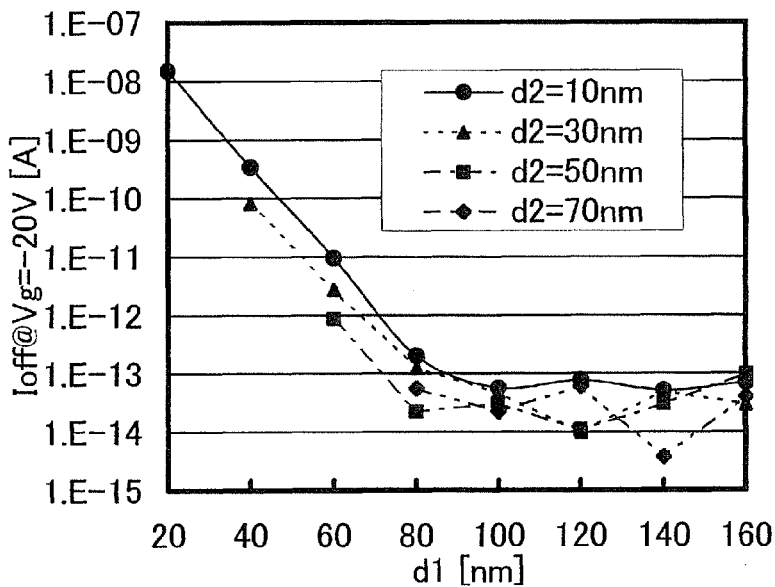
FIG. 56 shows a computational result of a thin film transistor according to an aspect of the present invention.

Similarly, FIG. 56 shows a computation result of drain current $I_d$ at the taper angle θ of 50°.

Figure 57:
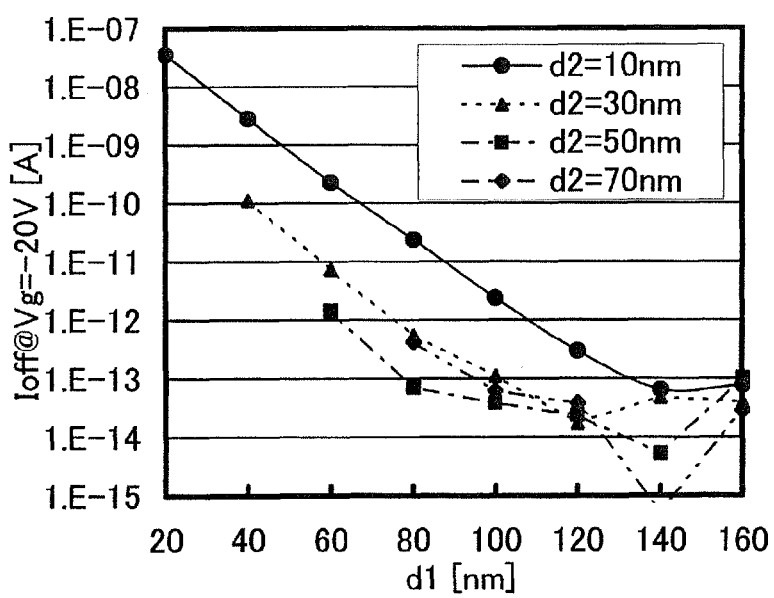
FIG. 57 shows a computational result of a thin film transistor according to an aspect of the present invention.

Similarly, FIG. 57 shows a computation result of drain current $I_d$ at the taper angle θ of 70°.

Figure 58:
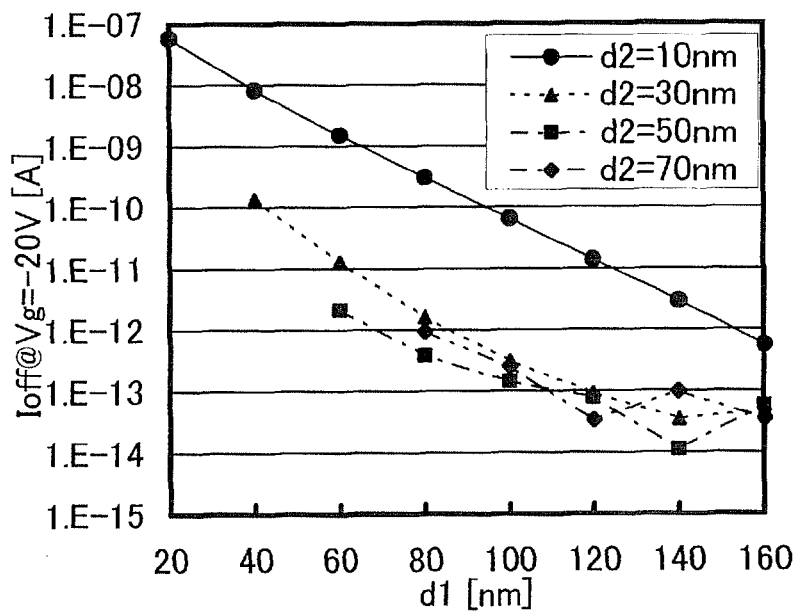
FIG. 58 shows a computational result of a thin film transistor according to an aspect of the present invention.

Similarly, FIG. 58 shows a computation result of drain current $I_d$ at the taper angle θ of 90°.

In the computation results shown in FIGS. 47 to 58, the drain current $I_d$ obtained by computation is a current when the thin film transistor is turned off, and the current is denoted by $I_{off}$ in drawings. According to the computation results shown in FIGS. 47 to 58, the following conditions should be satisfied so that off current is $1.0 \times 10^{-11}$ (A) or lower.

The off current of $1.0 \times 10^{-11}$ (A) or lower can be obtained by the taper angle θ of 10°, when the thickness $d_1$ of the buffer is 40 nm $\leq d_1 <$ 60 nm, and the thickness $d_2$ of the back channel is 10 nm.

The off current of $1.0 \times 10^{-11}$ (A) or lower can be obtained by the taper angle θ in the entire range of $10° \leq θ \leq 90°$, when the thickness $d_1$ of the buffer is 60 nm $\leq d_1 <$ 80 nm, and the thickness $d_2$ of the back channel is 50 nm $\leq d_2 \leq$ 70 nm. The off current of $1.0 \times 10^{-11}$ (A) or lower can be obtained by the taper angle θ in the entire range of $10° \leq θ \leq 70°$, when the thickness $d_1$ of the buffer is 60 nm $\leq d_1 <$ 80 nm, and the thickness $d_2$ of the back channel is 30 nm $\leq d_2 <$ 50 nm. The off current of $1.0 \times 10^{-11}$ (A) or lower can be obtained by the taper angle θ in the entire range of $10° \leq θ \leq 50°$, when the thickness $d_1$ of the buffer is 60 nm $\leq d_1 <$ 80 nm, and the thickness $d_2$ of the back channel is 10 nm $\leq d_2 <$ 30 nm.

The off current of $1.0 \times 10^{-11}$ (A) or lower can be obtained by the taper angle θ in the entire range of $10° \leq θ \leq 50°$, when the thickness $d_1$ of the buffer is 80 nm $\leq d_1 <$ 100 nm, and the thickness $d_2$ of the back channel is 10 nm $\leq d_2 <$ 30 mm. The off current of $1.0 \times 10^{-11}$ (A) or lower can be obtained by the taper angle θ in the entire range of $10° \leq θ \leq 90°$, when the thickness $d_1$ of the buffer is 80 nm $\leq d_1 <$ 100 nm, and the thickness $d_2$ of the back channel is 30 nm $\leq d_2 <$ 70 nm.

The off current of $1.0 \times 10^{-11}$ (A) or lower can be obtained by the taper angle θ in the entire range of $10° \leq θ \leq 70°$, when the thickness $d_1$ of the buffer is 100 nm $\leq d_1 <$ 140 nm, and the thickness $d_2$ of the back channel is 10 nm $\leq d_2 <$ 30 nm. The off current of $1.0 \times 10^{-11}$ (A) or lower can be obtained by the taper angle θ in the entire range of $10° \leq θ < 90°$, when the thickness $d_1$ of the buffer is 100 nm $\leq d_1 \leq$ 140 mm, and the thickness $d_2$ of the back channel is 30 nm $\leq d_2 \leq$ 70 mm.

The off current of $1.0 \times 10^{-11}$ (A) or lower can be obtained by the taper angle θ in the entire range of $10° \leq θ \leq 90°$, when the thickness $d_1$ of the buffer is 140 nm $\leq d_1 <$ 160 nm, and the thickness $d_2$ of the back channel is 10 nm $\leq d_2 \leq$ 70 nm.

Further, the following conditions should be satisfied so that off current is $1.0 \times 10^{-12}$ (A) or lower.

The off current of $1.0 \times 10^{-12}$ (A) or lower can be obtained by the taper angle θ in the entire range of $10° \leq θ \leq 30°$, when the thickness $d_1$ of the buffer is 60 nm $\leq d_1 \leq$ 80 nm, and the thickness $d_2$ of the back channel is 10 mm $\leq d_2 <$ 50 nm. The off current of $1.0 \times 10^{-12}$ (A) or lower can be obtained by the taper angle θ in the entire range of $10° \leq θ \leq 50°$, when the thickness $d_1$ of the buffer is 60 nm $\leq d_1 <$ 80 nm, and the thickness $d_2$ of the back channel is 50 nm $\leq d_2 \leq$ 70 nm.

The off current of $1.0 \times 10^{-12}$ (A) or lower can be obtained by the taper angle θ in the entire range of $10° \leq θ \leq 50°$ when the thickness $d_1$ of the buffer is 80 nm $\leq d_1 <$ 100 nm, and the thickness $d_2$ of the back channel is 10 nm $\leq d_2 <$ 30 nm. The off current of $1.0 \times 10^{-12}$ (A) or lower can be obtained by the taper angle θ in the entire range of 10°≦θ≦70°, when the thickness $d_1$ of the buffer is 80 nm≦$d_1$<100 nm, and the thickness $d_2$ of the back channel is 30 nm≦$d_2$<50 nm. The off current of $1.0×10^{-12}$ (A) or lower can be obtained by the taper angle θ in the entire range of 10°≦θ≦90°, when the thickness $d_1$ of the buffer is 80 nm≦$d_1$<100 nm, and the thickness $d_2$ of the back channel is 50 nm≦$d_2$≦70 nm.

The off current of $1.0×10^{-12}$ (A) or lower can be obtained by the taper angle θ in the entire range of 10°≦θ≦50°, when the thickness $d_1$ of the buffer is 100 nm≦$d_1$<120 nm, and the thickness $d_2$ of the back channel is 10 nm≦$d_2$<30 nm. The off current of $1.0×10^{-12}$ (A) or lower can be obtained by the taper angle θ in the entire range of 10°≦θ≦90°, when the thickness $d_1$ of the buffer is 100 nm≦$d_1$<120 nm, and the thickness $d_2$ of the back channel is 30 nm≦$d_2$<70 nm.

The off current of $1.0×10^{-12}$ (A) or lower can be obtained by the taper angle θ in the entire range of 10°≦θ≦70°, when the thickness $d_1$ of the buffer is 120 nm≦$d_1$<160 nm, and the thickness $d_2$ of the back channel is 10 nm≦$d_2$<30 nm. The off current of $1.0×10^{-12}$ (A) or lower can be obtained by the taper angle θ in the entire range of 10°≦θ≦90°, when the thickness $d_1$ of the buffer is 120 nm≦$d_1$<160 nm, and the thickness $d_2$ of the back channel is 30 nm≦$d_2$≦70 mm.

In all of the above computation results, the thickness $d_2$ of the back channel is 70 nm or smaller, but as the thickness $d_2$ of the back channel becomes larger, off current becomes smaller and on current does not vary. Therefore, the thickness $d_2$ of the back channel may be set beyond the above range, as long as the thickness $d_2$ of the back channel is smaller than the thickness $d_1$ of the buffer.

In addition, in the above computational results, the thickness $d_1$ of the buffer is preferably small, because on current becomes smaller as the thickness $d_1$ of the buffer is larger.

As described above, a thin film transistor having a highly withstand-voltage property and a small amount of off current can be provided in accordance with the present invention. Further, as illustrated in FIG. 1, in a case where a channel formation region is formed using a microcrystalline semiconductor layer, on current is high, and thus a thin film transistor having excellent switching characteristics can be obtained by reducing off current in the above-described manner. Note that the case where a channel formation region is formed using a microcrystalline semiconductor layer is not a limiting example, and a thin film transistor having excellent switching characteristics can be obtained by applying the present invention to a thin film transistor having a large amount of on current.

Embodiment Mode 2

In Embodiment Mode 2, a method for manufacturing the thin film transistor described in Embodiment Mode 1 will now be described with reference to drawings.

Figure 7:
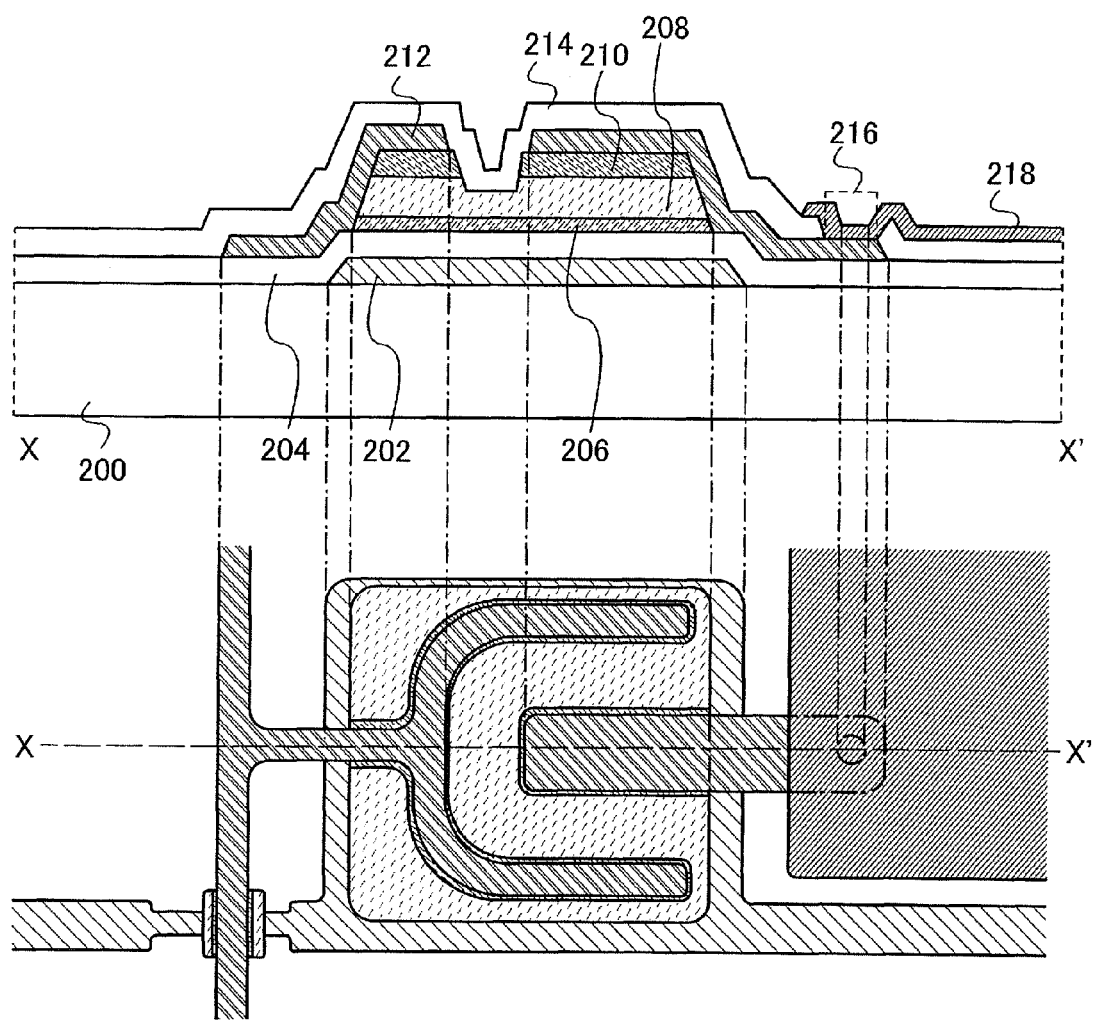
FIG. 7 illustrates an example of a structure of a thin film transistor according to an aspect of the present invention.

FIG. 7 is a top view and a cross-sectional view of a thin film transistor according to the present invention as an example. The thin film transistor illustrated in FIG. 7 includes a gate electrode layer 202 over a substrate 200, a gate insulating layer 204 covering the gate electrode layer 202, a microcrystalline semiconductor layer 206 over the gate insulating layer 204, an amorphous semiconductor layer 208 over the microcrystalline semiconductor layer 206, source and drain regions 210 over a part of the amorphous semiconductor layer 208, source and drain electrode layers 212 over the source and drain regions 210, and an insulating layer 214 over the source and drain electrode layers 212. Each layer is patterned into a desired shape. The amorphous semiconductor layer 208 serves as a buffer layer. The insulating layer 214 serves as a protective layer.

In the thin film transistor illustrated in FIG. 7, a part of the amorphous semiconductor layer 208 overlapping with the source and drain regions 210 is provided thicker than that of a part of the amorphous semiconductor layer 208 overlapping with the channel formation region.

The thin film transistor illustrated in FIG. 7 is a pixel transistor which is provided for a liquid crystal display device (a liquid crystal display panel) in matrix. One of the source and drain electrodes of the thin film transistor is connected to a source wiring and the other is connected to a pixel electrode layer 218 through an opening portion 216 formed in the insulating layer 214.

Note that one of a source electrode and a drain electrode is provided so as to have a shape of surrounding at least the other of the source electrode and the drain electrode (a U shape, a reversed C shape or a horseshoe shape). By providing a U-shaped (a reversed C shape or a horseshoe shape) thin film transistor, the channel width of the thin film transistor can be increased and sufficient on current can flow. In addition, variation in electric characteristics can be reduced. Further, reliability of the thin film transistor can be increased. However, the present invention is not limited to this example, and the thin film transistor is not necessarily U-shaped (a reversed C shape or a horseshoe shape).

Next, a method for manufacturing the thin film transistor illustrated in FIG. 7 is described with reference to drawings. Note that an n-channel thin film transistor having microcrystalline semiconductor has a higher mobility of carriers than a p-channel thin film transistor having microcrystalline semiconductor. It is preferable that all thin film transistors formed over the same substrate have the same polarity because the number of manufacturing steps can be reduced. Therefore, here, a method for manufacturing an n-channel thin film transistor is described.

First, the gate electrode layer 202 is formed over the substrate 200. As the substrate 200, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like with the surface provided with an insulating layer may be used. That is, a substrate having an insulating surface is used as the substrate 200. When the substrate 200 is a mother glass, the substrate may have any size of from the first generation (e.g., 320 mm×400 mm) to the tenth generation (e.g., 2950 mm×3400 mm).

The gate electrode layer 202 is formed using a metal material such as molybdenum, titanium, chromium, tantalum, tungsten, aluminum, copper, neodymium, or scandium or an alloy material which includes any of these materials as a main component. In the case of using aluminum, an Al—Ta alloy in which aluminum is alloyed with tantalum added thereto is preferably used because hillocks are suppressed. Alternatively, an Al—Nd alloy in which aluminum is alloyed with neodymium added thereto is more preferably used because wiring with low resistance can be formed and hillocks are suppressed. Alternatively, a semiconductor layer typified by polycrystalline silicon doped with an impurity element such as phosphorus, or an AgPdCu alloy may be used. The gate electrode layer 202 may have either a single-layer structure or a stacked-layer structure. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, electric resistance can be reduced and a metal element from the metal layer can be prevented from diffusing into the semiconductor layer. Alternatively, a two-layer structure including a titanium nitride layer and a molybdenum layer, or a three-layer structure in which a tungsten layer having a thickness of 50 nm, an alloy layer of aluminum and silicon having a thickness of 500 nm, and a titanium nitride layer having a thickness of 30 nm may be used. When the three-layer structure is used, tungsten nitride may be used instead of tungsten of the first conductive layer, an alloy layer of aluminum and titanium may be used instead of the alloy layer of aluminum and silicon of the second conductive layer, or a titanium layer may be used instead of the titanium nitride layer of the third conductive layer. For example, when a molybdenum layer is stacked over an Al—Nd alloy layer, a conductive layer which has excellent heat resistance and low resistance can be formed.

The gate electrode layer 202 can be formed in such a manner that a conductive layer is formed over the substrate 200 by a sputtering method or a vacuum evaporation method, a mask is formed over the conductive layer by a photolithography method or an inkjet method, and the conductive layer is etched using the mask. Alternatively, the gate electrode layer 202 can be formed by discharging a conductive nanopaste of silver, gold, copper, or the like over the substrate by an inkjet method and baking the conductive nanopaste. Note that as a barrier metal for increasing adhesion between the gate electrode layer 202 and the substrate 200 and preventing diffusion of a material used for the gate electrode layer 202 to a base, a nitride layer of any of the above-described metal materials may be provided between the substrate 200 and the gate electrode layer 202. Here, the gate electrode layer 202 is formed by forming the conductive layer over the substrate 200 and etching the conductive layer by using a resist mask formed using a photomask.

Note that since a semiconductor layer and a source wiring (a signal line) are formed over the gate electrode layer 202 in later steps, the gate electrode layer 202 is preferably processed so that a side face thereof is tapered in order to prevent disconnection at a step portion. In addition, in this step, a gate wiring (a scan line) can be formed at the same time. Further, a capacitor line included in a pixel portion can also be formed. Note that a "scan line" means a wiring arranged to select a pixel, while a "capacitor line" means a wiring which is connected to one electrode of a capacitor of a pixel and hold a constant potential.

Next, the gate insulating layer 204 is formed to cover the gate electrode layer 202, the microcrystalline semiconductor layer 206, the amorphous semiconductor layer 208, and the impurity semiconductor layer to serve as source and drain regions 210 are sequentially stacked over the gate insulating layer 204. Note that at least the gate insulating layer 204, the microcrystalline semiconductor layer 206 and the amorphous semiconductor layer 208 are preferably formed successively. More preferably, the impurity semiconductor layer to serve as source and drain regions 210 is also formed successively following the above layers. At least the gate insulating layer 204, the microcrystalline semiconductor layer 206 and the amorphous semiconductor layer 208 are formed successively without being exposed to air, and thus each interface of stacked layers can be formed without being contaminated by an atmospheric constituent or a contaminant impurity element floating in air. Thus, variations in electric characteristics of thin film transistors can be reduced, and a thin film transistor having high reliability can be manufactured with high yield.

The gate insulating layer 204 can be formed using silicon oxide, silicon nitride, silicon oxynitride, or silicon nitride oxide by a CVD method, a sputtering method, or the like. The gate insulating layer 204 may have either a single-layer structure or a stacked-layer structure of the above-described materials. As the gate insulating layer 204, a silicon nitride layer or a silicon nitride oxide layer, and a silicon oxide layer or a silicon oxynitride layer is preferably stacked from the substrate side in this order. This is because the silicon nitride layer and the silicon nitride oxide layer have a high effect of preventing an impurity element contained in the substrate 200 from entering the microcrystalline semiconductor layer 206 if the impurity element is contained in the substrate 200, and the silicon oxide and the silicon oxynitride layer have excellent interface properties with the microcrystalline semiconductor layer. Alternatively, as the gate insulating layer 204, a silicon oxide layer or a silicon oxynitride layer, a silicon nitride layer or a silicon nitride oxide layer, and a silicon oxide layer or a silicon oxynitride layer may be formed from the substrate side in this order. Alternatively, the gate insulating layer 204 may be formed of a single layer of a silicon oxide layer, a silicon nitride layer, a silicon oxynitride layer, or a silicon nitride oxide layer. Further, the gate insulating layer 204 is preferably formed by using a microwave plasma CVD method with a frequency of about 1 GHz. A silicon oxynitride layer or a silicon nitride oxide layer formed by a microwave plasma CVD method has high withstand voltage because of its dense film quality, and reliability of a thin film transistor can be improved.

The gate insulating layer 204 preferably has a two-layer structure in which a silicon oxynitride layer is stacked over a silicon nitride oxide layer. This gate insulating layer 204 is formed to a thickness of 50 nm or more, preferably from 50 nm to 400 nm, more preferably 150 nm to 300 nm inclusive. The use of a silicon nitride oxide layer can prevent alkali metal or the like contained in the substrate 200 from mixing into the microcrystalline semiconductor layer 206. Further, a silicon oxynitride layer can prevent hillocks which can be generated in the case of using aluminum for the gate electrode layer 202 and also prevents the gate electrode layer 202 from being oxidized.

Note that "silicon oxynitride" refers to a substance which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, silicon nitride oxide refers to a material that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

The microcrystalline semiconductor layer 206 functions as a channel formation region of a thin film transistor. The microcrystalline semiconductor layer 206 is formed using a microcrystalline semiconductor having an intermediate structure between amorphous and crystalline structures (including a single crystal and a polycrystal).

A microcrystalline semiconductor is a semiconductor which has a third state which is stable in free energy, may be a crystalline semiconductor which has a short-range order and lattice distortion, and has crystal grains with a diameter of several nm to 20 nm in an amorphous semiconductor layer. Microcrystalline silicon, which is a typical example of a microcrystalline semiconductor, has a Raman spectrum which is shifted to a wave number side lower than 520.6 cm$^{-1}$ that represents single-crystal silicon. That is, the peak of a Raman spectrum of microcrystalline silicon is within the range from 481 cm$^{-1}$ to 520.6 cm$^{-1}$. In addition, microcrystalline silicon preferably contains hydrogen or halogen of at least 1 at. % or more in order to terminate a dangling bond. Such microcrystalline semiconductor is disclosed in, for example, Reference 4.

Note that when a half width of the peak of a Raman spectrum is used, the grain size of a crystal grain contained in a microcrystalline semiconductor layer can be calculated. However, it is not thought that the shape of a crystal grain which is actually contained in a microcrystalline semiconductor layer is rounded.

In addition, the carrier mobility of a microcrystalline semiconductor layer is about 1 cm$^2$/V·sec to 20 cm$^2$/V·sec, and the carrier mobility is about two to twenty times the carrier mobility of a thin film transistor formed using an amorphous semiconductor layer. Thus, a thin film transistor formed using a microcrystalline semiconductor layer has steeper rising in a current-voltage curve where a horizontal axis represents a gate voltage and a vertical axis represents a drain current, than a thin film transistor formed using amorphous semiconductor layer. In this case, a "gate voltage" indicates a potential difference between a source electrode and a gate electrode, and a "drain current" indicates a current flowing between the source electrode and a drain electrode. Therefore, a thin film transistor using a microcrystalline semiconductor layer for a channel-formation region has a large amount of on current, is superior in response as a switching element and can operate at high speed. Thus, with use of a thin film transistor whose a channel-formation region is formed of the microcrystalline semiconductor layer for a switching element of a display device, the area of the channel-formation region, that is, the area of the thin film transistor can be decreased. Further, some or all of driver circuits are formed over the same substrate as the pixel portion, and thereby system-on-panel can also be achieved.

The microcrystalline semiconductor layer 206 can be formed directly over the substrate by a high-frequency plasma CVD method with a frequency of several tens to several hundreds of megahertz or a microwave plasma CVD method with a frequency of 1 GHz or more. Typically, the microcrystalline semiconductor layer can be formed using a dilution of silicon hydride such as SiH$_4$ or Si$_2$H$_6$ with hydrogen. With dilution of silicon hydride and hydrogen with one or plural kinds of rare gas elements selected from helium, argon, krypton, or neon, the microcrystalline semiconductor layer can be formed. In that case, the flow rate of hydrogen to silicon hydride is 5:1 to 200:1, preferably, 50:1 to 150:1, more preferably, about 100:1. Note that instead of silicon hydride, SiH$_2$Cl$_2$, SiHCl$_3$, SiCl$_4$, SiF$_4$, or the like can be used. In addition, a layer formed by a microwave plasma CVD method with a frequency of 1 GHz or more has high electron density, and hydrogenated silicon as a source gas can be easily dissociated. Thus, as compared with a high frequency plasma CVD method with a frequency of several tens of megahertz to several hundreds of megahertz, a microcrystalline semiconductor layer can be easily formed, a formation rate can be increased, and productivity can be increased by such a microwave plasma CVD method.

A microcrystalline semiconductor layer exhibits weak n-type conductivity when an impurity element for valence control is not added. Thus, the threshold voltage V$_{th}$ can be controlled by adding an impurity element imparting p-type conductivity to a microcrystalline semiconductor layer which functions as a channel-formation region of a thin film transistor at the same time as or after the film formation of the microcrystalline semiconductor layer. A typical example of an impurity element imparting p-type conductivity is boron, and an impurity gas such as B$_2$H$_6$ or BF$_3$ may be mixed into silicon hydride at a proportion of 1 ppm to 1000 ppm, preferably, 1 ppm to 100 ppm. The concentration of boron in the microcrystalline semiconductor layer may be, for example, 1×10$^{14}$ atoms·cm$^{-3}$ to 6×10$^{16}$ atoms·cm$^{-3}$.

In addition, the oxygen concentration of the microcrystalline semiconductor layer is preferably 1×10$^{19}$ atoms·cm$^{-3}$ or less, more preferably 5×10$^{18}$ atoms·cm$^{-3}$ or less, still more preferably 1×10$^{16}$ atoms·cm$^{-3}$ or less and the nitrogen concentration and the carbon concentration are preferably 5×10$^{18}$ atoms·cm$^{-3}$ or less, more preferably 1×10$^{18}$ atoms·cm$^{-3}$ or less. When concentrations of oxygen, nitrogen, and carbon to be mixed into the microcrystalline semiconductor layer are decreased, a channel-formation region of the microcrystalline semiconductor layer can be prevented from being changed into an n-type semiconductor. Further, when the concentrations of these elements are varied among elements, variations in the threshold voltage V$_{th}$ may occur. Thus, when these concentrations are decreased as much as possible, variations in the threshold voltage V$_{th}$ between elements formed over the substrate can be reduced.

The microcrystalline semiconductor layer 206 is formed to a thickness of from 2 nm to 60 nm, preferably from 10 nm to 30 nm. When the thickness of the microcrystalline semiconductor layer is in the range of from 2 nm to 60 nm, a thin film transistor can be made a fully depleted type within the operation range of the thin film transistor. In addition, since the formation rate of the microcrystalline semiconductor layer is low, i.e., a tenth to a hundredth of the formation rate of an amorphous semiconductor layer, the microcrystalline semiconductor layer 206 is preferably formed thin so that throughput can be improved.

Formation of an amorphous semiconductor layer or an amorphous semiconductor layer containing hydrogen, nitrogen or halogen is formed over a surface of the microcrystalline semiconductor layer 206, and thus the surfaces of crystal grains included in the microcrystalline semiconductor layer 206 can be prevented from being natively oxidized.

However, the microcrystalline semiconductor layer allows a large amount of off current as well as a large amount of on current. For the reason, the amorphous semiconductor layer 208 may be formed to cover the microcrystalline semiconductor layer 206. When the amorphous semiconductor layer 208 is provided, oxidation of the surfaces of crystal grains can be prevented without providing a layer for preventing the native oxidation of crystal grains for the surface of the microcrystalline semiconductor layer 206.

The amorphous semiconductor layer 208 can be formed by the following steps: entirely forming an amorphous semiconductor layer using substantially the same material as the microcrystalline semiconductor layer 206; and etching the amorphous semiconductor layer to have a pattern. Note that "substantially the same material" means a material having the same main constituent. The amorphous semiconductor layer can be formed using silicon hydride such as SiH$_4$ or Si$_2$H$_6$ by a plasma CVD method. Alternatively, with a dilution of silicon hydride described above with one or plural kinds of rare gas elements selected from helium, argon, krypton, or neon, the amorphous semiconductor layer can be formed. When hydrogen at a flow rate which is 1 to 20 times, preferably 1 to 10 times, more preferably 1 to 5 times as high as that of silicon hydride is used, a hydrogen-containing amorphous semiconductor layer can be formed. When a mixed gas of silicon hydride described above and nitrogen or ammonia is used, a nitrogen-containing amorphous semiconductor layer can be formed. When silicon hydride described above and a gas including fluorine, chlorine, bromine or iodine ($F_2$, $Cl_2$, $Br_2$, $I_2$, HF, HCl, HBr, HI or the like) are used, an amorphous semiconductor layer including fluorine, chlorine, bromine or iodine can be formed. Note that instead of silicon hydride, $SiH_2Cl_2$, $SiHCl_3$, $SiCl_4$, $SiF_4$, or the like can be used. Note that the thickness of the amorphous semiconductor layer is from 80 nm to 500 μm, preferably from 150 nm to 400 nm, more preferably from 200 nm to 300 nm.

Alternatively, the amorphous semiconductor layer 208 may be formed using an amorphous semiconductor layer formed by sputtering with hydrogen or a rare gas using an amorphous semiconductor as a target. In this case, when ammonia, nitrogen, or dinitrogen monoxide is contained in the atmosphere, a nitrogen-containing amorphous semiconductor layer can be formed. Alternatively, when a gas including fluorine, chlorine, bromine or iodine ($F_2$, $Cl_2$, $Br_2$, $I_2$, HF, HCl, HBr, HI or the like) is contained in the atmosphere, an amorphous semiconductor layer including fluorine, chlorine, bromine or iodine can be formed.

Alternatively, the amorphous semiconductor layer 208 may be formed by forming an amorphous semiconductor layer on the surface of the microcrystalline semiconductor layer 206 by a plasma CVD method or a sputtering method and then by performing hydrogenation, nitridation, or halogenation of the surface of the amorphous semiconductor layer through processing of the surface of the amorphous semiconductor layer with hydrogen plasma, nitrogen plasma, or halogen plasma. Alternatively, the surface of the amorphous semiconductor layer may be processed with helium plasma, neon plasma, argon plasma, krypton plasma, or the like.

Although the amorphous semiconductor layer 208 is formed using amorphous semiconductor, preferably, the amorphous semiconductor layer does not contain crystal grains.

Note that the amorphous semiconductor layer 208 should be formed in such way that an impurity imparting one conductivity type, such as phosphorus or boron cannot be added to the amorphous semiconductor layer 208. In particular, preferably, boron added to the microcrystalline semiconductor layer 206 for controlling the threshold voltage or phosphorus contained in the source and drain regions 210 is not mixed into the amorphous semiconductor layer 208. Alternatively, if phosphorus, boron or the like is included in the amorphous semiconductor layer 208, the concentration of phosphorus, boron or the like can be reduced as much as possible, and preferably the concentration is set to a detection limit of secondary ion mass spectrometry (SIMS) or lower. For example, if the microcrystalline semiconductor layer 206 contains boron and the amorphous semiconductor layer 208 contains phosphorus, a PN junction may be formed between the microcrystalline semiconductor layer 206 and the amorphous semiconductor layer 208. In addition, if the amorphous semiconductor layer 208 contains boron and the source and drain regions 210 contain phosphorus, a PN junction may be formed between the amorphous semiconductor layer 208 and the source and drain regions 210. Alternatively, when the amorphous semiconductor layer 208 contains both boron and phosphorus, a recombination center is generated, which causes leakage current. When the amorphous semiconductor layer 208 does not contain such an impurity, leakage current can be reduced. When the amorphous semiconductor layer 208 which does not contain an impurity element such as phosphorus or boron is provided between the source and drain regions 210 and the microcrystalline semiconductor layer 206, diffusion of the impurity element to the microcrystalline semiconductor layer 206 serving as a channel-formation region and the source and drain regions 210 can be prevented.

The amorphous semiconductor layer 208 may be formed using an amorphous semiconductor containing hydrogen, nitrogen, or halogen. An amorphous semiconductor has a larger energy gap than a microcrystalline semiconductor (the energy gap of an amorphous semiconductor is from 1.6 eV to 1.8 eV and the energy gap of a microcrystalline semiconductor is from 1.1 eV to 1.5 eV), has higher electric resistance, and has lower mobility (a fifth to a tenth of that of a microcrystalline semiconductor). Therefore, in a thin film transistor to be formed, preferably, the amorphous semiconductor layer 208 formed between the source and drain regions 210 and the microcrystalline semiconductor layer 206 functions as a high-resistant region, and the microcrystalline semiconductor layer 206 functions as a channel-formation region. Accordingly, the off current of the thin film transistor can be reduced. When such a thin film transistor is used as a switching element of a liquid crystal display device, the contrast of the liquid crystal display device can be improved.

If the microcrystalline semiconductor layer 206 is oxidized, the mobility of the thin film transistor is decreased, the subthreshold swing thereof is increased, and thus electric characteristics of the thin film transistor become worse. The amorphous semiconductor layer 208 is formed to cover the surface of the microcrystalline semiconductor layer 206, and thus crystal grains (especially, the surface thereof) of the microcrystalline semiconductor layer can be prevented from being oxidized, which leads to suppressing of the deterioration of electric characteristics of the thin film transistor. Either hydrogen or fluorine, or both is contained in a recession portion of the amorphous semiconductor layer 208 (a portion overlapping the channel-formation region of the microcrystalline semiconductor layer 206), and thus oxygen can be effectively prevented from penetrating the amorphous semiconductor layer 208. Thus, oxidation of the microcrystalline semiconductor layer 206 can be prevented more effectively.

In addition, when the amorphous semiconductor layer 208 is formed, generation of parasitic channel can be prevented.

The source and drain regions 210 can be formed as follows: an impurity semiconductor layer is formed and then etched. If an n-channel thin film transistor is formed, typically phosphorus may be used as an impurity element, and when a gas including an impurity element imparting an n-type conductivity such as $PH_3$ is added to hydrogenated silicon, the n-channel thin film transistor can be formed. If a p-channel thin film transistor is formed, typically boron may be added as an impurity element, and when a gas including an impurity element imparting a p-type conductivity such as $B_2H_6$ is added to hydrogenated silicon, the p-channel thin film transistor can be formed. The source and drain regions 210 can be formed using microcrystalline semiconductor or amorphous semiconductor. The source and drain regions 210 are formed with a thickness of from 2 nm to 60 nm. When the source and drain regions 210 are formed thin, throughput can be increased.

In the present invention, as described above, all layers of from the gate insulating layer to the impurity semiconductor layer are preferably formed successively. A multi-chamber CVD apparatus may be used to successively form all layers of from the gate insulating layer to the impurity semiconductor layer. With the use of the multi-chamber CVD apparatus, a reaction chamber can be allocated for each different kind of deposition films, and a plurality of different films can be formed successively without being exposed to air. Hereinafter, an example of a structure of a multi-chamber CVD apparatus which can be applied to the present invention is described.

Figure 11:
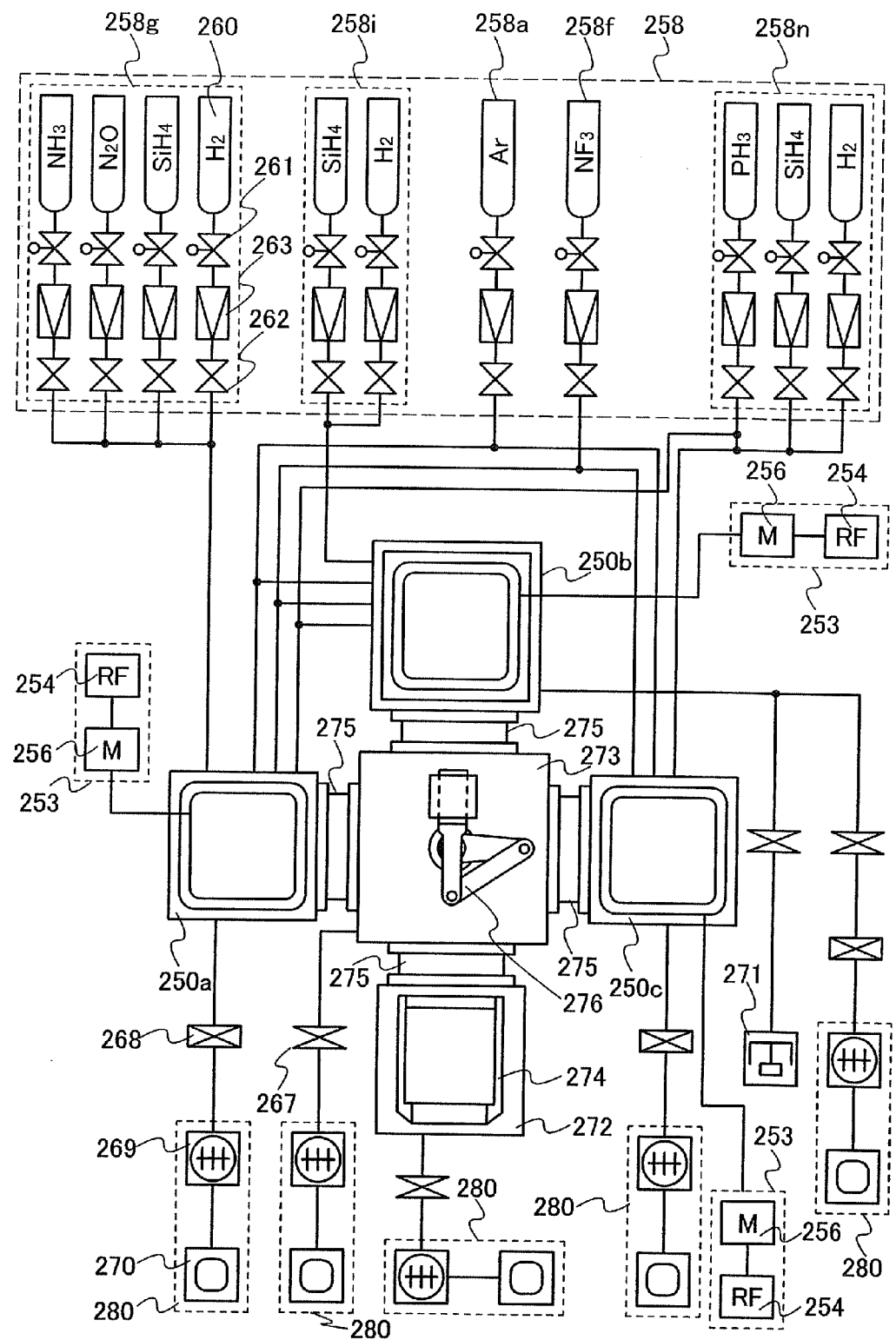
FIG. 11 illustrates a structure of a plasma CVD apparatus applicable to the present invention.

FIG. 11 illustrates an example of a multi-chamber plasma CVD apparatus including a plurality of reaction chambers. This apparatus includes a common chamber 273, a load/unload chamber 272, a first reaction chamber 250a, a second reaction chamber 250b and a third reaction chamber 250c. A substrate set in a cassette 274 in the load/unload chamber 272 is transferred to/from each reaction chamber by a transfer unit 276 in the common chamber 273. Gate valves 275 are provided between the common chamber 273 and each chamber, so that treatment conducted in the chambers does not interfere with each other.

Each reaction chamber is used for a different purpose, depending on the kind of a thin film to be formed. For example, an insulating layer such as a gate insulating layer is formed in the first reaction chamber 250a; a microcrystalline semiconductor layer forming a channel and an amorphous semiconductor layer are formed in the second reaction chamber 250b; and a semiconductor layer to which an impurity element imparting one conductivity type and which is to serve as a source region and a drain region is formed in the third reaction chamber 250c. Needless to say, the number of the reaction chambers is not limited to the above example, and the number may be increased or decreased as necessary. In addition, only one type of film may be formed in one reaction chamber or plural types of films may be formed in one reaction chamber.

Each reaction chamber is connected to a turbomolecular pump 269 and a dry pump 270 as an evacuation means. The exhaust units are not limited to a combination of these vacuum pumps and can employ other vacuum pumps as long as they can evacuate the reaction chamber to a degree of vacuum of about $10^{-1}$ Pa to $10^{-5}$ Pa. A butterfly valve 267 may be provided between the vacuum pump 280 and each reaction chamber to block vacuum evacuation. The evacuation speed is controlled by a conductance valve 268, and thereby, the pressure of each chamber can be adjusted.

Note that a cryopump 271 may be connected to the second reaction chamber 250b for forming the microcrystalline semiconductor layer. By use of the cryopump 271, the reaction chamber can be evacuated to an ultra-high vacuum of a pressure of lower than $10^{-5}$ Pa. In this embodiment mode, the inside of the reaction chamber is set to a pressure of lower than $10^{-5}$ Pa, which is effective in reducing the oxygen concentration in the microcrystalline semiconductor layer. As a result, the concentration of oxygen included in the microcrystalline semiconductor layer can be reduced to about $1 \times 10^{16}$ cm$^{-3}$ or lower. With the reduced oxygen concentration in the microcrystalline semiconductor layer, defects in the microcrystalline semiconductor layer can be reduced, whereby crystallinity can be improved and thus carrier mobility can be improved.

The gas supply means 258 includes a cylinder 260 in which a gas used for the process, such as a rare gas or a semiconductor source gas typified by silane, is filled, a stop valve 262, a mass flow controller 263, and the like. A gas supply means 258g is connected to the first reaction chamber 250a to supply a gas for forming a gate insulating layer. A gas supply means 258i is connected to the second reaction chamber 250b to supply a gas for forming a microcrystalline semiconductor layer and an amorphous semiconductor layer. A gas supply means 258n is connected to the third reaction chamber 250c to supply a gas for forming an n-type impurity semiconductor layer. In addition, phosphine which is one of gases including an impurity element which serves as a donor is connected and supplied to the first reaction chamber 250a and the second reaction chamber 250b. A gas supply unit 258a supplies argon, and a gas supply unit 258f supplies etching gas (here, NF$_3$) used for cleaning the inside of the reaction chambers. Thus, the gas supply units 258a and 258f are provided in common for each reaction chamber.

The high-frequency power supply means 253 for generating plasma is connected to each reaction chamber. A high-frequency power supply means 253 includes a high-frequency power source 254 and a matching box 256.

Figure 12:
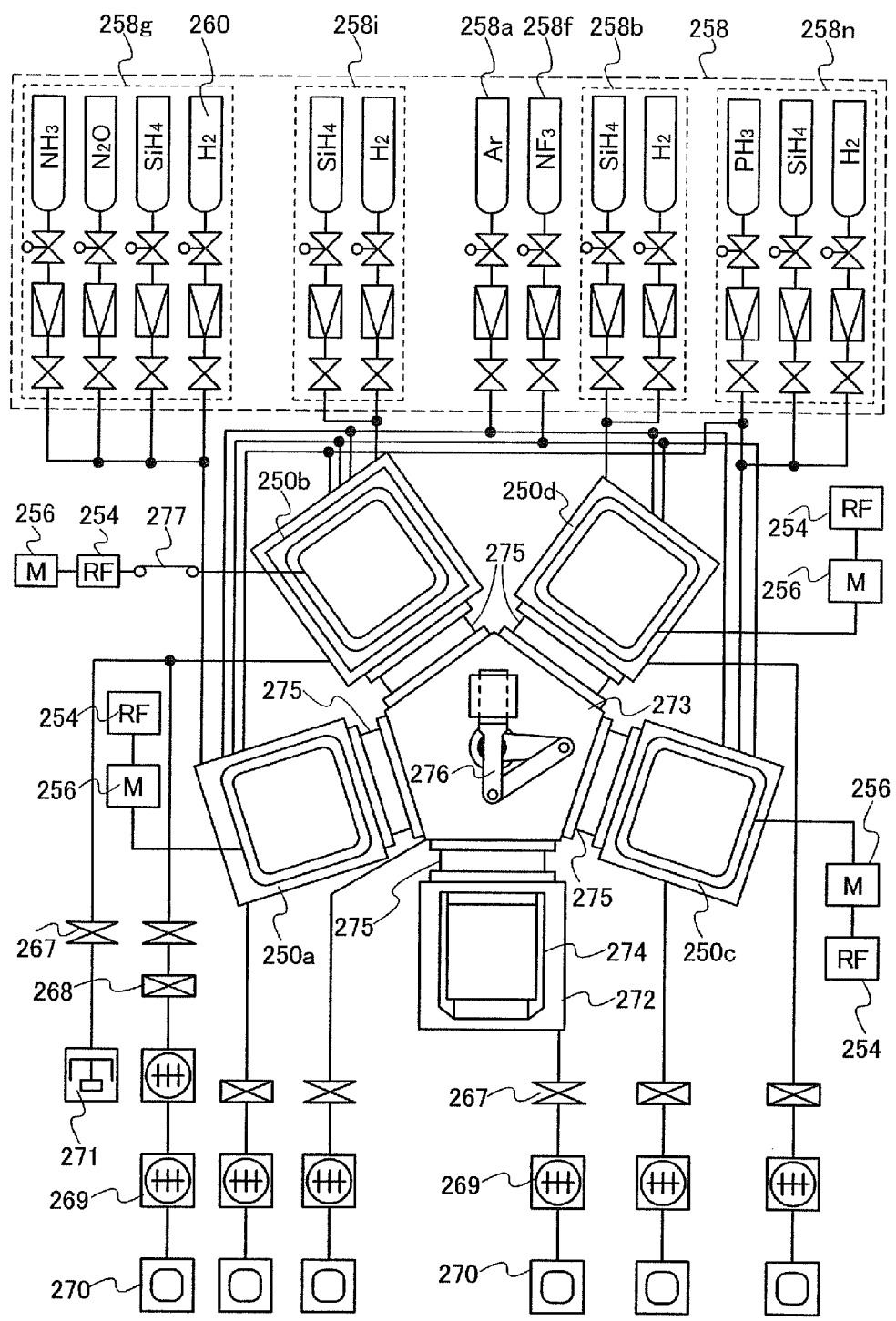
FIG. 12 illustrates a structure of a plasma CVD apparatus applicable to the present invention.

FIG. 12 illustrates a structure in which a fourth reaction chamber 250d is added to the structure of the multi-chamber plasma CVD apparatus of FIG. 11. A gas supply means 258b is connected to the fourth reaction chamber 250d. The structure of the high-frequency power supply units and the exhaust units is the same as those of other reaction chambers. Each reaction chamber can be used for a different purpose depending on the kinds of thin films to be formed. For example, an insulating layer such as a gate insulating layer is formed in the first reaction chamber 250a; a microcrystalline semiconductor layer forming a channel formation region is formed in the second reaction chamber 250b; an amorphous semiconductor layer which protects the microcrystalline semiconductor layer forming a channel formation region is formed in the fourth reaction chamber 250d; and an impurity semiconductor layer which is to serve as a source region and a drain region is formed in the third reaction chamber 250c. Since each thin film has an optimum temperature for being formed, each thin film is formed in a different reaction chamber, so that film formation temperatures can be easily controlled. Further, the same kind of films can be repeatedly deposited, so that influence of residual impurities attributed to a film formed previously can be excluded.

The above description is not a limiting example, and a microcrystalline semiconductor layer, an amorphous semiconductor layer and an impurity semiconductor layer to which an impurity element imparting one conductivity type is added may be formed successively. Specifically, a substrate over which a gate insulating layer is formed is introduced into a reaction chamber, and in the reaction chamber, the microcrystalline semiconductor layer, the amorphous semiconductor layer and the impurity semiconductor layer are formed successively.

In addition, when the microcrystalline semiconductor layer and the amorphous semiconductor layer are successively formed in the same processing container, an interface with little distortion can be formed and an atmosphere component which may be mixed into an interface can be reduced, which is preferable.

A spare chamber may be provided for the apparatus. By pre-heating the substrate in the spare chamber before film-formation, it is possible to shorten heating time before formation of the film in each reaction chamber, so that the throughput can be improved.

Further, by forming such layers successively as described above, each interface between stacked layers can be formed without being contaminated by an atmospheric constituent or a contaminant impurity element floating in air. Thus, variations in electric characteristics of thin film transistors can be reduced.

Alternatively, since the formation rate of microcrystalline semiconductor layers is low, the microcrystalline semiconductor layers may be formed by using a plurality of reaction chambers. For example, when the apparatus illustrated in FIG. 12 is used, a gate insulating layer may be formed in the first reaction chamber 250a, microcrystalline semiconductor layers may be formed in the second reaction chamber 250b and the third reaction chamber 250c, the amorphous semiconductor layer may be formed in the fourth reaction chamber 250d, and an impurity semiconductor layer may be formed in a fifth reaction chamber (not illustrated). In this manner, when the microcrystalline semiconductor layers are formed at the same time by using a plurality of reaction chambers, throughput can be improved. In this case, the inner wall of each reaction chamber is preferably coated with a film of the same kind as a film to be formed therein. The gas pipe connected to the apparatus can be changed as appropriate.

When a microwave plasma CVD apparatus having the structure described above is used, films with similar kinds of compositions or a film with one kind of composition can be formed in each reaction chamber and can be formed successively without being exposed to air. Therefore, stacked films can be formed without contamination of each interface thereof by a residue of formed films or an impurity element floating in air.

Next, a film formation process is described specifically. In the film formation process, a gas to be supplied from a gas supply portion may be selected depending on the purpose. Here, a case where the first insulating layer 204 is formed with a two-layer structure is described. A method in which a silicon oxynitirde layer is formed and a silicon nitride oxide layer is formed thereover, as the gate insulating layer 204, is described as an example.

First, the inside of a processing container in a reaction chamber of the microwave plasma CVD apparatus is cleaned with fluorine radicals. Note that the inside of the reaction chamber can be cleaned by introducing, into the reaction chamber, fluorine radicals, which are generated by introducing a gas of carbon fluoride, nitrogen fluoride, or fluorine into a plasma generator provided outside the reaction chamber and dissociating the gas. The reaction chamber can be cleaned by introduction of fluorine radicals.

When a large amount of hydrogen is introduced into the reaction chamber after the inside of the reaction chamber is cleaned with fluorine radicals, residual fluorine inside the reaction chamber can be reacted with hydrogen, so that the concentration of residual fluorine can be decreased. Thus, the amount of fluorine to be mixed into a protective layer which is to be formed later on the inner wall of the reaction chamber can be decreased, and the thickness of the protective film can be decreased.

Next, on the surface of the inner wall of the processing container in the reaction chamber, or the like, a silicon oxynitride layer is deposited as the protective layer. Here, the pressure in the processing container is 1 to 200 Pa, preferably 1 to 100 Pa, and one or more kinds of rare gases such as helium, argon, xenon, and krypton are introduced as a plasma ignition gas. Further, hydrogen is introduced in addition to any one kind of rare gases. In particular, helium is preferable as a plasma ignition gas, more preferably, a mixed gas of helium and hydrogen is used as a plasma ignition gas.

Although helium has a high ionization energy of 24.5 eV, it has a metastable state at about 20 eV. Thus, helium can be ionized at about 4 eV during discharge. Therefore, a threshold voltage of discharge inception is low and discharge can be maintained easily. Accordingly, generated plasma can be maintained uniformly, and power can be saved.

Alternatively, as the plasma ignition gas, an oxygen gas may be further introduced. When an oxygen gas as well as a rare gas is introduced into the processing container, plasma ignition can be facilitated.

Then, the microwave generating apparatus is turned on, and the output of the microwave generating apparatus is from 500 W to 6000 W, preferably from 4000 W to 6000 W inclusive to generate plasma.

Then, a source gas is introduced into the processing container through a gas pipe. Specifically, when silane, dinitrogen monoxide, and ammonia are introduced as source gases, a silicon nitride oxide layer is formed as the protective layer on the inner wall of the processing container and on the surfaces of the gas pipe, a dielectric plate, and a support base. Note that nitrogen may be introduced as a source gas instead of ammonia. The protective layer is formed to have a thickness of from 500 nm to 2000 nm.

Next, supply of the source gas is stopped, the pressure in the processing container is decreased, and the microwave generating apparatus is turned off. After that, a substrate is introduced onto the support base in the processing container.

Next, through a process which is similar to that of the protective layer, a silicon nitride oxide layer is deposited over the substrate as the gate insulating layer 204.

After the silicon nitride oxide layer is deposited to a predetermined thickness, supply of the source gas is stopped, the pressure in the processing container is decreased, and the microwave generating apparatus is turned off.

Next, the pressure in the processing container is 1 to 200 Pa, preferably 1 to 100 Pa, and one or more kinds of rare gases such as helium, argon, xenon, and krypton which are a plasma ignition gas, and dinitrogen monoxide, a rare gas, and silane are introduced as a source gas.

Next, a microwave generating apparatus is turned on and the output of the microwave generating apparatus is 500 to 6000 W, preferably 4000 to 6000 W to generate plasma.

Next, the source gas is introduced into the processing container through the gas pipe, and a silicon oxynitride layer is formed over the silicon nitride oxide layer over the substrate.

Then, the supply of the source gas is stopped, the pressure in the processing container is decreased, the microwave generating apparatus is turned off, and the film formation process is completed.

Through the above-described process, the silicon nitride oxide layer is formed as the protective layer on the inner wall of the reaction chamber, and the silicon nitride oxide layer and the silicon oxynitride layer are successively formed over the substrate, so that mixture of an impurity element into the silicon oxynitride layer on the upper layer side can be prevented. When the above-mentioned layers are formed by a microwave plasma CVD method using a power supply apparatus capable of generating a microwave, plasma density can be made higher and dense layers are formed. Therefore, a film having a highly withstand-voltage property can be formed. When the film is used as a gate insulating layer of a thin film transistor, variations in the threshold voltage of thin film transistors can be suppressed. In addition, the number of defects measured by BT (bias temperature) test can be reduced so that yield can be improved. Further, resistance to static electricity is increased, and a thin film transistor which is not easily damaged even when high voltage is applied thereto can be manufactured. Furthermore, a transistor which is hardly damaged over time can be manufactured. Furthermore, a transistor that is hardly damaged due to hot carriers can be manufactured.

In a case where the gate insulating layer is formed with a single layer of the silicon oxynitride layer formed by using the microwave plasma CVD method, the above-described formation method of the protective layer and the formation method of the silicon oxynitride layer are used. In particular, when the flow ratio of dinitrogen monoxide to silane is 100:1 to 300:1, preferably 150:1 to 250:1, a silicon oxynitride layer having high withstand voltage can be formed.

Next, a film formation process is described in which a microcrystalline semiconductor layer formed by a microwave plasma CVD method and an amorphous semiconductor layer functioning as a buffer layer are successively formed. First, in a manner similar to the formation of the insulating layer, the inside of the reaction chamber is cleaned. Next, a silicon layer is deposited as a protective layer inside the processing container. As the protective layer, an amorphous silicon layer is formed to a thickness of 0.2 to 0.4 μm. Here, the pressure in the processing container is 1 to 200 Pa, preferably 1 to 100 Pa, and one or more kinds of rare gases such as helium, argon, xenon, and krypton are introduced as a plasma ignition gas. Alternatively, hydrogen and the rare gas may be introduced.

Then, the microwave generating apparatus is turned on, and the output of the microwave generating apparatus is from 500 W to 6000 W, preferably from 4000 W to 6000 W to generate plasma. Then, a source gas is introduced into the processing container through a gas pipe. Specifically, when a silicon hydride gas and a hydrogen gas are introduced as source gases, a microcrystalline silicon layer is formed as a protective layer on the inner wall of the processing container and on the surfaces of the gas pipe, the dielectric plate, and the support base. Alternatively, a microcrystalline semiconductor layer can be formed from a dilution of a silicon hydride gas and a hydrogen gas with one or more kinds of rare gas elements selected from helium, argon, krypton, and neon. Here, the flow ratio of hydrogen to silicon hydride is 5:1 to 200:1, preferably 50:1 to 150:1, more preferably about 100:1. In addition, the thickness of the protective layer at this time is from 500 nm to 2000 nm. Note that before the microwave generating apparatus is turned on, a silicon hydride gas and a hydrogen gas may be introduced into the processing container in addition to the above-mentioned rare gas.

Alternatively, an amorphous semiconductor layer as the protective layer can be formed with a dilution of a silicon hydride gas with one or more kinds of rare gas elements selected from helium, argon, krypton, and neon.

Next, supply of the source gas is stopped, the pressure in the processing container is decreased, and the microwave generating apparatus is turned off. After that, a substrate is introduced onto the support base in the processing container.

Next, hydrogen plasma treatment is performed on the surface of the gate insulating layer 204 which is formed over the substrate as described above. When hydrogen plasma treatment is performed before the microcrystalline semiconductor layer is formed, lattice distortion at the interface between the gate insulating layer 204 and the microcrystalline semiconductor layer 206 can be reduced, and interface characteristics between the gate insulating layer 204 and the microcrystalline semiconductor layer 206 can be improved. Thus, electric characteristics of a thin film transistor which is to be formed can be improved.

In the above hydrogen plasma treatment, hydrogen plasma treatment is also performed on the amorphous silicon layer which is formed as the protective layer inside the processing container, so that the protective layer is etched and a slight amount of silicon is deposited on the surface of the gate insulating layer 204. The slight amount of silicon serves as nuclei of crystal growth, and with the nuclei, the microcrystalline semiconductor layer is deposited. As a result, lattice distortion at the interface between the gate insulating layer 204 and the microcrystalline semiconductor layer 206 can be decreased, and interface characteristics of the gate insulating layer 204 and the microcrystalline semiconductor layer 206 can be improved. Therefore, electric characteristics of a thin film transistor which is to be formed can be improved.

Next, in a manner similar to that of the protective layer, a microcrystalline semiconductor material is deposited over the substrate. The thickness of the microcrystalline semiconductor layer is from 2 nm to 50 nm, preferably from 10 nm to 30 nm. Note that microcrystalline silicon is used as the microcrystalline semiconductor.

Note that crystals of the microcrystalline semiconductor layer grow from a bottom portion of the layer toward an upper portion of the layer and needle-like crystals are formed. This is because crystals grow to increase a crystal surface. However, even when crystal growth occurs in this manner, the formation rate of the microcrystalline silicon layer is from about 1% to 10% of the formation rate of an amorphous silicon layer. Therefore, the microcrystalline silicon layer is preferably formed thin to increase throughput.

After the microcrystalline silicon layer is deposited to a predetermined thickness, supply of the source gases is stopped, the pressure in the processing container is decreased, the microwave generating apparatus is turned off, and the film formation process for the microcrystalline silicon layer is finished.

After the microcrystalline semiconductor layer is formed, an amorphous semiconductor layer is formed at a temperature of about 250 to 400° C. by a plasma CVD method. By this formation process, hydrogen is supplied into the microcrystalline semiconductor layer and thus an effect similar to that of hydrogenation of the microcrystalline semiconductor layer can be obtained. In other words, by formation of an amorphous semiconductor layer including hydrogen over a microcrystalline semiconductor layer, hydrogen is dispersed into the microcrystalline semiconductor layer and thus dangling bonds can be terminated.

Next, the pressure in the processing container is reduced so as to adjust the flow rate of a source gas. Specifically, the flow rate of a hydrogen gas is considerably decreased, comparing film formation conditions of the microcrystalline semiconductor layer. Typically, a hydrogen gas at a flow rate which is 1 to 200 times, preferably 1 to 100 times, more preferably 1 to 50 times as high as that of silicon hydride is introduced. Alternatively, a silicon hydride gas may be introduced into the processing container without introducing a hydrogen gas into the processing chamber. When the flow rate of hydrogen to silicon hydride is decreased in this manner, the formation rate of the amorphous semiconductor layer which is formed as a buffer layer can be increased. Alternatively, a silicon hydride gas is diluted with one or more kinds of rare gas elements selected from helium, argon, krypton, and neon. Then, the microwave generating apparatus is turned on, and the output of the microwave generating apparatus is 500 W to 6000 W, preferably 4000 W to 6000 W to generate plasma. Thus, an amorphous semiconductor layer can be formed. Since the formation rate of an amorphous semiconductor layer is higher than that of a microcrystalline semiconductor layer, the pressure in the processing container can be set low. The thickness of the amorphous semiconductor layer at this time may be from 100 nm to 400 nm.

After an amorphous semiconductor material is deposited to a predetermined thickness, supply of the source gas is stopped, the pressure in the processing container is decreased, the microwave generating apparatus is turned off, and the film formation process of the amorphous semiconductor layer is finished.

Note that the microcrystalline semiconductor layer 206 and the amorphous semiconductor layer 208 may be formed while plasma is ignited. Specifically, the microcrystalline semiconductor layer 206 and the amorphous semiconductor layer 208 may be stacked with the flow rate of hydrogen to silicon hydride gradually decreased. With such a method, an impurity is not deposited at an interface between the microcrystalline semiconductor layer 206 and the amorphous semiconductor layer 208 and thus an interface with little distortion can be formed. Thus, electric characteristics of a thin film transistor to be formed later can be improved.

Plasma which is generated by a microwave plasma CVD apparatus with a frequency of 1 GHz or more has high electron density and many radicals are generated from a source gas and are supplied to the substrate. Thus, radical reaction on the substrate surface is promoted and the formation rate of the microcrystalline semiconductor layer can be increased. Further, a microwave plasma CVD apparatus which includes a plurality of microwave generating apparatuses and a plurality of dielectric plates can generate wide plasma stably. Therefore, even if a large-area substrate is used, a layer having uniform film quality can be formed over the large-area substrate and mass productivity (yield) can be improved.

In addition, when the microcrystalline semiconductor layer and the amorphous semiconductor layer are successively formed in the same processing container, an interface with little distortion can be formed and an atmosphere component which may be mixed into an interface can be reduced, which is preferable.

Note that in the manufacturing steps of the insulating layer and semiconductor layers, when a protective layer having a thickness of 500 nm to 2000 nm is formed on the inner wall of the reaction chamber, the cleaning treatment and the formation of a protective layer can be omitted.

Figure 8A:
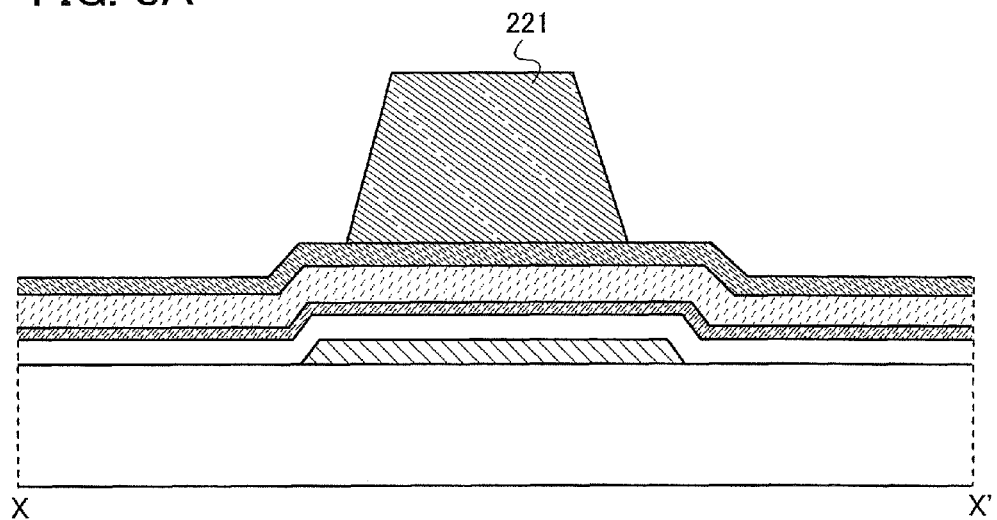
FIGS. 8A to 8C illustrate an example of a method for manufacturing a thin film transistor according to an aspect of the present invention.

Next, the resist mask 221 is formed over the impurity semiconductor layer (see FIG. 8A). The resist mask 221 is formed by a photolithography method or an inkjet method.

Figure 8B:
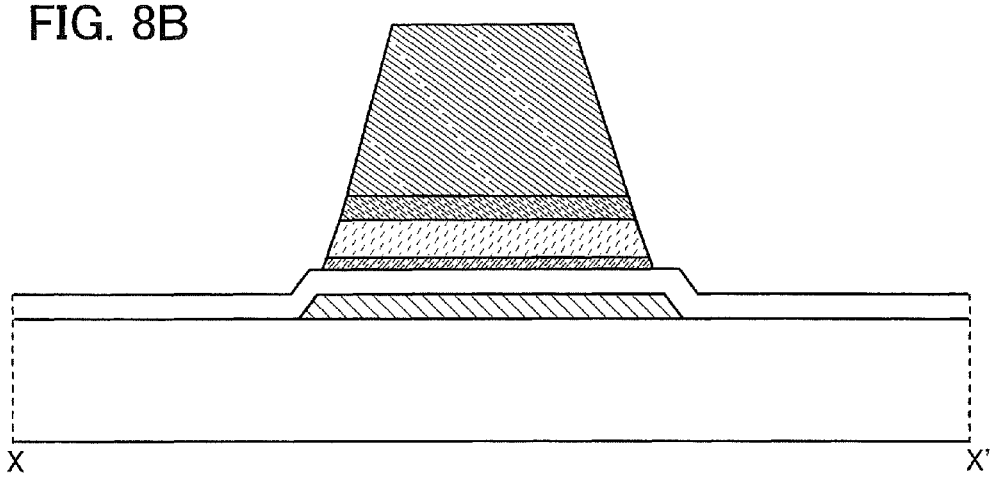

Next, the microcrystalline semiconductor layer, the amorphous semiconductor layer and the impurity semiconductor layer are etched using the resist mask 221. With this treatment, the microcrystalline semiconductor layer 206, the amorphous semiconductor layer 208, and the source and drain regions 210 are separated for each element (see FIG. 8B). After that, the resist mask 221 is removed.

Note that the etching is performed so that a side face of a layer where the microcrystalline semiconductor layer, the amorphous semiconductor, and the impurity semiconductor layer ate stacked has a tapered shape. The taper angle is 30 to 90°, preferably 40 to 80°.

In addition, when the side face has a tapered shape, coverage with a layer to be formed thereover (e.g., a wiring layer) in a later step can be improved. Therefore, disconnection or the like at a step portion can be prevented. Note that for the definition of the taper angle described here, the description in Embodiment Mode 1 is referred to.

Figure 8C:
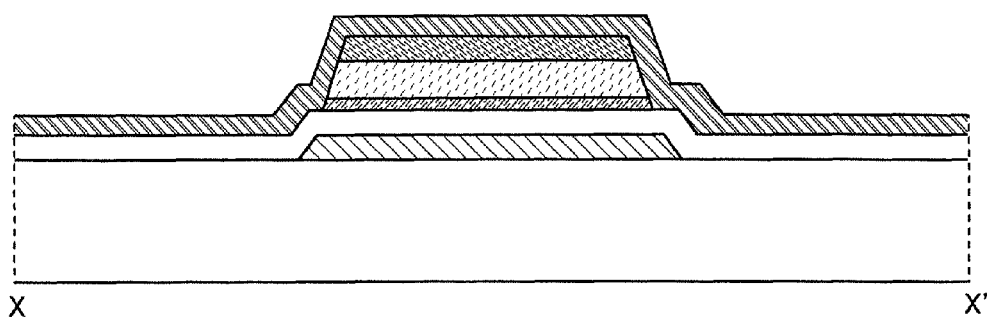

Next, a conductive layer is formed over the impurity semiconductor layer and the gate insulating layer 204 (FIG. 8C).

The conductive layer can be formed of a single-layer structure or a stacked-layer structure of aluminum, copper, titanium, neodymium, scandium, molybdenum, chromium, tantalum, tungsten or the like. An aluminum alloy to which an element to prevent a hillock is added (e.g., an Al—Nd alloy which can be used for the gate electrode layer 202) may be used. Alternatively, crystalline silicon to which an impurity element imparting one conductivity type is added may be used. The conductive layer may have a stacked-layer structure where a layer on the side which is in contact with the crystalline silicon to which an impurity imparting one conductivity type is added is formed using titanium, tantalum, molybdenum, tungsten, or nitride of any of these elements and aluminum or an aluminum alloy is formed thereover. Further alternatively, the conductive layer may have a stacked-layer structure where aluminum or an aluminum alloy is sandwiched with titanium, tantalum, molybdenum, tungsten, or nitride of any of these elements, on an upper side and a lower side thereof. For example, the conductive layer preferably has a three-layer structure in which an aluminum layer is sandwiched with molybdenum layers.

The conductive layer is formed by a sputtering method or a vacuum evaporation method. Alternatively, the conductive layer may be formed by discharge of a conductive nanopaste of silver, gold, copper, or the like by using a screen printing method, an inkjet method, or the like and by baking the conductive nanopaste.

Figure 9A:
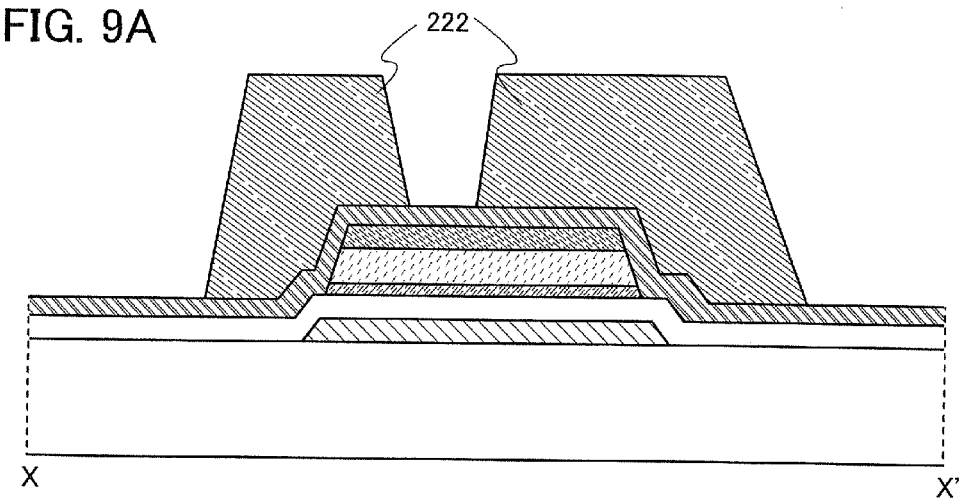
FIGS. 9A to 9C illustrate an example of a method for manufacturing a thin film transistor according to an aspect of the present invention.

Then, a resist mask 222 is formed over the conductive layer (FIG. 9A). The resist mask 222 is formed by a photolithography method or an inkjet method, similar to the resist mask 221. Here, $O_2$ plasma ashing may be conducted to control the size of the resist mask.

Figure 9B:
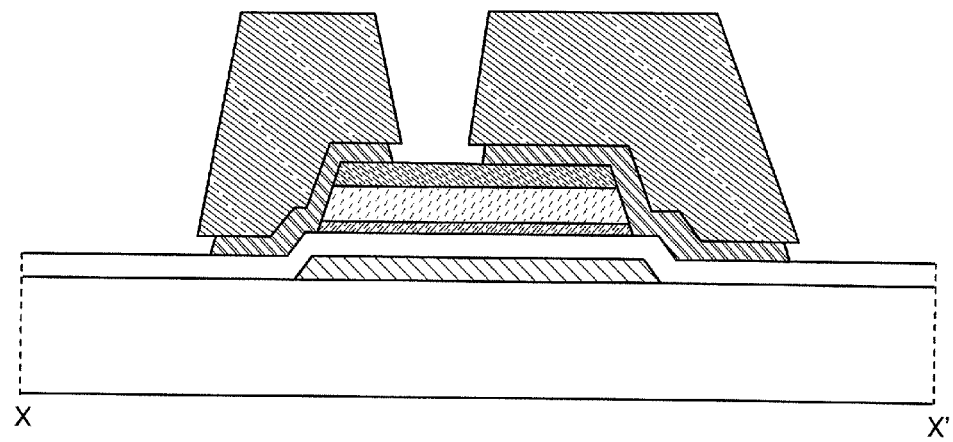

Then, the conductive layer is etched using the resist mask 222 to be patterned (FIG. 9B). The patterned conductive layers serve as source and drain electrodes. The etching is preferably wet etching. By wet etching, the side faces of the conductive layers are selectively etched. As a result, the side faces of the conductive layers recede inward, so that source and drain electrode layers 212 are formed. The source and drain electrode layers 212 also serve as wiring lines.

Figure 9C:
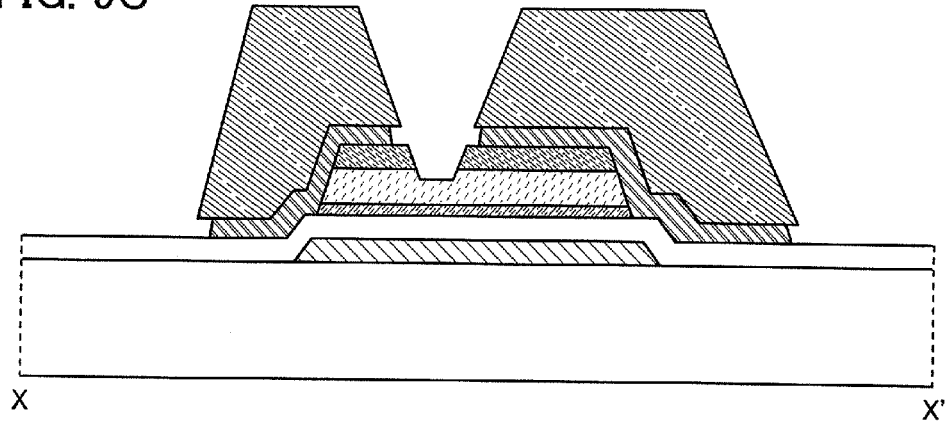

Next, the impurity semiconductor layer and the amorphous semiconductor layer are etched with the resist mask 222 formed thereover, so that a back channel portion is formed (FIG. 9C). Note that the amorphous semiconductor layer is etched to leave a part thereof, and the surface of the microcrystalline semiconductor layer 206 is covered with the amorphous semiconductor layer. By etching the amorphous semiconductor layer, the amorphous semiconductor layer 208 is formed.

At this time, dry etching using a gas including oxygen is conducted as the etching process. By the gas including oxygen, while the resist is being recessed, the impurity semiconductor layer and the amorphous semiconductor layer can be etched, so that the side face of the impurity semiconductor layer and the side face of the amorphous semiconductor layer can have a tapered shape. As the etching gas, for example, an etching gas in which oxygen is mixed into $CF_4$ or an etching gas in which oxygen is mixed into chlorine can be used. The side faces of the impurity semiconductor layer and the amorphous semiconductor layer have a tapered shape, and thereby electric field concentration can be prevented and leakage current can be reduced. Here, the etching is conducted with a gas flow rate of $CF_4:O_2=45:55$ (sccm), a pressure in a chamber of 2.5 Pa, and a temperature of a sidewall in the chamber of about 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. By the dry etching using the gas including oxygen, the side face of the back channel portion can be processed into a tapered shape. The side face has a tapered shape as described above, and the taper angle is preferably from 40° to 80° so that electric field concentration in a thin film transistor can be decreased and leakage current can be reduced.

The amorphous semiconductor layer 208 has a recessed portion obtained by being partially etched when the source region and the drain region are formed. The thickness of the amorphous semiconductor layer may be such a thickness that a part of the amorphous semiconductor layer 208 overlapping with the recessed portion can be left. The part of the amorphous semiconductor layer 208 overlapping with the source and drain regions 210 is not etched in the formation process of the source and drain regions 210. In this manner, the amorphous semiconductor layer 208 serves also as a protective layer for the microcrystalline semiconductor layer 206.

Figure 10A:
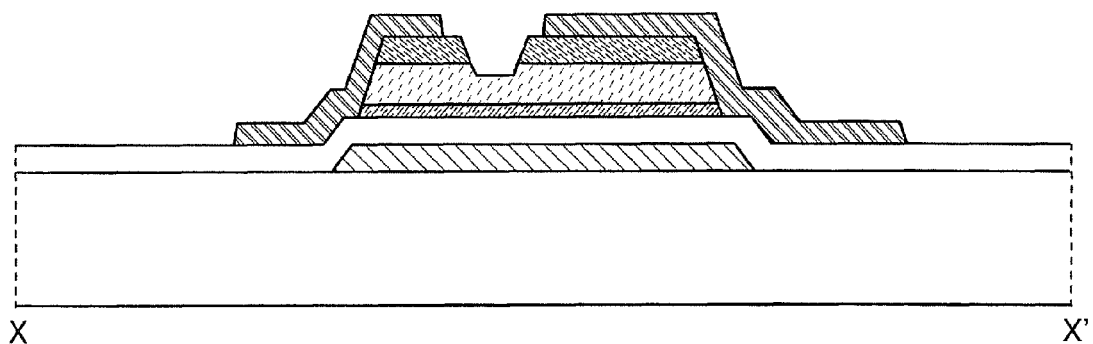
FIGS. 10A and 10B illustrate an example of a method for manufacturing a thin film transistor according to an aspect of the present invention.

After that, the resist mask 222 is removed (FIG. 10A).

As described above, in the thin film transistor formed using the microcrystalline semiconductor layer, the amorphous semiconductor layer 208 is provided, so that etching residue can be prevented from entering the microcrystalline semiconductor layer 206. However, residual product caused by the etching process, residue of the resist mask and substances that may be contamination sources in an apparatus, which has been used for removal of the resist mask 222 are attached or deposited over the amorphous semiconductor layer 208 between the source region and the drain region. Thus, by electric conduction through the product, residue and substances, off current is increased in many elements, which leads to variation in electric characteristics between the elements over the same substrate in many cases. This trend is apparent especially when a remover including sulfur is used in removing the resist mask.

Therefore, in order to solve the above problem, dry etching is conducted. By dry etching, insulation between the source region and drain region can be secured. The etching condition is set such that the exposed amorphous semiconductor layer is not damaged and the etching rate to the amorphous semiconductor layer is low. In other words, a condition which gives almost no damages to the surface of the exposed amorphous semiconductor layer and does not reduce the thickness of the amorphous semiconductor layer may be applied. At this time, a gas used for forming the back channel (e.g., a chlorine gas) may be used as the etching gas. An inductively-coupled plasma etching method is preferably employed for the etching. As an example of the etching condition, the gas flow rate is 30 sccm, the pressure of a chamber is 0.67 Pa, the temperature of a lower electrode is −10° C., the temperature of the side wall of the chamber is about 80° C., and an RF power (13.56 MHz) of 2000 W is applied to a coiled electrode to generate plasma while no power is applied to a substrate side (i.e., 0 W, non-biased). On the condition, etching may be conducted for thirty seconds. By this etching, sulfur or the like included in the remover is removed, for example.

There is no particular limitation on an etching method and a capacitively coupled plasma (CCP) method, an electron cyclotron resonance (ECR) method, or a reactive ion etching (RIE) method, or the like can be used, as well as an inductively coupled plasma (ICP) method.

Note that the dry etching is preferably conducted by a discontinuous discharge (pulsed discharge), not by continuous discharge. More preferably, a repetition pulse discharge is conducted. Since dry etching is conducted using pulse discharge, charge-up damage generated in the back channel portion which is subjected to etching can be reduced. By reducing the charge-up damages in the back channel portion, leakage current can be reduced between the source electrode and the drain electrode. Accordingly, by pulsed discharge, off current can be more reduced and thus switching characteristics can be improved. Therefore, the effect of the present invention can be more advantageous.

The above-described etching can remove residue and the like existing over the amorphous semiconductor layer 208 between the source region and the drain region. In addition, by this etching process, the impurity semiconductor layer not overlapping the source and drain electrode layers 212 is slightly etched. In the above etching condition, the impurity semiconductor layer is etched for example, 0 nm to 5 nm deep in many cases. Note that this etching process may be conducted as necessary. In the thin film transistor according to an aspect of the present invention, a side face of an upper portion (first portion) of the source and drain regions exists in the same as or substantially the same plane as a side face of the source and drain electrode layers, and a side face of a lower portion (second portion) of the source and drain regions exists in the same as or substantially the same plane as a side face of the amorphous semiconductor layer.

In addition, as described above, since the side faces of the source and drain electrode layers 212 are not aligned with the side faces of the source and drain regions 210, the distance between the source and drain electrode layers 212 is sufficiently long. Thus, a distance between one of the source electrode and the drain electrode and the other of the source electrode and the drain electrode is sufficiently large. Thus, leakage current can be reduced and short-circuit can be prevented. Further, since the side faces of the source and drain electrode layers 212 are not aligned with the side faces of the source and drain regions 210, electric field concentration hardly occurs in the side faces of the source and drain electrode layers 212 and the side faces of the source and drain regions 210. Further, by the amorphous semiconductor layer 208 which is a high-resistant region, the distance between the gate electrode layer 202 and the source and drain electrode layers 212 is sufficiently large. Thus, generation of parasitic capacitance can be suppressed, and the amount of leakage current can be reduced. Accordingly, a thin film transistor which has high reliability, a small mount of off current, and high withstand voltage can be formed.

Through above-described process, a channel-etched thin film transistor of the present invention can be formed.

Figure 10B:
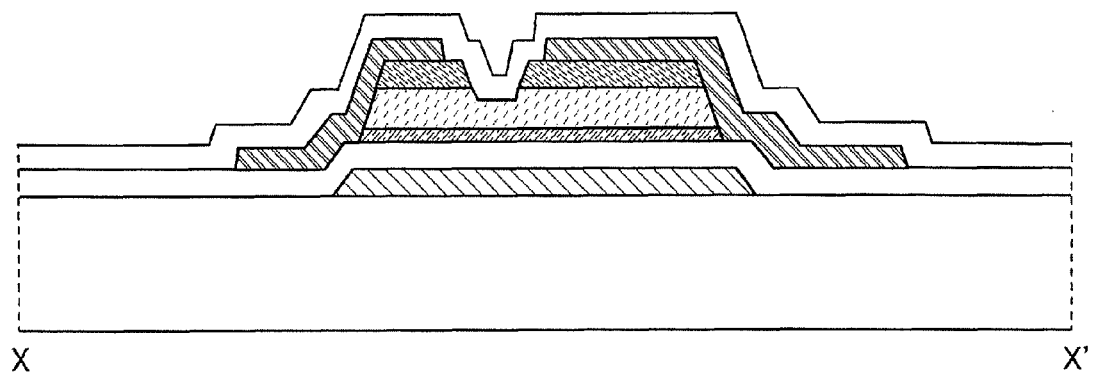

Next, the insulating layer 214 is formed over the source and drain electrode layers 212, the source and drain regions 210, the microcrystalline semiconductor layer 206, and the gate insulating layer 204 (FIG. 10B). The insulating layer 214 can be formed in a similar manner to the gate insulating layer 204. The insulating layer 214 is preferably a dense silicon nitride layer such that entry of a contaminant impurity such as an organic substance, a metal substance, or moisture floating in the atmosphere can be prevented. In addition, the carbon, nitrogen and oxygen concentrations in the amorphous semiconductor layer 208 is preferably $1\times10^{19}$ atoms·cm$^{-3}$ or less, more preferably $5\times10^{18}$ atoms·cm$^{-3}$ or less.

Note that the thin film transistor illustrated in FIG. 7 serves as a pixel transistor, and thus one of the source electrode and the drain electrode is connected to the pixel electrode. In the thin film transistor illustrated in FIG. 7, one of the source electrode and the drain electrode is connected to the pixel electrode layer 218 though the opening portion 216 provided in the insulating layer 214.

A conductive composition including a conductive high molecule (also referred to as a conductive polymer) having a light-transmitting property can be used for the pixel electrode layer 218. The pixel electrode layer 218 formed using such a conductive composition preferably has a sheet resistance of 10000 Ω/square or less and a light transmittance of 70% or higher at a wavelength of 550 nm. In addition, the resistance of the conductive high molecule which is contained in the conductive composition is desirably less than or equal to 0.1 Ω/square.

As such a conductive high molecule, so-called π electron conjugated conductive high-molecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 218 can be formed using indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, for example.

The pixel electrode layer 218 may be formed in a manner similar to the source and drain electrode layers 212 or the like, in other words, a conductive layer is entirely formed and etched using a resist mask or the like to be patterned.

Although not illustrated, an insulating layer formed using an organic resin material by a spin coating method or the like may be present between the insulating layer 214 and the pixel electrode layer 218. By provision of the insulating layer between the insulating layer 214 and the pixel electrode layer 218, using an organic resin material by a spin coating method or the like, a surface to be provided with the pixel electrode layer 218 can be planarized, and defective formation of the pixel electrode layer 218 can be prevented.

Note that in the above description, the gate electrode and the scan line are formed in the same process and the source and drain electrodes and the signal line are formed in the same process. However, the present invention is not limited to the description. An electrode and a wiring connected to the electrode may be formed in different steps.

As described above in this embodiment mode, a thin film transistor with less leakage current and high withstand-voltage can be manufactured according to the present invention. The thin film transistor manufactured as described above can have excellent electric characteristics. Even when such thin film transistors are formed over a large-size substrate, variation of electric characteristics between elements formed over the same substrate can be reduced.

In addition, as described above, the film transistor in this embodiment mode has a small amount of off current due to almost no leakage current. Further, since microcrystalline semiconductor is used for the channel formation region, a large amount of on current can flow. Accordingly, the thin film transistor in this embodiment mode can have excellent switching characteristics. Thus, with use of the thin film transistor as a pixel transistor, a display device having high contrast ratio can be manufactured.

Embodiment Mode 3

In this embodiment mode, an example of a method for manufacturing a thin film transistor will now be described, which is different from that in Embodiment Mode 2.

In a thin film transistor in this embodiment mode, only an impurity semiconductor layer serving as a source region and a drain region has a tapered shape.

Figure 13A:
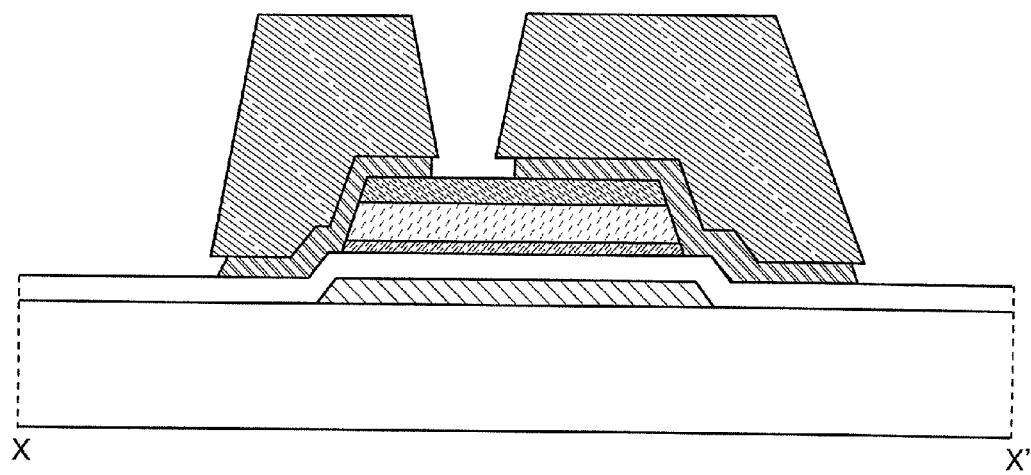
FIGS. 13A to 13C illustrate an example of a method for manufacturing a thin film transistor according to an aspect of the present invention.

In addition, steps up to and including the formation of the source electrode and the drain electrode are conducted in the same manner as in Embodiment Mode 1. In other words, a conductive layer serving as a source electrode and a drain electrode is subjected to wet-etching (FIG. 13A).

Figure 13B:
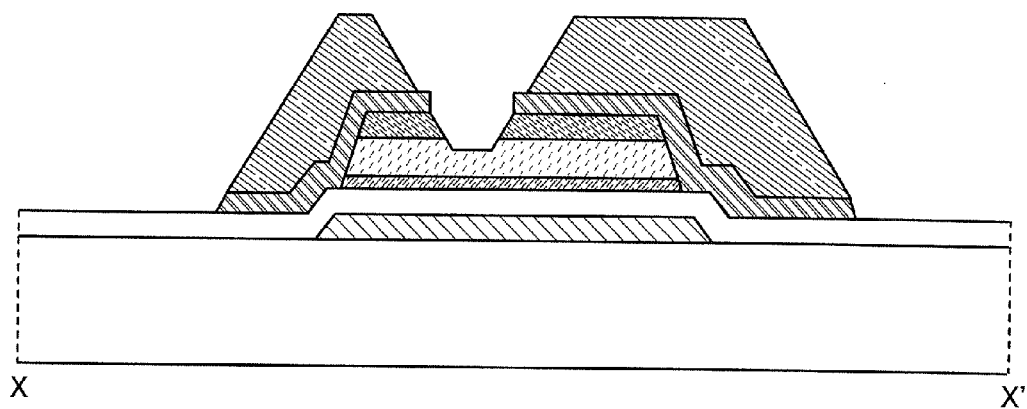

Next, an impurity semiconductor layer and an amorphous semiconductor layer are etched while a resist mask is being recessed. Specifically, end portions of the source and drain electrodes are located outside end portions of the resist mask. In this etching process, dry etching using a gas including oxygen is conducted. For example, an etching gas in which one gas or plural gases selected from $CF_4$, $Cl_2$, $SF_6$, $C_4F_8$, HBr, $CHF_3$, and $NF_3$ is used. The resist mask can be recessed gradually by using a gas including oxygen as an etching gas. In addition, by controlling a flow rate of oxygen, the taper angle can be controlled, and side faces of the impurity semiconductor layer and the amorphous semiconductor layer can be processed to have a desired taper angle (FIG. 13B). As an example, the etching is conducted on the conditions that a gas flow rate is $CF_4:O_2=45:55$ (sccm), a pressure in a chamber is 2.5 Pa, and a temperature of a sidewall in the chamber is about 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. The recessed side face of the resist mask may be located on a plane different from, as illustrated in FIG. 13B, or on substantially the same plane as the side face of the source and drain electrodes. The etching may be conducted sufficiently longer than that in Embodiment Mode 2.

By conducting the etching in this manner, the impurity semiconductor layer serving as the source and drain regions can have a tapered shape. By the dry etching using the gas including oxygen, the side face of the back channel portion can be processed into a tapered shape. The side face has a tapered shape as described above, and the taper angle is preferably 40° to 80° so that electric field concentration in a thin film transistor can be decreased and leakage current can be reduced.

Figure 13C:
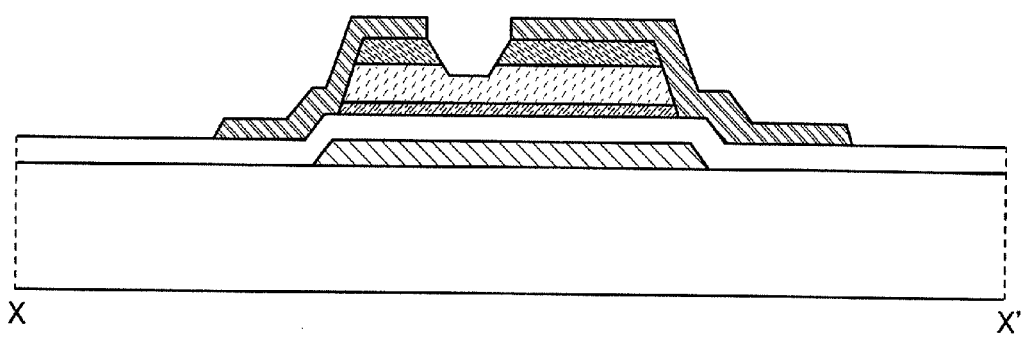

After that, the resist mask is removed (FIG. 13C). After removing the resist, steps similar to those in Embodiment Mode 2 can be conducted, whereby a thin film transistor can be manufactured.

The thin film transistor in this embodiment mode is not limited to the form illustrated in FIGS. 13A to 13C. For example, the thin film transistor may have a form illustrated in FIGS. 14A to 14C.

Figure 14A:
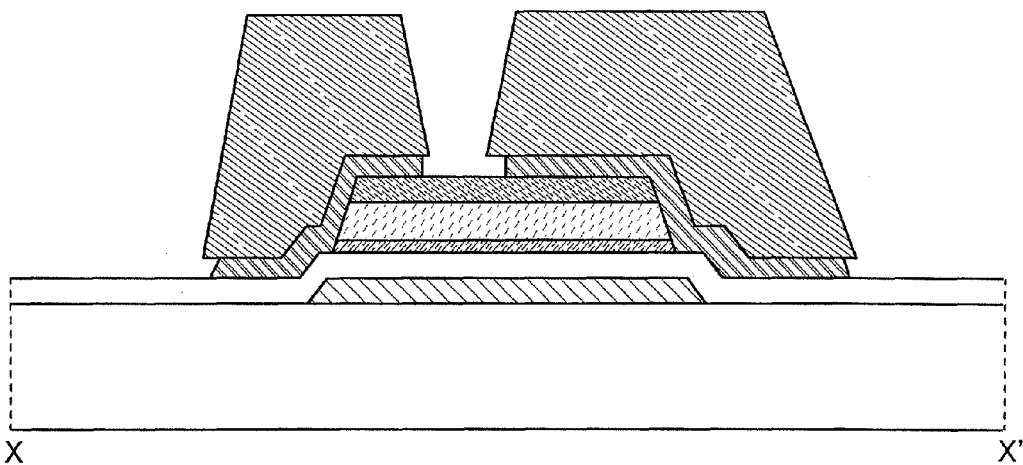
FIGS. 14A to 14C illustrate an example of a method for manufacturing a thin film transistor according to an aspect of the present invention.

As in FIG. 13A, a conductive layer serving as source and drain electrodes which is subjected to wet etching is prepared (FIG. 14A). After that, the resist mask is removed.

Figure 14B:
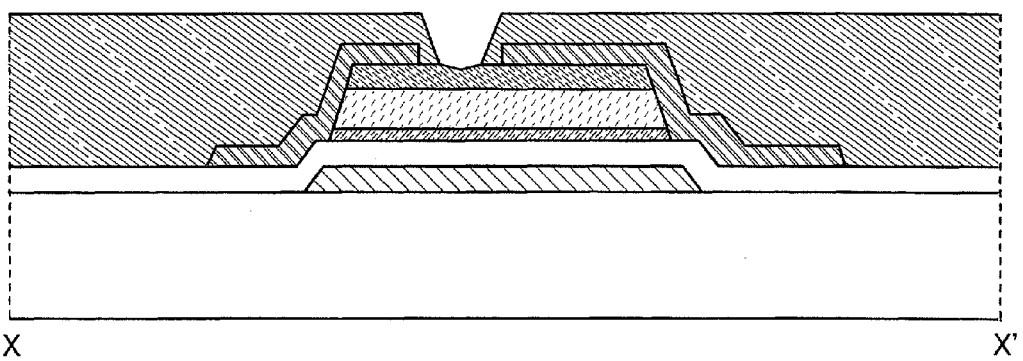
Figure 14C:
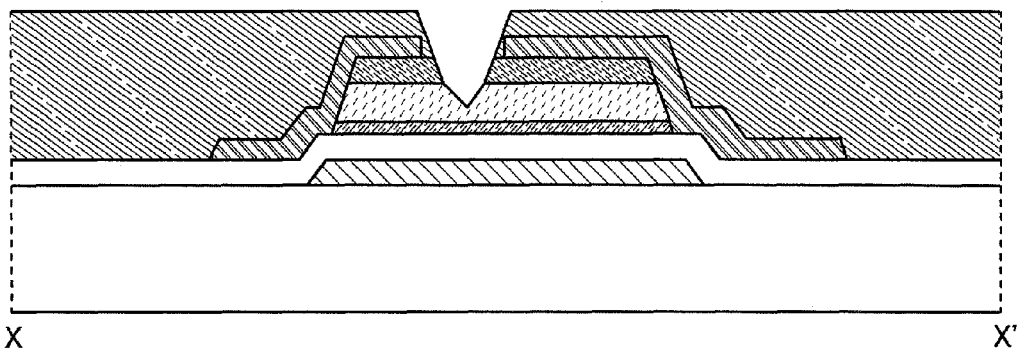

Next, a resist mask having a recession portion is formed in a region overlapping with the recession portion of an amorphous semiconductor layer (FIG. 14B). The resist mask illustrated in FIG. 14B can be obtained by steps of forming a resist mask having a recession portion first, and conducting ashing on the resist mask to expose a surface of the recession portion of the amorphous semiconductor layer. After that, an impurity semiconductor layer and the amorphous semiconductor layer are etched while the resist mask is being recessed. In this etching process, dry etching using a gas including oxygen is conducted. For example, an etching gas in which one gas or plural gases selected from $CF_4$, $Cl_2$, $SF_6$, $C_4F_8$, HBr, $CHF_3$, and $NF_3$ is used. The resist mask can be recessed gradually by using a gas including oxygen as an etching gas. In addition, by controlling a flow rate of oxygen, the taper angle can be controlled, and side faces of the impurity semiconductor layer and the amorphous semiconductor layer can be processed to have a desired taper angle (FIG. 14C). As an example, the etching may be conducted on the conditions that a gas flow rate is $CF_4:O_2=45:55$ (sccm), a pressure in a chamber is 2.5 Pa, the temperature of the lower electrode is −10° C. and a temperature of a sidewall in the chamber is about 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. By conducting dry etching using such a gas including oxygen in this manner, the side face of the back channel portion can be processed into a tapered shape. The side face has a tapered shape as described above, and the taper angle is preferably 40° to 80° so that electric field concentration in a thin film transistor can be decreased and leakage current can be reduced.

As described above, a thin film transistor can be manufactured, in which only an impurity semiconductor layer serving as source and drain regions has a tapered shape, but the source and drain electrodes do not have a tapered shape. In the thin film transistor manufactured according to this embodiment mode, the back channel portion can have a V-shape.

As described above, a thin film transistor having a highly withstand-voltage property and a very small amount of off current can be manufactured in accordance with the present invention. The thin film transistor manufactured as described above can have excellent electric characteristics.

Embodiment Mode 4

In Embodiment Mode 4, a method for manufacturing the thin film transistor described in Embodiment Mode 1, which is different from those of Embodiment Modes 2 and 3 will now be described. Specifically, a method for manufacturing the thin film transistor, using a multitone mask (a gray tone mask or a halftone mask) is described.

Figure 15A:
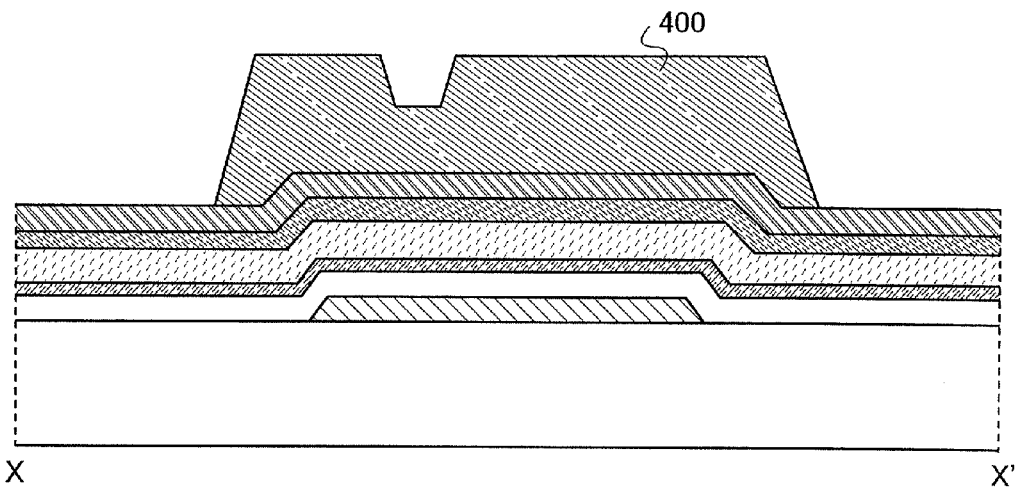
FIGS. 15A to 15C illustrate an example of a method for manufacturing a thin film transistor according to an aspect of the present invention.

First, by the method described in Embodiment Mode 2, a stacked body in which a gate insulating layer, a microcrystalline semiconductor layer, an amorphous semiconductor layer, an impurity semiconductor layer and a conductive layer are stacked over a gate electrode layer is obtained. Then, a resist mask 400 having a recession portion (concave portion) at a desired position is formed over the stacked body (FIG. 15A). The resist mask can be a multi-tone mask.

Figure 15B:
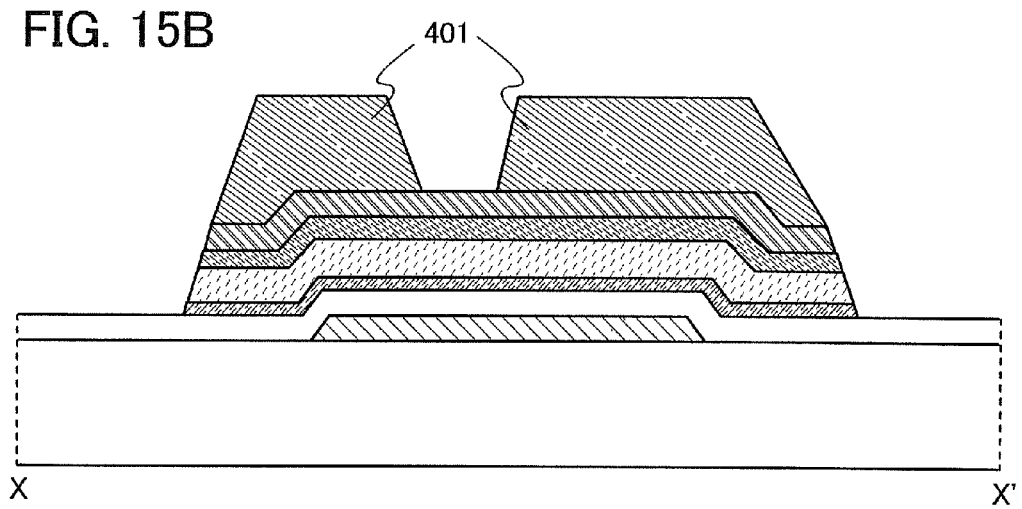

Then, the microcrystalline semiconductor layer, the amorphous semiconductor layer, the impurity semiconductor layer and the conductive layer are etched using the resist mask 400. By this etching, the microcrystalline semiconductor layer, the amorphous semiconductor layer, the impurity semiconductor layer, and the conductive layer are separated corresponding to each element, and the conductive layer is exposed in the recession portion of the resist mask. The etching may be dry etching or wet etching. Thereby a resist mask 401 is formed (FIG. 15B).

Figure 15C:
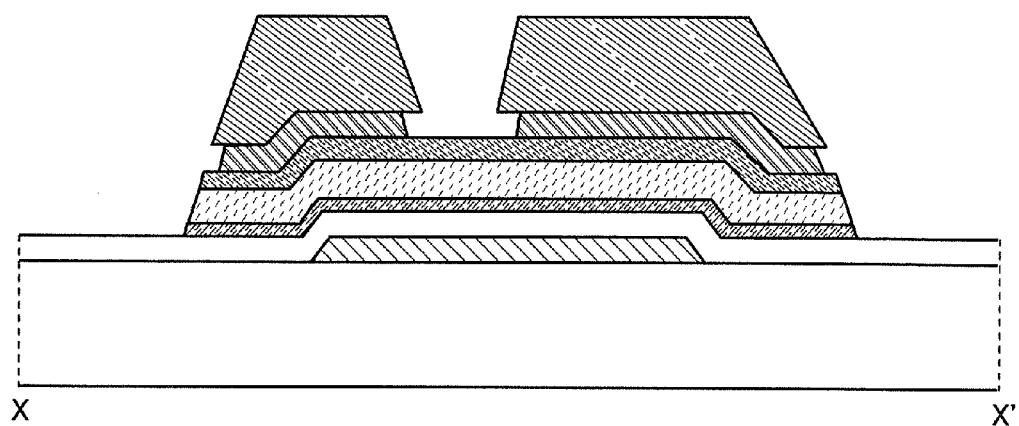

Next, the conductive layer is etched using the resist mask 401 so as to be patterned (FIG. 15C). The patterned conductive layers serve as source and drain electrodes. In this case, the etching is wet etching.

Figure 16A:
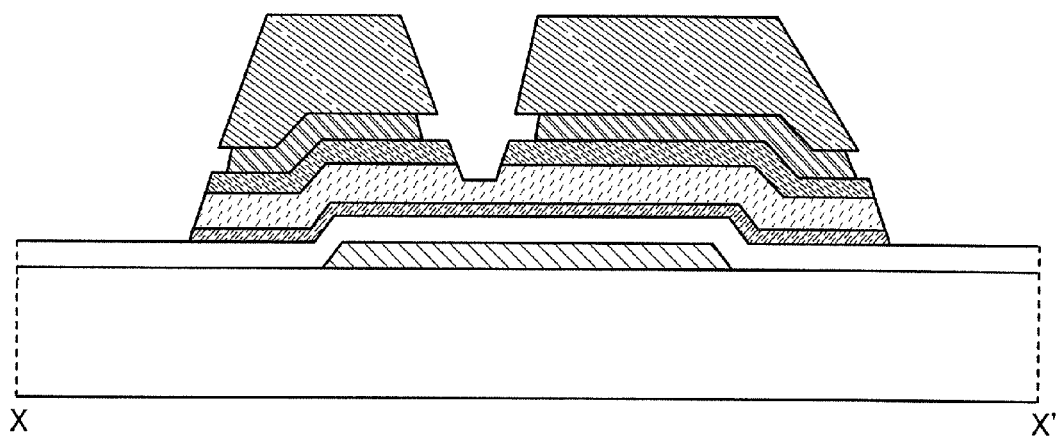
FIGS. 16A and 16B illustrate an example of a method for manufacturing a thin film transistor according to an aspect of the present invention.

Then, the impurity semiconductor layer and the amorphous semiconductor layer are partially etched to separate a source region and a drain region from each other. By this step, the source and drain regions are formed (FIG. 16A).

At this time, dry etching using a gas including oxygen is conducted as the etching process. By the gas including oxygen, while the resist is being recessed, the source and drain regions and the amorphous semiconductor layer can be etched, so that the side face of the impurity semiconductor layer and the side face of the amorphous semiconductor layer can have a tapered shape. As the etching gas, for example, an etching gas in which oxygen is mixed into $CF_4$ or an etching gas in which oxygen is mixed into chlorine can be used. The side faces of the source and drain regions and the amorphous semiconductor layer have a tapered shape, and thereby electric field concentration can be prevented and leakage current can be reduced. As an example, the etching is conducted with a gas flow rate of $CF_4:O_2=45:55$ (sccm), a pressure in a chamber of 2.5 Pa, and a temperature of a sidewall in the chamber of about 70° C., and an RF (13.56 MHz) electric power of 500 W is applied to a coiled electrode to generate plasma and an RF (13.56 MHz) electric power of 200 W is applied to the substrate side, so that negative bias power is substantially applied and self-bias voltage is generated. By the dry etching using the gas including oxygen, the side face of the back channel portion can be processed into a tapered shape. The side face has a tapered shape as described above, and the taper angle is preferably 40° to 80° so that electric field concentration in a thin film transistor can be decreased and leakage current can be reduced.

Figure 16B:
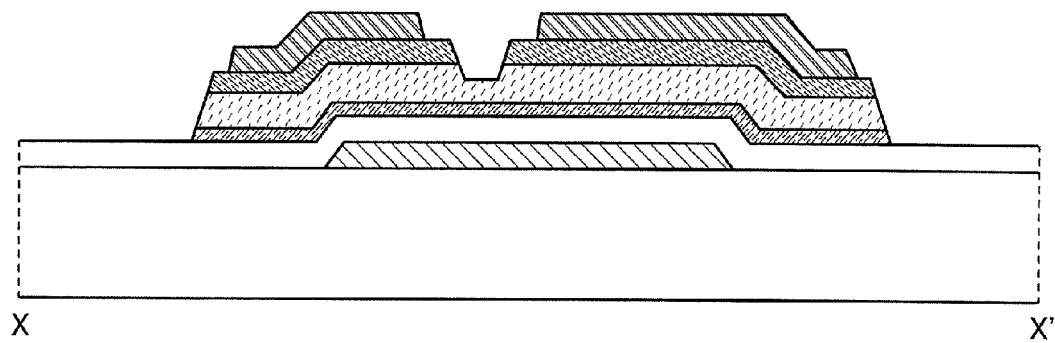

Next, the resist mask 401 is removed (FIG. 16B).

Similar to the methods in other embodiment modes, also in this method, residual product caused by the etching process, residue of the resist mask and substances that may be contamination sources in an apparatus, which has been used for removal of the resist mask are attached or deposited over the amorphous semiconductor layer between the source region and the drain region, and thus by conduction through the product, residue and substances, leakage current is increased in many elements, which leads to variation in electric characteristics between the elements over the same substrate in many cases. Therefore, for the sake of solving the above problem, dry etching is preferably conducted as in the above embodiment modes.

Although not illustrated, an insulating layer may be formed to cover the source and drain electrode layers, the impurity semiconductor layer, the amorphous semiconductor layer, the microcrystalline semiconductor layer and the gate insulating layer, similar to the above manufacturing methods. Further, an opening portion is formed in the insulating layer, and one of the source and drain electrodes is connected to a pixel electrode through the opening portion, whereby a pixel transistor is formed.

Figure 17:
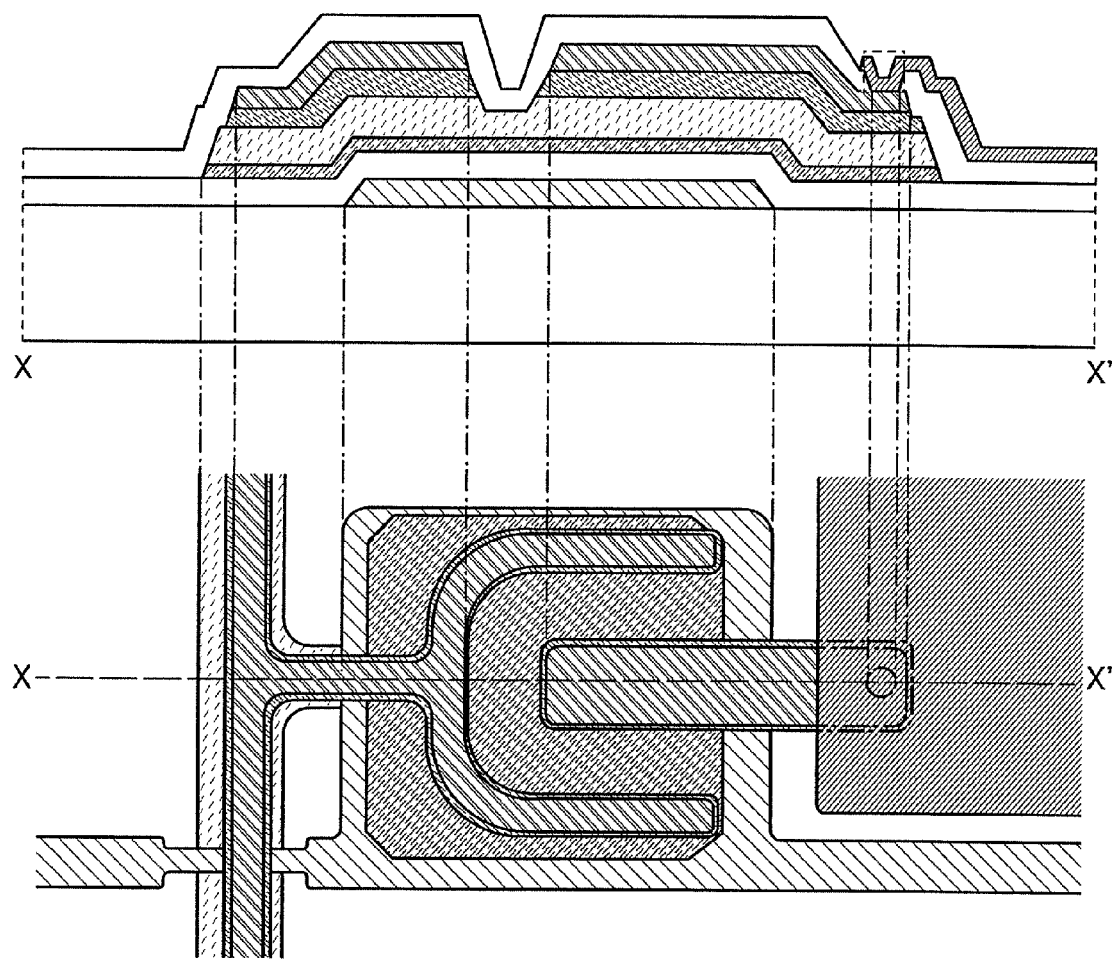
FIG. 17 illustrates an example of a structure of a thin film transistor according to an aspect of the present invention.

FIG. 17 illustrates a top view and a cross-sectional view of the pixel transistor, similar to FIG. 7. The pixel transistor illustrated in FIG. 17 is different from that illustrated in FIG. 7. All source and drain electrode layers are formed over the microcrystalline semiconductor layer, the amorphous semiconductor layer and the impurity semiconductor layer.

As described in this embodiment mode, in the manufacturing method using a multi-tone mask, as illustrated in FIG. 17, the source and drain electrode layers are all provided over the microcrystalline semiconductor layer, the amorphous semiconductor layer and the impurity semiconductor layer.

As described above, the present invention can also be applied to the case where a multi-tone mask is used. By use of the multitone mask, the number of steps can be reduced.

In addition, another method for manufacturing a thin film transistor using a multi-tone mask is described below.

When the multi-tone mask is used as described above, all layers of from a gate electrode to a pixel electrode can be formed using three photomasks. However, even without using the multi-tone mask, all layers of from the gate electrode to the pixel electrode can be formed using three photomasks.

Figure 18A:
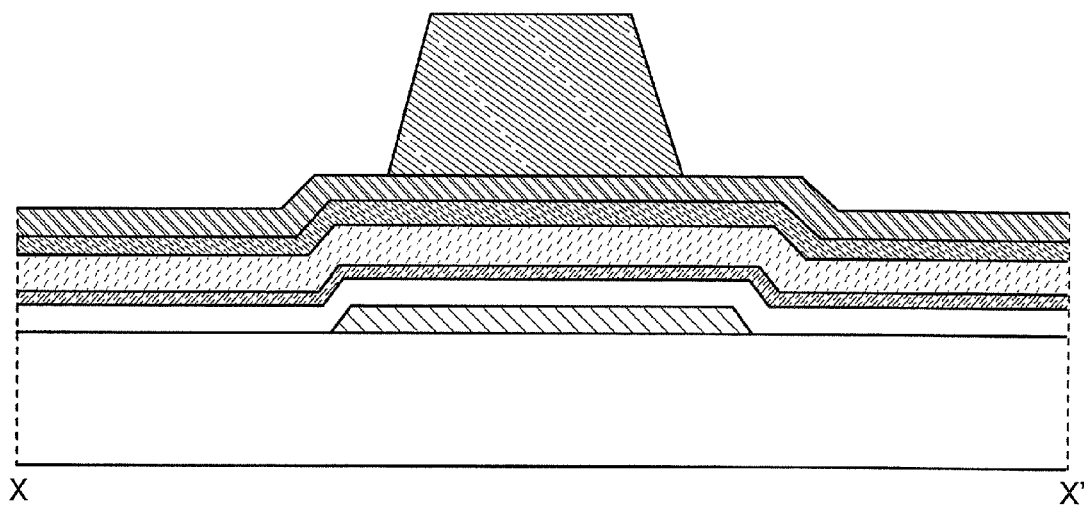
FIGS. 18A to 18C illustrate an example of a method for manufacturing a thin film transistor according to an aspect of the present invention.

First, similar to FIG. 15A, a stacked body in which layers up to and including a conductive layer have been stacked is formed. Then, a resist mask is formed over the stacked body (FIG. 18A).

Figure 18B:
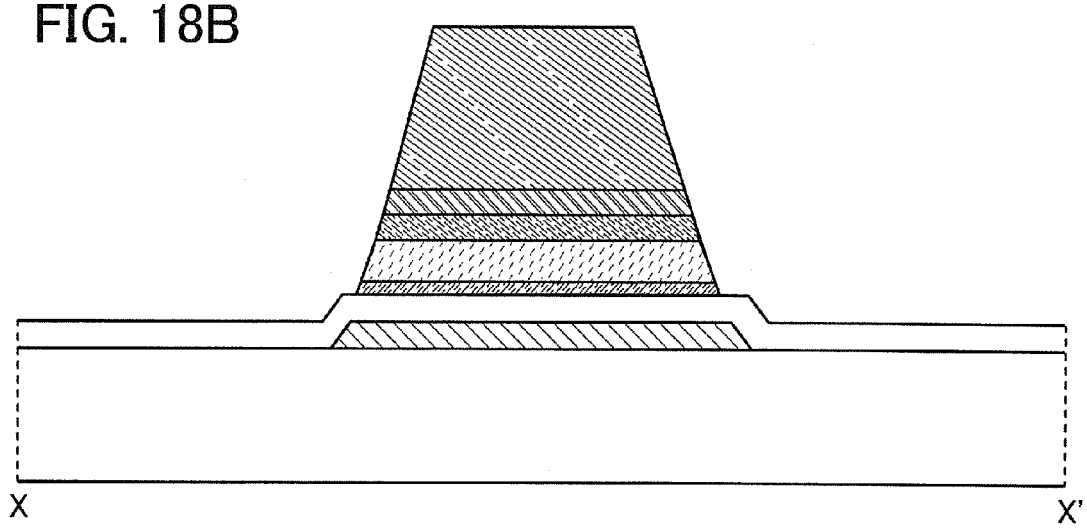

Next, a conductive layer, a microcrystalline semiconductor layer, an amorphous semiconductor layer and an impurity semiconductor layer are etched using the resist mask. By this etching, the stacked body is separated so as to correspond to each element, whereby an island-shaped stacked body can be formed. The etching may be dry etching or wet etching (FIG. 18B).

Figure 18C:
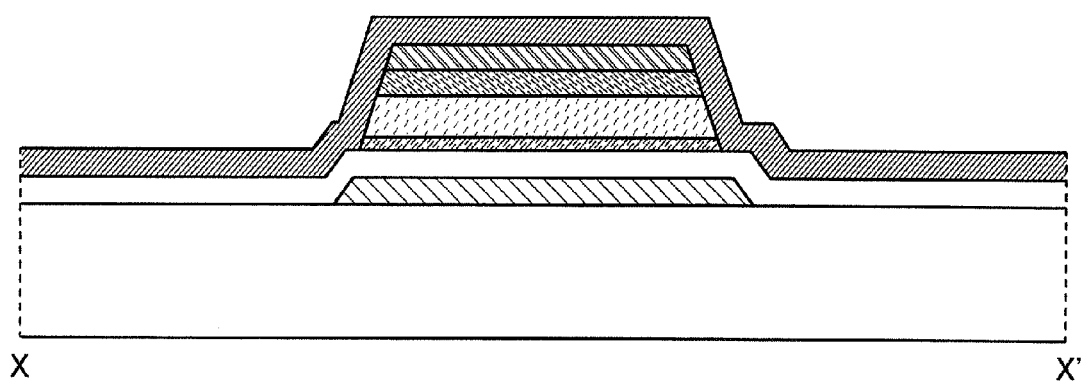

Then, a pixel electrode layer is formed (FIG. 18C), and a resist mask is formed over the pixel electrode layer (FIG.

Figure 19A:
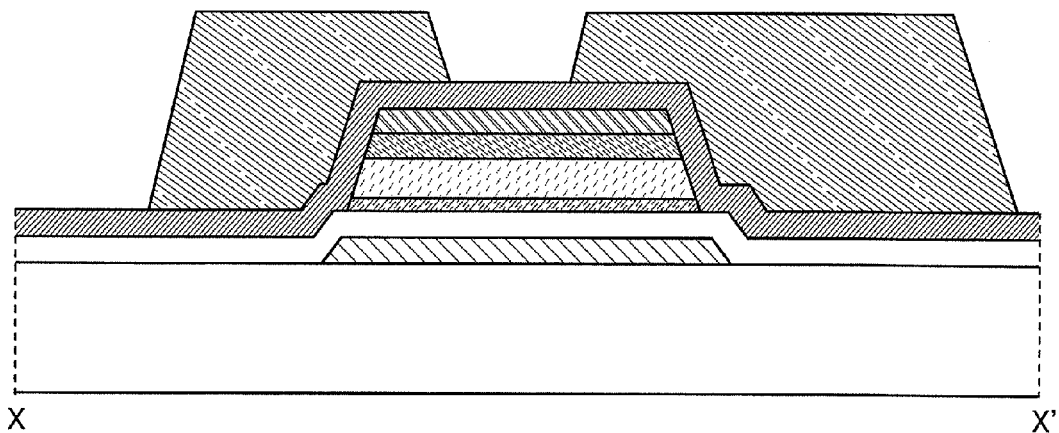
FIGS. 19A to 19C illustrate an example of a method for manufacturing a thin film transistor according to an aspect of the present invention.
Figure 19B:
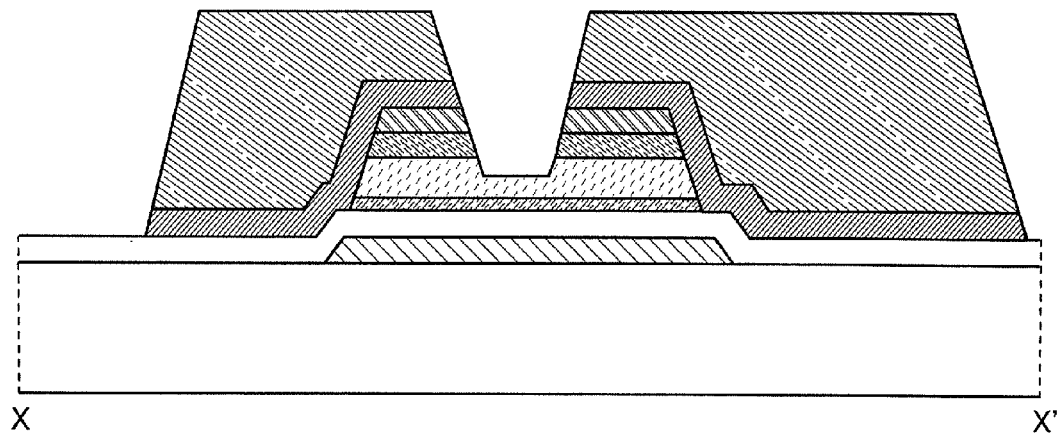
Figure 19C:
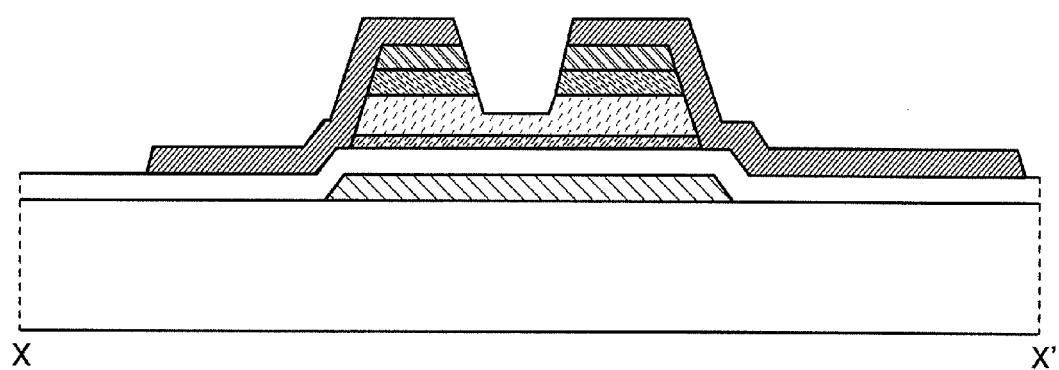

19A). In this case, the pixel electrode layer is formed using indium tin oxide (ITO) typically. By using this resist mask, etching is conducted for patterning the pixel electrode layer, and the impurity semiconductor layer and the amorphous semiconductor layer are partially etched so that the source region and the drain region are separated from each other (FIG. 19B). After that, the resist mask is removed (FIG. 19C).

Similar to methods in other embodiment modes, also in this method, residual product caused by the etching process, residue of the resist mask and substances that may be contamination sources in an apparatus, which has been used for removal of the resist mask are attached or deposited over the amorphous semiconductor layer between the source region and the drain region, and thus by conduction through the product, residue and substances, leakage current is increased in many elements, which leads to variation between the elements over the same substrate in many cases. Therefore, for the sake of solving the above problem, dry etching is preferably conducted as in the above embodiment modes.

As described above, a thin film transistor having an extremely small current of leakage current and a highly withstand-voltage property can be manufactured. The thin film transistor manufactured as described above can have excellent electric characteristics. Even when such thin film transistors are formed over a large-size substrate, variation in electric characteristics between elements formed over the same substrate can be reduced.

Embodiment Mode 5

In Embodiment Mode 5, a structure and a manufacturing method which are the same as those of the thin film transistor described in Embodiment Mode 2 to 4 but in which a mode of a microcrystalline semiconductor layer is different from that of the thin film transistor described in Embodiment Modes 2 to 4 are described. Specifically, a mode in which an impurity element imparting one conductivity type is included in the microcrystalline semiconductor layer is described.

The thin film transistor in Embodiment Mode 5 includes a gate insulating layer formed over a gate electrode, a microcrystalline semiconductor layer including an impurity element serving as a donor over the gate insulating layer, and an amorphous semiconductor layer over the microcrystalline semiconductor layer. By inclusion of the impurity element serving as a donor in the microcrystalline semiconductor layer, a microcrystalline semiconductor layer having high conductivity can be obtained. The concentration of the impurity element serving as a donor included in the microcrystalline semiconductor layer is high on the gate insulating layer side, is reduced toward the amorphous semiconductor layer, and is preferably set below a detection limit of secondary ion mass spectrometry (SIMS) in the amorphous semiconductor layer. This is done so that conductivity around or at the interface (a channel formation region and the vicinity thereof) with the gate insulating layer is increased to increase the amount of on current and reduce the amount of off current.

The thin film transistor in this embodiment mode can be formed by allowing the gate insulating layer formed over the gate electrode to include an impurity element serving as a donor. Alternatively, the thin film transistor may be formed by adsorbing an impurity element serving as a donor on the gate insulating layer. Alternatively the thin film transistor may be formed by allowing a source gas of the microcrystalline semiconductor layer to include an impurity element serving as a donor. Still alternatively, an impurity element serving as a donor may be included in a reaction chamber for forming the microcrystalline semiconductor layer. Such a method for manufacturing a thin film transistor will now be described as an example.

Note that only a part of a manufacturing process different from that of the above-described embodiment modes is described, and thus only steps from formation of a gate insulating layer to formation of a microcrystalline semiconductor layer are described. In this case, a second gate insulating layer is formed over a first gate insulating layer, a first microcrystalline semiconductor layer is formed over the second gate insulating layer, and a second microcrystalline semiconductor layer is formed over the first microcrystalline semiconductor layer. The first microcrystalline semiconductor layer includes phosphorus as an impurity element serving as a donor.

Figure 20:
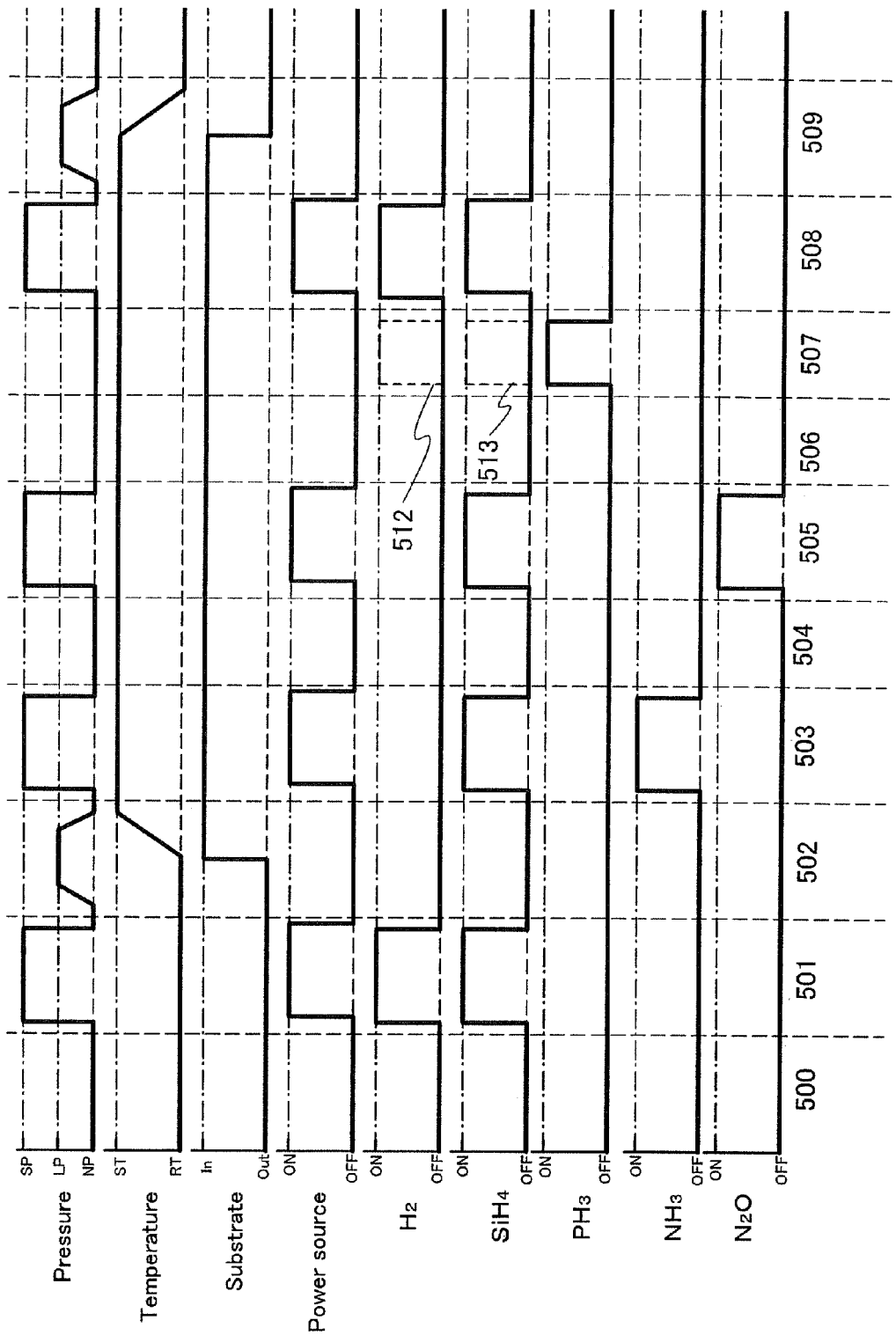
FIG. 20 illustrates an example of a film-formation process according to an aspect of the present invention.

FIG. 20 is a typical example of a timing chart for describing steps of forming the first gate insulating layer, the second gate insulating layer, the first microcrystalline semiconductor layer including the impurity element serving as a donor, and the second microcrystalline semiconductor layer not including the impurity element serving as a donor. FIG. 20 illustrates a procedure starting from a step of vacuum evacuation (vacuum evacuation 500) from atmospheric pressure in a reaction chamber of a plasma CVD apparatus. Then, the following treatments, which are carried out after the vacuum evacuation, are illustrated in chronological order: a precoating treatment 501, substrate carrying-in 502, a first film formation treatment 503 for forming the first gate insulating layer, a vacuum evacuation treatment 504, a second film formation treatment 505 for forming the second gate insulating layer, a vacuum evacuation treatment 506, a flush treatment 507, a third film formation treatment 508 for forming the microcrystalline semiconductor layer including the impurity element which serves as a donor, and substrate carrying-out 509. These steps are described with reference to FIG. 20.

First, vacuum evacuation in a reaction chamber is performed to the predetermined degree of vacuum. In the case of high vacuum evacuation, vacuum evacuation is performed by using a turbo molecular pump or the like to obtain a pressure lower than $10^{-1}$ Pa as a degree of vacuum. Further, a cryopump may be used together to reduce the pressure of the reaction chamber to a pressure lower than $10^{-5}$ Pa. In addition, preferably, a heat treatment is performed to the reaction chamber so as to degas the inner wall of the reaction chamber. In addition, a heater for heating the substrate is also operated to stabilize temperature. The substrate heating temperature is 100° C. to 300° C., preferably 120° C. to 220° C.

In the precoating treatment 501, the inner wall of the reaction chamber of the plasma CVD apparatus is precoated with a film having a composition that is the same as or similar to the gate insulating layer. Accordingly, it is possible to prevent a metal constituting the reaction chamber from entering the gate insulating layer as an impurity. In other words, by covering the inner wall of the reaction chamber with the film having a composition that is the same as or similar to the gate insulating layer, the inner wall of the reaction chamber can be prevented from being etched by plasma, and an impurity element, which constitutes the reaction chamber, can be prevented from being mixed into the gate insulating layer.

In the step of substrate carrying-in 502, a substrate is carried from a load lock chamber which is connected to a reaction chamber. Pressure in the reaction chamber at this time is equal to that in the load lock chamber.

In the first film formation treatment 503 for forming the first gate insulating layer, a source gas, here, hydrogen, silane, and ammonia are mixed, and a silicon nitride layer is formed by glow discharge plasma. Note that nitrogen may be introduced to the reaction chamber in addition to the above source gas. After formation of the first gate insulating layer, introduction of the above source gas is stopped, and the power is turned off.

In the vacuum evacuation treatment 504, vacuum evacuation of the reaction chamber is performed to a predetermined degree of vacuum.

In the second film formation treatment 505 for forming the first gate insulating layer, a source gas (here, a mixed gas of hydrogen, silane, and dinitrogen monoxide) is introduced, and a silicon oxynitride layer is formed by glow discharge plasma. After formation of the second gate insulating layer, introduction of the above source gas is stopped, and the power is turned off.

Then, vacuum evacuation of the reaction chamber is performed to a predetermined degree of vacuum (the vacuum evacuation treatment 506).

In the flush treatment 507, a gas including an impurity element which serves as a donor is introduced to the reaction chamber, and the impurity element which serves as a donor is adsorbed onto the surface of the second gate insulating layer, furthermore, onto the inner wall of the reaction chamber. In this mode, 0.001 to 1% phosphine (diluted with hydrogen or silane) is introduced to the reaction chamber. In addition to the gas including the impurity element which serves as a donor, a deposition gas including silicon or germanium may be introduced as denoted by a dashed line 512 or hydrogen may be introduced as denoted by a dashed line 513, to the reaction chamber. By introducing the deposition gas including silicon or germanium to the reaction chamber, impurities such as oxygen, nitrogen, and/or fluorine in the reaction chamber can be evacuated from the reaction chamber easily, so that these impurities can be prevented from being mixed into a formed film.

In the third film formation treatment 508 for forming the microcrystalline semiconductor layer including the impurity element which serves as a donor, a deposition gas including silicon or germanium (here, a mixed gas of silane and hydrogen and/or a rare gas) is introduced and mixed in the reaction chamber, and a microcrystalline semiconductor layer is formed by glow discharge plasma. Silane is diluted with hydrogen and/or a rare gas to be 10 to 2000 times thinner. The substrate heating temperature is 100° C. to 300° C., preferably 120° C. to 220° C. This is because a growing surface of the microcrystalline silicon layer is terminated with hydrogen and growth of microcrystalline silicon can be promoted, by conducting film formation at 120° C. to 220° C. At this time, microcrystalline semiconductor is grown by utilizing the impurity element (in this case, phosphorus) serving as a donor adsorbed on the surface of the second gate insulating layer, as a crystal nucleus. Therefore, an amorphous semiconductor layer is not formed in an early stage of deposition of the semiconductor layer, crystals grow in a normal direction with respect to the surface of the second gate insulating layer, and a microcrystalline semiconductor layer in which columnar-like microcrystalline semiconductors are arranged can be formed. In addition, the impurity element which serves as a donor and is adsorbed onto the surface of the second gate insulating layer is included in the microcrystalline semiconductor layer, so that a highly conductive microcrystalline semiconductor layer can be formed.

As a deposition gas including silicon or germanium, $SiH_4$, $Si_2H_6$, $SiH_2Cl_2$, $SiHCl_3$, $SiCl_4$, $SiF_4$, $GeH_4$, $Ge_2H_6$, $GeH_2Cl_2$, $GeHCl_3$, $GeCl_4$, $GeF_4$, or the like can be used as appropriate. Further, an energy band width may be adjusted to be from 0.9 to 1.1 eV by mixing germanium hydride or germanium fluoride such as $GeH_4$ or $GeF_4$ into a gas of silane or the like. When germanium is added to silicon, temperature characteristics of a thin film transistor can be changed.

The substrate is transferred from the reaction chamber to the load lock chamber (substrate carrying-out 509). Pressure in the reaction chamber at this time is equal to that in the load lock chamber.

The third film formation treatment 508 for forming the microcrystalline semiconductor layer including the impurity element which serves as a donor is carried out after the flush treatment 507 here. However, instead of these treatments, the microcrystalline semiconductor layer including the impurity element which serves as a donor can be formed without the flush treatment 507 as follows: a deposition gas including silicon or germanium, hydrogen, and/or a rare gas, and a gas including an impurity element which serves as a donor are mixed, and the microcrystalline semiconductor layer including the impurity element which serves as a donor is formed by generating glow discharge plasma.

In a conventional method for forming a microcrystalline semiconductor layer, an amorphous semiconductor layer is formed in an early stage of deposition due to an impurity element, lattice mismatch, and the like. In an inverted staggered thin film transistor, carriers flow in a semiconductor layer around a gate insulating layer. Thus, when an amorphous semiconductor layer is formed at the interface between the gate insulating layer and the semiconductor layer, the mobility is decreased, and further, the amount of current is reduced, so that electric characteristics of the thin film transistor are lowered.

However, if the impurity element which serves as a donor is present in the reaction chamber in formation of the microcrystalline semiconductor layer by a plasma CVD method, silicon and the impurity element which serves as a donor are likely to react with each other in plasma to form crystal nuclei. When crystal nuclei are deposited over the gate insulating layer, crystals grow from the crystal nuclei, so that formation of an amorphous semiconductor layer at the interface between the gate insulating layer and the microcrystalline semiconductor layer can be reduced. In addition, a microcrystalline semiconductor layer is deposited while taking in the impurity element which serves a donor and remains in the reaction chamber, whereby crystallization can be promoted.

Further, in the case that the microcrystalline semiconductor layer is formed by a plasma CVD method, an amorphous semiconductor layer which is formed in formation of the microcrystalline semiconductor layer can be selectively etched by using, as a part of a source gas, a gas which can easily etch the amorphous semiconductor layer selectively, typically fluoride of hydrogen, silicon, or germanium, or fluorine, and the crystallization rate can be enhanced more. As a gas having an etching effect, such as fluoride of hydrogen, silicon, or germanium, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, or the like can be given.

As a result, by forming the microcrystalline semiconductor layer including the impurity element which serves as a donor over the gate insulating layer as in this embodiment mode, conductivity of the microcrystalline semiconductor layer around or at the interface with the gate insulating layer can be improved.

Next, a second microcrystalline semiconductor layer is formed over the first microcrystalline semiconductor layer. The first microcrystalline semiconductor layer includes an impurity element serving as a donor whereas the second microcrystalline semiconductor layer does not include an impurity element serving as a donor. In the reaction chamber, with a deposition gas including silicon or germanium (here, a mixed gas including silane and hydrogen and/or a noble gas), a glow discharge plasma is generated to form a microcrystalline semiconductor layer. Silane is diluted with hydrogen and/or a rare gas to be 10 to 2000 times thinner. The substrate heating temperature is 100° C. to 300° C., preferably 120° C. to 220° C. This is because a growing surface of the microcrystalline silicon layer is terminated with hydrogen and growth of microcrystalline silicon can be promoted, by conducting film formation at 120° C. to 220° C. By forming the second microcrystalline semiconductor layer in a reaction chamber different from that for forming the first microcrystalline semiconductor layer including the impurity element which serves as a donor, the second microcrystalline semiconductor layer not including the impurity element which serves as a donor can be formed. Also by forming the second microcrystalline semiconductor layer successively without conducting the substrate carrying-out 509, the second microcrystalline semiconductor layer not including the impurity element which serves as a donor can be formed; in this case, in the flush treatment 507, it is preferable to reduce the concentration of the impurity element which serves as a donor and is adsorbed onto the second gate insulating layer and the inner wall of the reaction chamber.

As described above, the microcrystalline semiconductor layer can include the impurity element serving as a donor. Note that the method by which the microcrystalline semiconductor layer can include the impurity element serving as a donor is not limited to this example, and the microcrystalline semiconductor layer can include the impurity element by forming the gate insulating layer so as to include the impurity element. A process for forming a silicon oxynitride layer including phosphorus is described with reference to FIG. 21. Note that in this case, a second gate insulating layer is formed over a first gate insulating layer, and a first microcrystalline semiconductor layer is formed over the second gate insulating layer. The second gate insulating layer includes phosphorus as an impurity element serving as a donor.

Figure 21:
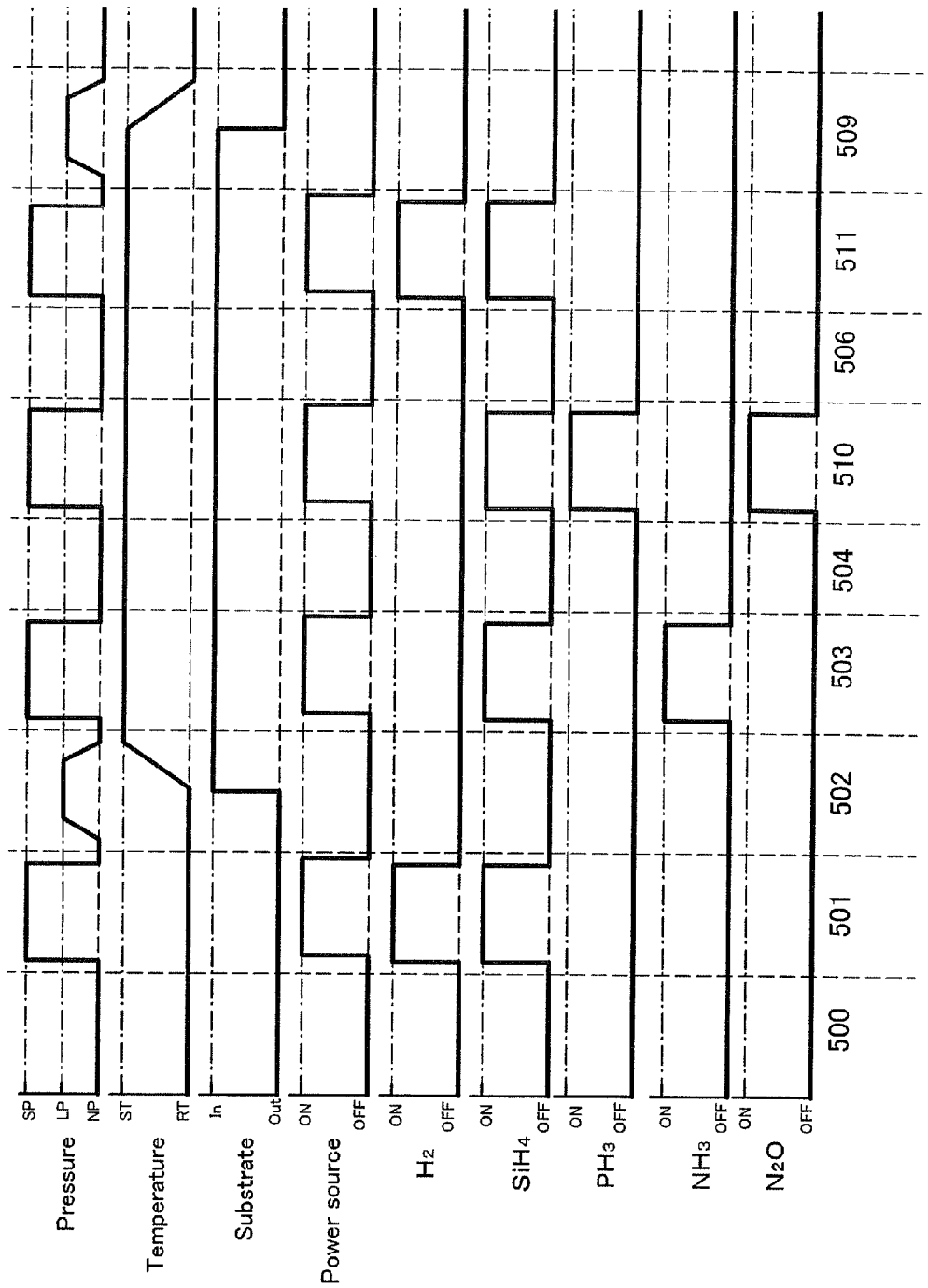
FIG. 21 illustrates an example of a film-formation process according to an aspect of the present invention.

FIG. 21 is a typical example of a timing chart for describing steps of forming the first gate insulating layer, the second gate insulating layer including an impurity element serving as a donor, and the first microcrystalline semiconductor layer including the impurity element serving as a donor. FIG. 21 illustrates a procedure starting from a step of vacuum evacuation (vacuum evacuation 500) from atmospheric pressure in a reaction chamber of a plasma CVD apparatus. Then, the following treatments, which are carried out after the vacuum evacuation, are illustrated in chronological order: a precoating treatment 501, substrate carrying-in 502, a first film formation treatment 503 for forming the first gate insulating layer, a vacuum evacuation treatment 504, a second film formation treatment 510 for forming the second gate insulating layer including the impurity element serving as a donor, a vacuum evacuation treatment 506, a third film formation treatment 511 for forming the first microcrystalline semiconductor layer including the impurity element which serves as a donor, and substrate carrying-out 509. These steps are described with reference to FIG. 21.

Note that the precoating treatment 501, the substrate carrying-in 502, the first film formation treatment 503 for forming the first gate insulating layer, the vacuum evacuation treatment 504, the vacuum evacuation treatment 506, and the substrate carrying-out 509 are the same as those in FIG. 20, and the second film formation treatment 510 for forming the second gate insulating layer including the impurity element which serves as a donor, the vacuum evacuation treatment 506, and the third film formation treatment 511 for forming the first microcrystalline semiconductor layer including the impurity element which serves as a donor are carried out between the vacuum evacuation treatment 504 and the substrate carrying-out 509.

In the second film formation treatment 510 for forming the second gate insulating layer including the impurity element which serves as a donor, a mixed gas including the impurity element which serves as a donor and a source gas for forming the gate insulating layer is introduced to a reaction chamber. In this embodiment mode, silane, dinitrogen monoxide, and 0.001% to 1% phosphine (diluted with hydrogen or silane) are introduced to the reaction chamber, and a silicon oxynitride layer including phosphorus is formed by glow discharge plasma. After formation of the second gate insulating layer including the impurity element serving as a donor, introduction of the above source gas is stopped, the power is turned off.

In the third film formation treatment 511 for forming the first microcrystalline semiconductor layer, a deposition gas including silicon or germanium (here, a mixed gas of silane and hydrogen, and/or a rare gas) is introduced to the reaction chamber, and a microcrystalline silicon layer is formed by generating glow discharge plasma. Silane is diluted with hydrogen and/or a rare gas to be 10 to 2000 times thinner. The substrate heating temperature is 100° C. to 300° C., preferably 120° C. to 220° C. The introduction of the source gas is stopped after the second microcrystalline semiconductor layer is formed, and the power is turned off.

After the second gate insulating layer including the impurity element serving as a donor is formed, the first microcrystalline semiconductor layer can be formed with the impurity element serving as a donor remaining in the reaction chamber under the above conditions, so that the first microcrystalline semiconductor layer can include the impurity element serving as a donor. Further, by use of a gas having an etching effect such as a fluoride of hydrogen, silicon, germanium, or the like, or fluorine as a part of a source gas, amorphous semiconductor which is formed between crystal grains or the like, in formation of the microcrystalline semiconductor layer can be selectively etched, and the crystallization rate can be enhanced, whereby conductivity around or at the interface with the gate insulating layer can be improved.

In the above manner, by forming the accumulation-type thin film transistor in which the microcrystalline semiconductor layer and/or the gate insulating layer include(s) the impurity element which servers as a donor, conductivity of the microcrystalline semiconductor layer can be increased around or at the interface between the second gate insulating layer and the microcrystalline semiconductor layer, and thus resistance of the channel formation region can be reduced; thus, a thin film transistor with high field effect mobility and a large amount of on current can be manufactured.

Further, forming a channel formation region with a microcrystalline semiconductor layer suppresses variation in threshold voltage, improves field effect mobility, and lowers subthreshold swing (S value); thus, a thin film transistor can achieve high performance. Accordingly, a driving frequency of a display device can be increased, whereby the panel size can be increased and high density of pixels can be achieved. Furthermore, the thin film transistors as described above can be manufactured over a large-area substrate. As in the other embodiment modes, a thin film transistor with a very small amount of leakage current and high withstand-voltage can be manufactured.

Embodiment Mode 6

In Embodiment Mode 6, a structure and a manufacturing method which are the same as those of the thin film transistor described in Embodiment Mode 2 to 4 but in which a mode of a microcrystalline semiconductor layer is different from that of the thin film transistor described in Embodiment Modes 2 to 4 are described. Specifically, a mode in which an amorphous semiconductor layer included in a microcrystalline semiconductor layer is removed by devising the formation method of the microcrystalline semiconductor layer, whereby crystallinity is increased is described.

In a thin film transistor of this embodiment mode, a gate insulating layer is formed, and then, crystal nuclei are formed over the gate insulating layer by using fluorine, hydrogen or fluoride of silicon, germanium or the like, and a deposition gas including silicon or germanium, and crystal nuclei are grown using the deposition gas including silicon or germanium, whereby a microcrystalline semiconductor layer is formed. The microcrystalline semiconductor layer can have improved conductivity around or at the interface with the gate insulating layer. The thin film transistor of this embodiment mode has a feature of having a channel formation region which is formed using a highly conductive microcrystalline semiconductor layer formed in this manner.

As a fluoride of hydrogen, silicon, germanium, or the like, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, or the like can be used. In addition, as a deposition gas including silicon or germanium, $SiH_4$, $Si_2H_2$, $GeH_4$, $Ge_2H_6$, or the like can be used.

Figure 23:
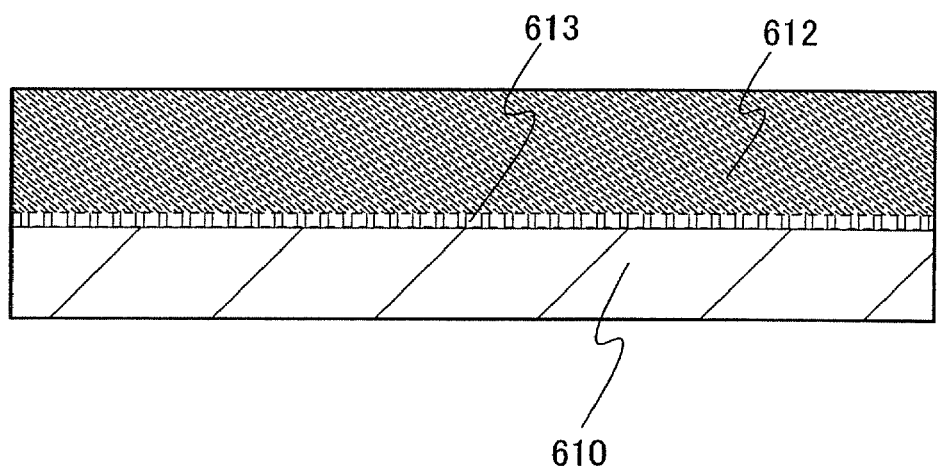
FIG. 23 illustrates an example of a method for manufacturing a conventional thin film transistor.
Figure 24:
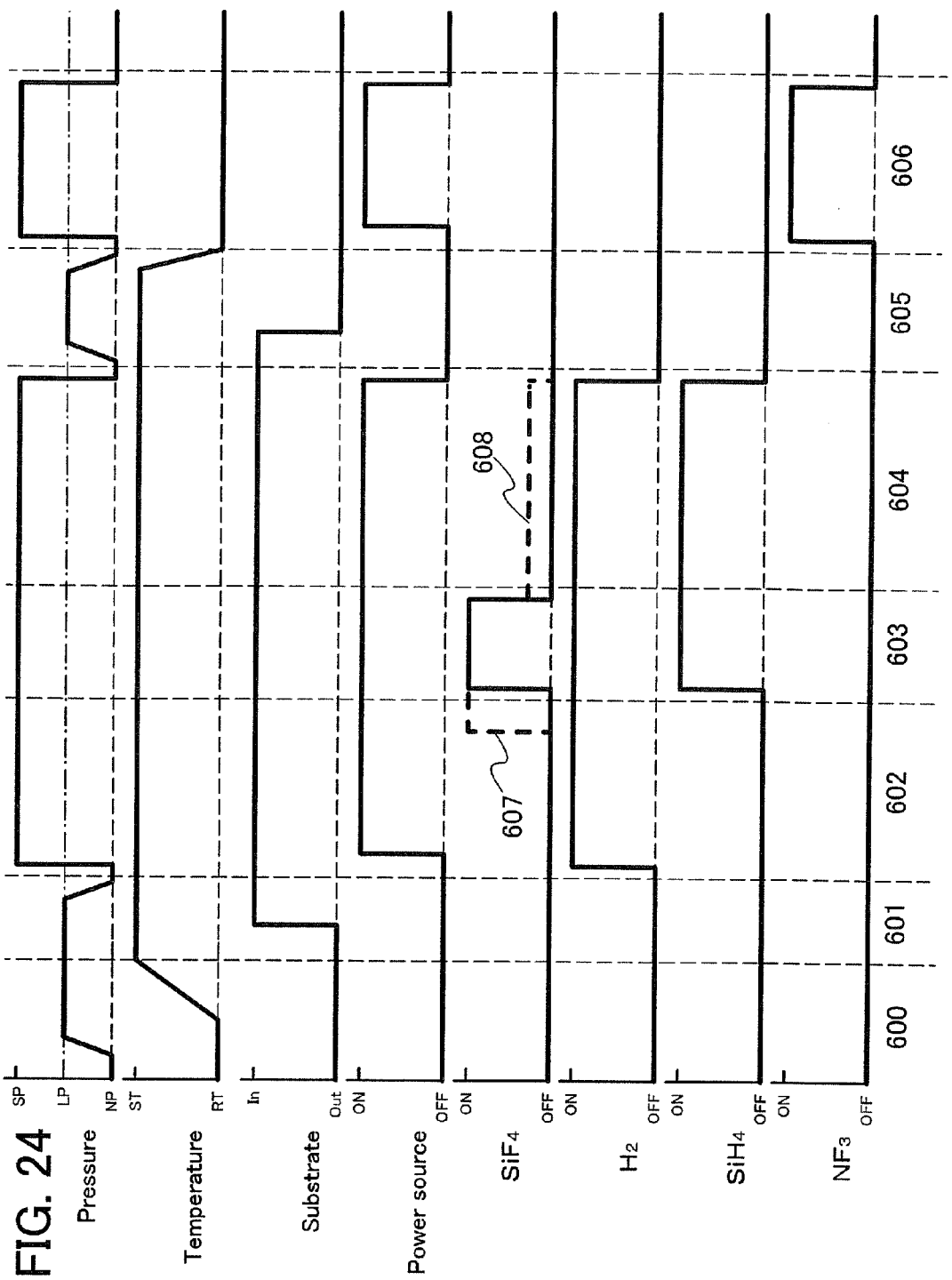
FIG. 24 illustrates an example of a film-formation process according to an aspect of the present invention.

Here, a process for forming a microcrystalline semiconductor layer is described in chronological order with reference to FIG. 24. Further, a process for forming the crystal nuclei and a film formation process will be described with reference to FIGS. 22A and 22B and FIG. 23 which are enlarged cross-sectional views of the interface between the gate insulating layer and the microcrystalline semiconductor layer.

FIG. 24 is a timing chart illustrating a process for forming a microcrystalline semiconductor layer, as a typical example. In FIG. 24, the following steps are illustrated in chronological order: a reaction chamber is evacuated from atmospheric pressure (vacuum evacuation 600) first, and after the vacuum evacuation 600, substrate carrying-in 601, a pre-base treatment 602, a formation treatment of crystal nuclei 603, a film formation treatment 604, substrate carrying-out 605 and cleaning 606.

First, the reaction chamber is evacuated to a predetermined degree of vacuum (vacuum evacuation 600). When the reaction chamber is evacuated to a pressure lower than $10^{-1}$ Pa, a turbo molecular pump or the like is used. In addition, the reaction chamber is preferably subjected to heat treatment to perform degassing treatment of the inner wall. Further, a temperature of the reaction chamber is stabilized by operating the heater for heating the substrate. The substrate is heated at from 100° C. to 300° C. preferably, from 120° C. to 220° C.

Next, a substrate is carried into the reaction chamber from a load lock chamber which is connected to the reaction chamber (substrate carrying-in 601). Pressure in the reaction chamber at this time is substantially equal to that in the load lock chamber, because a space between the reaction chamber and the load lock chamber is released.

Then, plasma treatment is preferably performed by introducing hydrogen or a mixed gas of hydrogen and a rare gas such as argon in order to remove a matter adsorbed to the inner wall of the reaction chamber (pre-base treatment 602). In this case, the adsorbed matter on the inside wall of the reaction chamber is atmosphere components such as oxygen and nitrogen, an element included in a gas used for cleaning the reaction chamber, or the like. A rare gas element having a large mass number, such as argon, krypton, or xenon, is preferably used for rare gas plasma treatment, because oxygen, moisture, an organic substance, a metal element, and the like, which are attached to a surface, are removed by the effect of sputtering. Hydrogen plasma treatment is effective for removing the impurity adsorbed to the surface and for forming a clean surface by etching an insulating layer or an amorphous semiconductor layer by a hydrogen radical. Note that since a gas is introduced into the reaction chamber, pressure of the reaction chamber at this time is preset pressure.

Note that in the pre-base treatment 602, a fluorosilane gas may be introduced to the reaction chamber to remove an impurity and clean the surface of the substrate in a similar manner to plasma treatment using hydrogen or rare gas. This is illustrated by a dashed line 607.

Figure 22A:
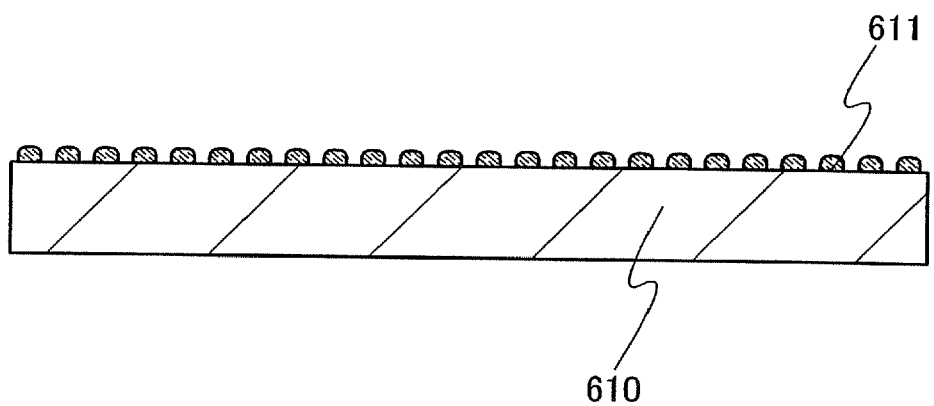
FIGS. 22A and 22B illustrate an example of a method for manufacturing a thin film transistor according to an aspect of the present invention.

Next, crystal nuclei are formed. A mixed gas of fluorine or a fluoride of hydrogen, silicon, germanium, or the like (e.g., fluorosilane), hydrogen; and a deposition gas including silicon or germanium (e.g., silane) is introduced into the reaction chamber, so that the crystal nuclei are formed by glow discharge plasma (formation treatment of crystal nuclei 603). By glow discharge plasma, fluorine radicals are generated from fluorosilane. Such fluorine radicals can etch selectively an amorphous semiconductor, which is more easily etched than microcrystalline semiconductor is. Therefore, crystal nuclei of microcrystalline semiconductor are easily formed selectively. As a result, as illustrated in FIG. 22A, crystal nuclei 611 can be deposited on the gate insulating layer 610. Alternatively, silane chloride can be used instead of fluorine or fluoride of hydrogen, silicon, germanium, or the like.

Figure 22B:
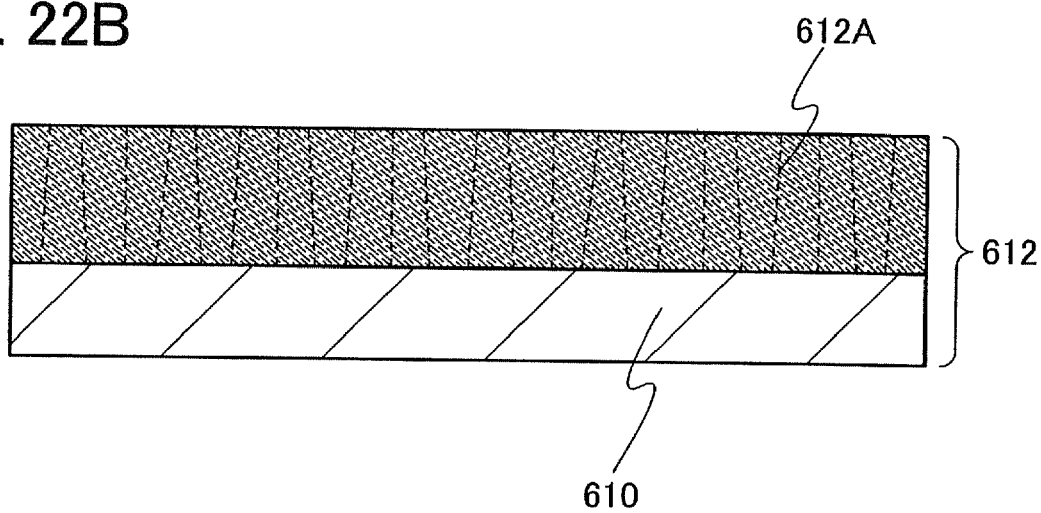

Next, a microcrystalline silicon layer is formed (film-formation treatment 604). The microcrystalline silicon layer is deposited by glow discharge plasma using a mixed gas of a silane gas and a dilution gas (hydrogen and/or a rare gas). A silane gas is diluted with the dilution gas to be 10 to 2000 times thinner. A temperature for heating the substrate is from 100 to 300° C., preferably from 120 to 220° C. By setting the temperature for heating the substrate to be at a temperature of 120 to 220° C., a growing surface of the microcrystalline silicon layer can be inactivated with hydrogen, and growth of microcrystalline silicon can be promoted. In the film formation treatment 604, a SiH radical, a $SiH_2$ radical, and a $SiH_3$ radical which are active species are combined with the crystal nuclei 611, so that crystals grow. As a result, the microcrystalline semiconductor layer 612 can be formed. At this time, since longitudinal growth of the microcrystalline semiconductor occurs using the crystal nuclei 611 as nuclei, crystal growth is generated in the normal direction with respect to the surface of the gate insulating layer 610, so that as illustrated in FIG. 22B, the microcrystalline semiconductor layer 612 in which columnar microcrystals 612A are aligned can be formed. That is, the microcrystalline semiconductor layer can be formed over the gate insulating layer without forming an amorphous layer at an interface between the gate insulating film and the microcrystalline semiconductor layer. Further, the crystal nuclei are formed using fluorosilane only in the formation treatment of crystal nuclei 603 and fluorosilane is not used in the film formation treatment 604, whereby the concentration of fluorine contained in the microcrystalline semiconductor layer can be reduced. Furthermore, since the microcrystalline semiconductor layer is formed using silane without fluorosilane, generation of stress of the film can be suppressed as compared to a case of forming the microcrystalline semiconductor layer using fluorosilane, so that film peeling can be prevented.

Electric power in the film formation treatment 604 in which the microcrystalline semiconductor layer is formed is made to be lower than that in the formation treatment of crystal nuclei 603, whereby ion bombardment to the crystal nuclei can be reduced and crystal growth can be generated without destroying the crystal nuclei.

Note that in the film formation treatment 604, fluorosilane is introduced into the reaction chamber at flow rate which is smaller than that in the formation treatment of crystal nuclei 603, whereby amorphous semiconductor in the microcrystalline semiconductor layer can be etched by fluorine radicals, so that the proportion of microcrystalline components in the microcrystalline semiconductor layer 612 can be increased. This is denoted by a dashed line 608.

Further, germanium hydride such as $GeH_4$ or germanium fluoride such as $GeF_4$ may be mixed into a gas such as silane to adjust the energy band to be from 0.9 eV to 1.1 eV. When germanium is added to silicon, temperature characteristics of a thin film transistor can be changed.

In a conventional method for forming a microcrystalline semiconductor layer, as illustrated in FIG. 23, an amorphous layer 613 is formed in the initial stage of deposition due to a factor such as an impurity element or lattice mismatch in many cases. Since carriers flow in the microcrystalline semiconductor layer in the vicinity with the gate insulating film in a thin film transistor, formation of the amorphous layer 613 around or at the interface with the gate insulating layer leads to decrease in carrier mobility and a small amount of current, and thus the electric characteristics of the thin film transistor are impaired.

However, as described in this embodiment mode, by the formation treatment of crystal nuclei 603 and the film formation treatment 604, longitudinal growth (in the normal direction with respect to the surface of the gate insulating layer) of crystals occurs using the crystal nuclei 611 as nuclei; therefore, the crystallinity in the thickness direction of the microcrystalline semiconductor layer can be increased.

In this embodiment mode, plasma is generated by applying high-frequency power with a frequency of from 1 to 20 MHz, (typically 13.56 MHz); or high-frequency power with a frequency in the VHF band of 20 to 120 MHz approximately.

Note that a reaction chamber of a plasma CVD apparatus is pre-coated with a semiconductor film before the substrate carrying-in 601, whereby the microcrystalline semiconductor layer can be prevented from containing impurities (metal constituting the reaction chamber). In other words, the reaction chamber is covered by a semiconductor film (e.g., silicon), so that the reaction chamber can be prevented from being etched by plasma and the concentration of impurities in the microcrystalline semiconductor layer can be reduced.

In the stage of film formation treatment 604, helium may be added to a reactive gas in addition to silane and hydrogen. Helium has ionization energy which is as high as 24.5 eV, but has a metastable state in a level of about 20 eV which is a little lower than the level of the ionization energy. Thus, only about 4 eV is needed for ionization while discharge is maintained. Therefore, a discharge starting voltage of helium is low. By such characteristics, helium can hold plasma stably. In addition, uniform plasma can be formed so that plasma density is equalized and a microcrystalline semiconductor layer can be formed uniformly even when the area of the substrate on which the microcrystalline semiconductor layer is deposited is large.

After the microcrystalline semiconductor layer is formed as described above, supply of a reaction gas of silane, hydrogen or the like is stopped and supply of high frequency power is stopped, then the substrate is transferred to the load lock chamber from the reaction chamber (substrate carrying-out 605). When film formation treatment is performed on another substrate immediately after that, the same treatment is performed from the stage of the substrate carrying-in 601.

After the substrate is transferred, a film or powder attached to the reaction chamber is preferably removed (cleaning 606). The cleaning of the reaction chamber is conducted by generation of plasma by introducing an etching gas typified by $NF_3$ or $SF_6$. Alternatively, a gas which can etch without using plasma, such as $ClF_3$, is introduced to perform the cleaning 606. Note that the cleaning of the reaction chamber is preferably conducted when the temperature is decreased by turning off the heater for heating the substrate. This is because generation of a reaction by-product by the etching can be suppressed by reducing the temperature of the reaction chamber.

The microcrystalline semiconductor layer 612 is formed to a thickness of 1 nm to 200 mm, preferably 1 nm to 100 nm, more preferably 1 nm to 50 nm. The microcrystalline semiconductor layer 612 serves as a channel formation region of a thin film transistor which is to be formed later. Further, the microcrystalline semiconductor layer 612 may be etched to reduce the thickness thereof. By reducing the thickness of the microcrystalline semiconductor layer 612 to from 1 nm to 50 nm, a thin film transistor of a complete depletion type can be manufactured.

A microcrystalline semiconductor layer tends to exhibit a weak n-type conductivity when any impurity element for controlling valence electrons is not added thereto intentionally. Therefore, the threshold value of a thin film transistor can be controlled by adding an impurity element imparting p-type conductivity to a microcrystalline semiconductor layer functioning as a channel formation region of the thin film transistor at the same time as or after the formation of the microcrystalline semiconductor layer. A typical example of an impurity element imparting p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron is preferably set at $1\times10^{14}$ to $6\times10^{16}$ atoms·cm$^{-3}$.

In addition, the oxygen concentration in the microcrystalline semiconductor layer is preferably less than or equal to $5\times10^{19}$ atoms·cm$^{-3}$, more preferably, less than or equal to $1\times10^{19}$ atoms·cm$^{-3}$ and each of the nitrogen concentration and the carbon concentration in the microcrystalline semiconductor layer is preferably less than or equal to $3\times10^{18}$ atoms cm$^{-3}$. By decreases in concentrations of oxygen, nitrogen, and carbon to be mixed into the microcrystalline semiconductor layer, the microcrystalline semiconductor layer can be prevented from being changed into an n type.

In addition, since the microcrystalline semiconductor layer 612 includes microcrystals, it has lower resistance than an amorphous semiconductor layer. Therefore, the thin film transistor using the microcrystalline semiconductor layer 612 has current-voltage characteristics represented by a curve with a steep slope in a rising portion, has an excellent response as a switching element, and can be operated at high speed. When a microcrystalline semiconductor layer 612 is used for a channel formation region of a thin film transistor, fluctuation in the threshold voltage of the thin film transistor can be suppressed. Accordingly, a display device having less variation in electric characteristics can be manufactured.

Further, the microcrystalline semiconductor layer 612 has a higher mobility than an amorphous semiconductor layer. By using, for switching for each pixel in a display element, a thin film transistor having a channel formation region which is formed of the microcrystalline semiconductor layer 612, the area of the channel formation region, that is, the area of the thin film transistor can be decreased. Accordingly, the area occupied by the thin film transistor in a single pixel is decreased, and an aperture ratio of the pixel can be increased. Accordingly, the display device can have high definition.

Moreover, a thin film transistor having a very small amount of leakage current and a highly withstand-voltage property can be manufactured. The thin film transistor manufactured as described above can have excellent electric characteristics.

Note that this embodiment mode can be combined with Embodiment Mode 5.

Embodiment Mode 7

In Embodiment Mode 7, a structure and a manufacturing method which are the same as those of the thin film transistor described in Embodiment Mode 2 to 4 but in which a mode of a microcrystalline semiconductor layer is different from that of the thin film transistor described in Embodiment Modes 2 to 4 are described. Specifically, a manufacturing method of a microcrystalline semiconductor layer is devised in a different manner from that in Embodiment Mode 6, so that crystallinity of the microcrystalline semiconductor layer can be increased.

In a thin film transistor of this embodiment mode, after forming a microcrystalline semiconductor layer, the surface of the microcrystalline semiconductor layer is irradiated with laser light, whereby crystallinity of the microcrystalline semiconductor layer is increased. By irradiation of the microcrystalline semiconductor layer with laser light, crystallinity at the interface between a gate insulating layer and the microcrystalline semiconductor layer is increased, and thus a thin film transistor having a bottom-gate structure in which a channel formation region is formed with the microcrystalline semiconductor layer can be manufactured. Therefore, a thin film transistor having excellent electric characteristics such as higher carrier mobility can be manufactured.

The microcrystalline semiconductor layer is formed and then the surface of the microcrystalline semiconductor layer is irradiated with laser light. The laser irradiation is performed with such energy that does not melt the microcrystalline semiconductor layer. That is to say, a laser process (also referred to as "LP," hereinafter) according to this embodiment mode proceeds by solid phase crystal growth, in which the microcrystalline semiconductor layer is processed by radiation heat without being melted. That is, the laser process utilizes a critical region where a deposited microcrystalline semiconductor layer does not go into a liquid phase, and in that sense, the laser process may be called "critical growth" as well.

The laser light can influence on the interface between the microcrystalline semiconductor layer and the gate insulating layer, whereby crystals on the surface side of the microcrystalline semiconductor layer grow in a solid phase, functioning as a nucleus, from the surface to the interface between the microcrystalline semiconductor layer and the gate insulating layer; thus, crystals in a column-like shape grow. The crystal growth by the LP is not to increase the size of crystal grains but rather to improve crystallinity in the thickness direction of the microcrystalline semiconductor layer. That is to say, the LP has an effect of improving the crystallinity around or at the interface region with the gate insulating film, in particular, and improving the electric characteristics of the thin film transistor with a bottom gate structure.

Such critical growth has a feature of maintaining planarity on the surface of the microcrystalline semiconductor layer which has undergone the LP, which is different from conventional low-temperature polysilicon which has a rough surface (a portion in a shape of reverse T, called a "ridge"). As described above, a microcrystalline semiconductor layer of this embodiment mode obtained by applying the laser light directly to a deposited microcrystalline semiconductor layer has a different growth mechanism and film quality from those of a conventional as-deposited microcrystalline semiconductor layer or a microcrystalline semiconductor layer which is changed in quality by heat conduction. The microcrystalline semiconductor layer obtained by performing LP on a deposited microcrystalline semiconductor layer is called LPSAS (laser process semi-amorphous semiconductor) layer.

In addition, since an LPSAS layer includes microcrystals, it has lower resistance than an amorphous semiconductor layer. Therefore, a thin film transistor using the LPSAS layer has such a current-voltage property that a curve showing the current-voltage property has a rising portion with a steep slope, and is excellent in response speed as a switching element; and thus can operate at high speed. With the use of the microcrystalline semiconductor layer in a channel formation region of a thin film transistor, fluctuation of a threshold voltage of a thin film transistor can be suppressed. Accordingly, a display device having less variation in electric characteristics can be manufactured.

Further, the LPSAS layer has a higher mobility than an amorphous semiconductor layer. Therefore, if a thin film transistor in which a channel formation region is formed of the LPSAS layer is used as a switching element of a display element, the area of the channel formation region can be reduced; in other words, the area of the thin film transistor can be reduced. Accordingly, the area occupied by the thin film transistor in a single pixel is decreased, and an aperture ratio of the pixel can be increased. Accordingly, the display device can have high definition.

When an excimer laser is used for LP, pulse repetition rate is set to 1 Hz or higher and lower than 10 MHz, preferably from 100 Hz to 10 kHz, and the laser energy is 0.2 J·cm$^{-2}$ to 0.35 J·cm$^{-2}$ (typically, 0.2 J·cm$^{-2}$ to 0.3 J·cm$^{-2}$). In addition, in the case of using a YAG laser, it is preferable that the third harmonic be used, the repetition rate be set to be greater than or equal to 1 Hz and less than 10 MHz, and the laser energy be set to be 0.2 to 0.35 J·cm$^{-2}$ (typically, 0.2 to 0.3 J·cm$^{-2}$).

As a laser emitter of the laser light, a laser capable of pulsed oscillation or continuous oscillation can be used. As for a laser wavelength, a wavelength of a visible to ultraviolet region (less than or equal to 800 nm), preferably a wavelength of an ultraviolet region (less than or equal to 400 nm) is used so that the laser light is efficiently absorbed by an irradiated region. By using laser light in the ultraviolet light region at a wavelength of 300 to 400 nm, the laser light can be absorbed by the microcrystalline semiconductor layer effectively. As the laser, the following can be used: an excimer laser of KrF, ArF, XeCl, XeF, or the like; a gas laser of $N_2$, He, He—Cd, Ar, He—Ne, HF, $CO_2$, or the like; a solid-state laser using a crystal such as YAG, $GdVO_4$, $YVO_4$, YLF, $YAlO_3$, $ScO_3$, $Lu_2O_3$, or $Y_2O_3$, doped with Cr, Nd, Er, Ho, Ce, Co, Ti, Yb, or Tm; a solid-state laser such as a KGW laser, a KYW laser, an alexandrite laser, or a Ti:sapphire laser; a metal vapor laser such as a helium cadmium laser; or the like. Further, as for the solid-state laser, any of the second to fifth harmonics of a fundamental wave is preferably employed. Typically, excimer laser light with a wavelength of less than or equal to 400 nm and typically 308 nm, or the third harmonic (355 nm) of a YAG laser may be used for the laser light.

In the LP process, for example, a microcrystalline semiconductor layer over a glass substrate of 730 mm×920 mm can be processed by a single laser beam scan, by collecting laser light into linear laser light. In this case, the LP is performed with a ratio of overlapping linear laser light (an overlapping ratio) of 0 to 98%, preferably 85 to 95%. Accordingly, process time of each substrate can be shortened and productivity can be improved. The shape of the laser light is not limited to a linear shape, and similar processing can be conducted using planar laser light. Further, the LP is not limited by the size of the glass substrate, and the LP can be used for substrates with various sizes. The LP has effects in improving crystallinity around or at an interface between the microcrystalline semiconductor layer and the gate insulating layer and improving electric characteristics of a thin film transistor.

Further, in the case where a continuous wave laser beam is used as the laser light, by providing a polygon mirror or a galvanometer mirror between a laser emitter and a substrate and scanning with the laser light at high speed, the throughput of LP can be improved, and the LP can be performed on a microcrystalline semiconductor layer formed over a glass substrate with a size of, for example, 730 mm×920 mm, or a glass substrate with a size lager than that.

The microcrystalline semiconductor layer may be irradiated with laser light in an argon atmosphere, a hydrogen atmosphere, an atmosphere of argon and hydrogen, a nitrogen atmosphere, or the like. Formation of an oxide film on the LPSAS layer can be suppressed by irradiating the microcrystalline semiconductor layer with laser light in an inactive atmosphere as described above.

Further, washing the surface of the microcrystalline semiconductor layer before irradiating the microcrystalline semiconductor layer with the laser light can prevent impurities attached on the surface of the microcrystalline semiconductor layer from entering the microcrystalline semiconductor layer by the irradiation with laser light.

The microcrystalline semiconductor layer may undergo heating as well as laser irradiation. Typically, it is possible to enhance the crystallinity of the microcrystalline semiconductor layer by conducting laser irradiation while the substrate is heated at 300 to 400° C. Alternatively, it is also possible to increase the temperature of the microcrystalline semiconductor layer momentarily by being irradiated with the laser light and intense light. As a typical example of the intense light, an infrared ray with a peak of 1 to 2 μm (preferably, halogen light (1.3 μm)) can be used in particular.

If an oxide film is formed on the surface of the LPSAS layer, the oxide film is preferably removed by wet etching. As a result, it is possible to alleviate inhibition of carrier travel which is caused by an insulating film formed at an interface between the LPSAS layer and an amorphous semiconductor layer.

Further, the LPSAS layer may be etched to have a smaller thickness. If the LPSAS layer has a thickness of from 1 to 50 nm a thin film transistor of a complete depletion type can be manufactured.

As described above in this embodiment mode, a thin film transistor with a very small amount of leakage current and high withstand-voltage can be manufactured according to the present invention. The thin film transistor manufactured as described above can have excellent electric characteristics.

Note that this embodiment mode can be combined with Embodiment Mode 5 and Embodiment Mode 6.

Embodiment Mode 8

A thin film transistor of the present invention can be applied to a wide variety of liquid crystal display devices. In Embodiment Mode 8, a liquid crystal display device including a thin film transistor formed according to any method of the above embodiment modes is described.

First, a VA (vertical alignment) mode liquid crystal display device is described. A VA-mode is a mode in which longitudinal axes of liquid crystal molecules are vertical to a panel surface when voltage is not applied. In particular, in this embodiment mode, it is devised that a pixel is divided into several regions (subpixels) so that molecules are aligned in different directions. This is referred to as domain multiplication or multi-domain. In the following description, a multi-domain liquid crystal display device is described.

Figure 25:
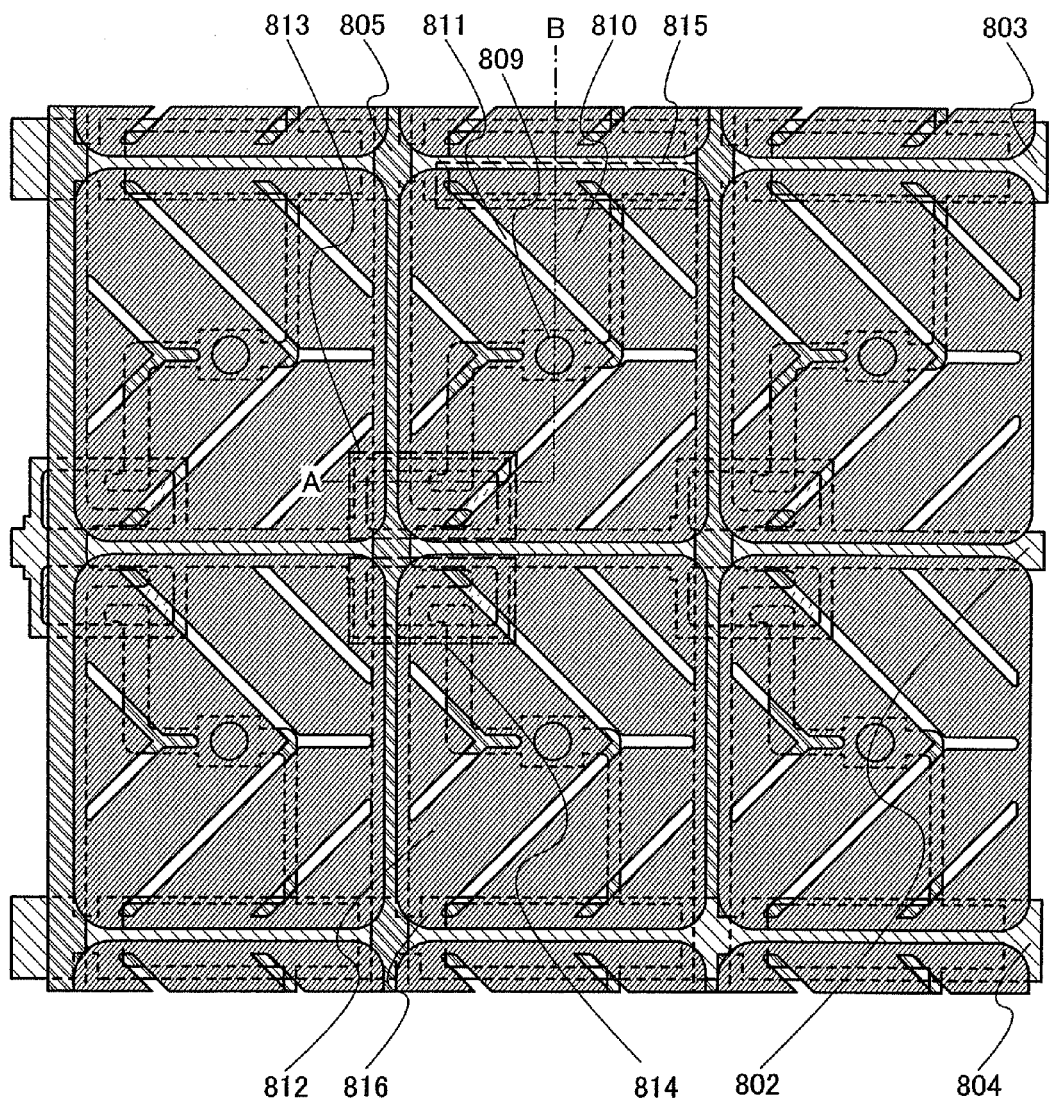
FIG. 25 illustrates a liquid crystal display device to which the present invention can be applied.
Figure 26:
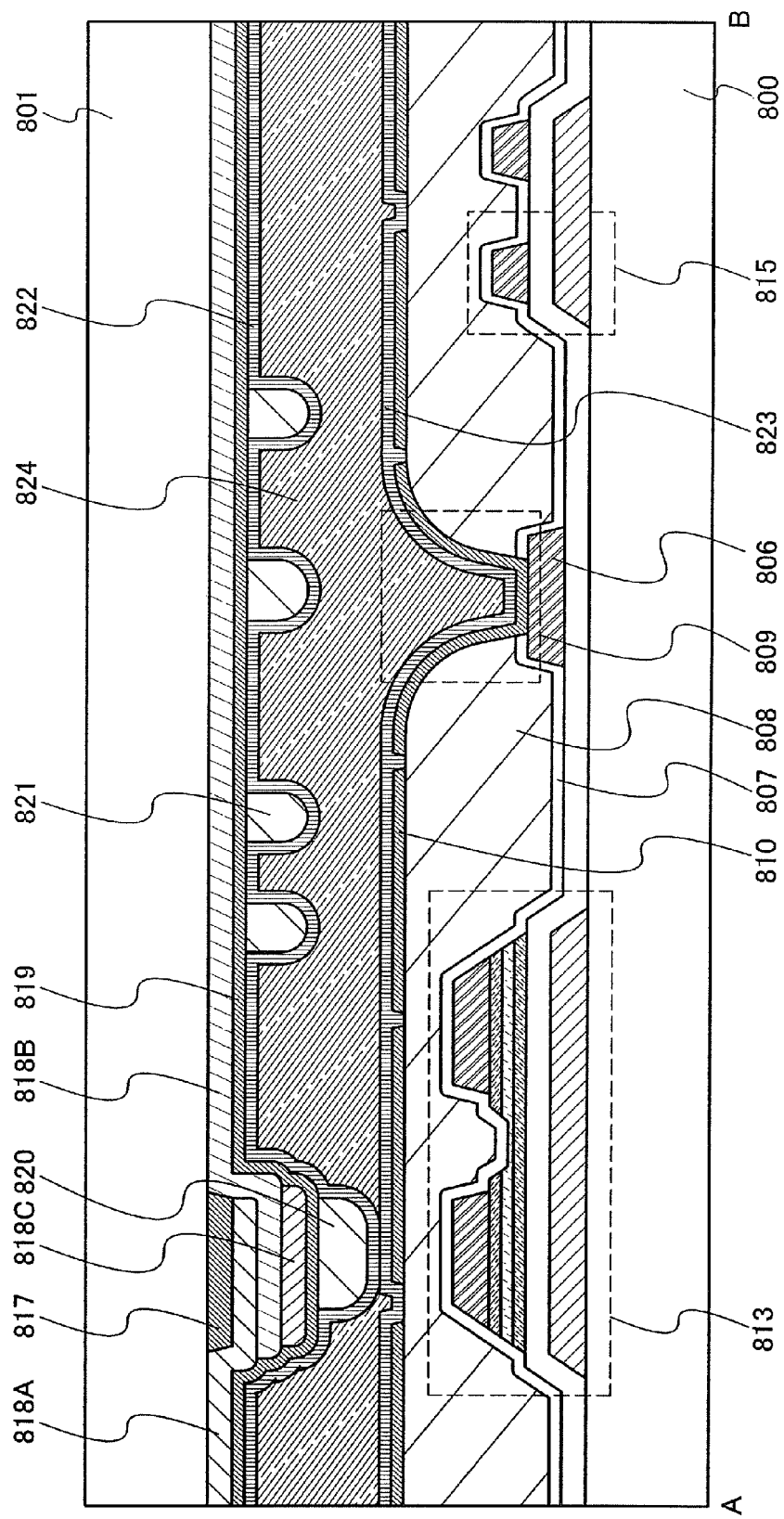
FIG. 26 illustrates the liquid crystal display device to which the present invention can be applied.
Figure 27:
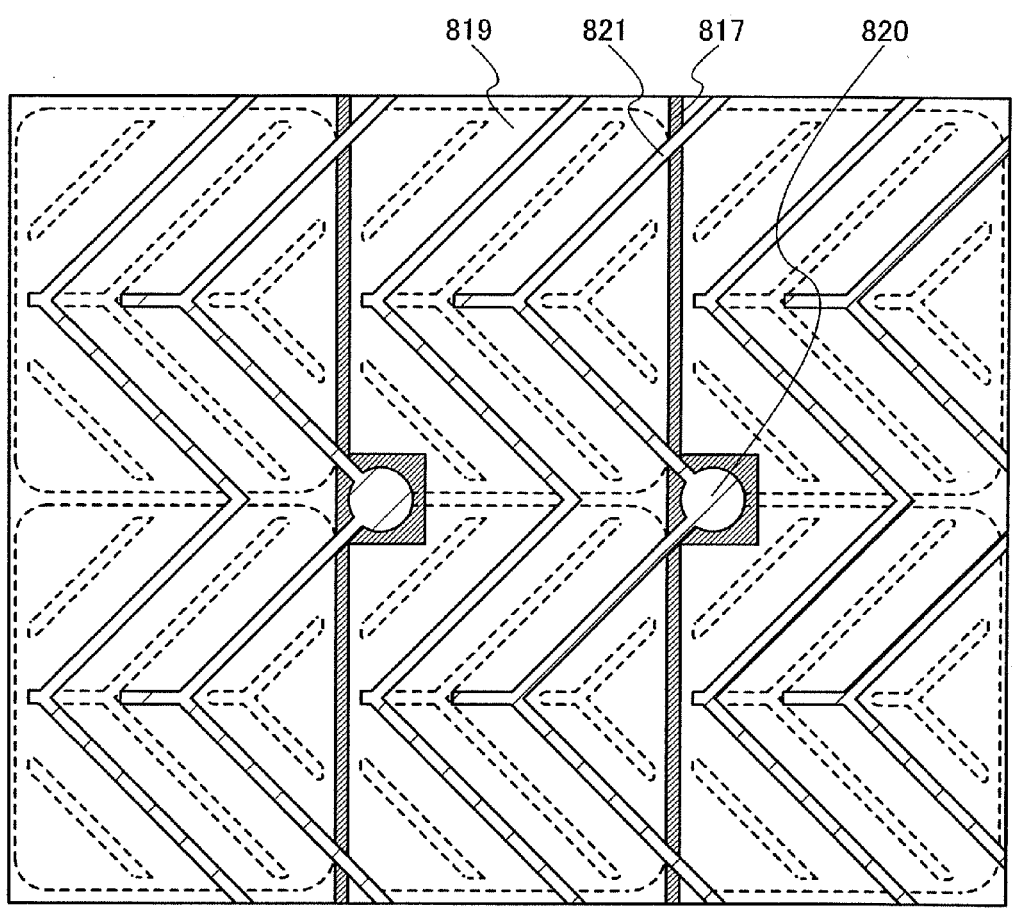
FIG. 27 illustrates the liquid crystal display device to which the present invention can be applied.

FIG. 25 is a top plan view of a side of a substrate over which a pixel electrode is formed. FIG. 26 illustrates a cross-sectional structure taken along the line A-B in FIG. 25. In addition, FIG. 27 is a top plan view of a side of a substrate on which a counter electrode is formed.

FIG. 26 illustrates a state in which a substrate 800 and a substrate 801 which is opposite to the substrate 800 face with each other, and liquid crystals are injected therebetween. A thin film transistor 813, a pixel electrode 810 connected to a source electrode layer or a drain electrode layer of the thin film transistor 813, and a storage capacitor portion 815 are provided over the substrate 800. The substrate 801 is provided with a counter electrode 819.

At a position where a spacer 820 is provided for the substrate 801, a light-shielding layer 817, a first coloring layer 818A, a second coloring layer 818B, a third coloring layer 818C, and the counter electrode 819 are formed. With the structure in which the coloring layers are stacked in a region in which the spacer 820 is formed, the height of a protrusion 821 for controlling alignment of the liquid crystals and the height of the spacer 820 are different from each other. An alignment film 823 is formed over the pixel electrode 810. An alignment film 822 is provided in contact with the counter electrode 819. A liquid crystal layer 824 is provided between the alignment film 822 and the alignment film 823.

Although a post spacer (a columnar spacer) is used as the spacer 820 in FIG. 26, the present invention is not limited to this. A bead spacer (a spherical spacer) may be dispersed as the spacer. Further, the spacer 820 may be provided on the pixel electrode 810 provided over the substrate 800.

The thin film transistor 813, the pixel electrode 810 connected to the thin film transistor 813, and the storage capacitor portion 815 are provided over the substrate 800. The pixel electrode 810 and a wiring 806 are connected through an opening portion 809 which penetrates an insulating layer 807 and an insulating layer 808. The insulating layer 807 is provided so as to cover the thin film transistor 813, the wiring 806, and the storage capacitor portion 815. The insulating layer 808 is provided so as to cover the insulating layer 807. The thin film transistor 813 can be formed by any of the methods described in the above embodiment modes. In addition, the storage capacitor portion 815 is formed by sandwiching a gate insulating layer of the thin film transistor 813 between a conductive layer which is formed in the same step and in a manner similar to that of a gate electrode of the thin film transistor 813 and a scan line, and a conductive layer which is formed in the same step and in a manner similar to that of a source electrode of the thin film transistor 813 and a signal line.

A liquid crystal element is formed by overlapping of the pixel electrode 810 which has the alignment film 823, the counter electrode 819 which has the alignment film 822, and the liquid crystal layer 824 interposed therebetween.

FIG. 25 is a top plan view of the substrate 800 side. The pixel electrode 810 is formed using a material similar to that of the pixel electrode layer described in Embodiment Mode 2. The pixel electrode 810 is provided with a slit 811. The slit 811 is used for controlling alignment of the liquid crystals.

A thin film transistor 814 illustrated in FIG. 25 can be formed in a similar manner to the thin film transistor 813. The pixel electrode 812 connected to the thin film transistor 814 can be formed by a material and method similar to those of the pixel electrode 810. In addition, a storage capacitor portion 816 can be formed in a similar manner to the storage capacitor portion 815.

Sources or drains of the thin film transistor 813 and the thin film transistor 814 are connected to a wiring 805. One pixel of this liquid crystal panel includes the pixel electrode 810 and the pixel electrode 812. The pixel electrode 810 and the pixel electrode 812 constitute subpixels.

FIG. 27 is a top plan view of the substrate 801 side. The counter electrode 819 is provided above the light-shielding layer 817. The counter electrode 819 is preferably formed using a material which is similar to that of the pixel electrode 810. The protrusion 821 for controlling alignment of the liquid crystals is provided in contact with the counter electrode 819. In addition, the spacer 820 is provided in a predetermined region overlapping with the light-shielding layer 817. Note that in FIG. 27, hatching is done only on the light-shielding layer 817, the spacer 820, and the protrusion 821.

Figure 28:
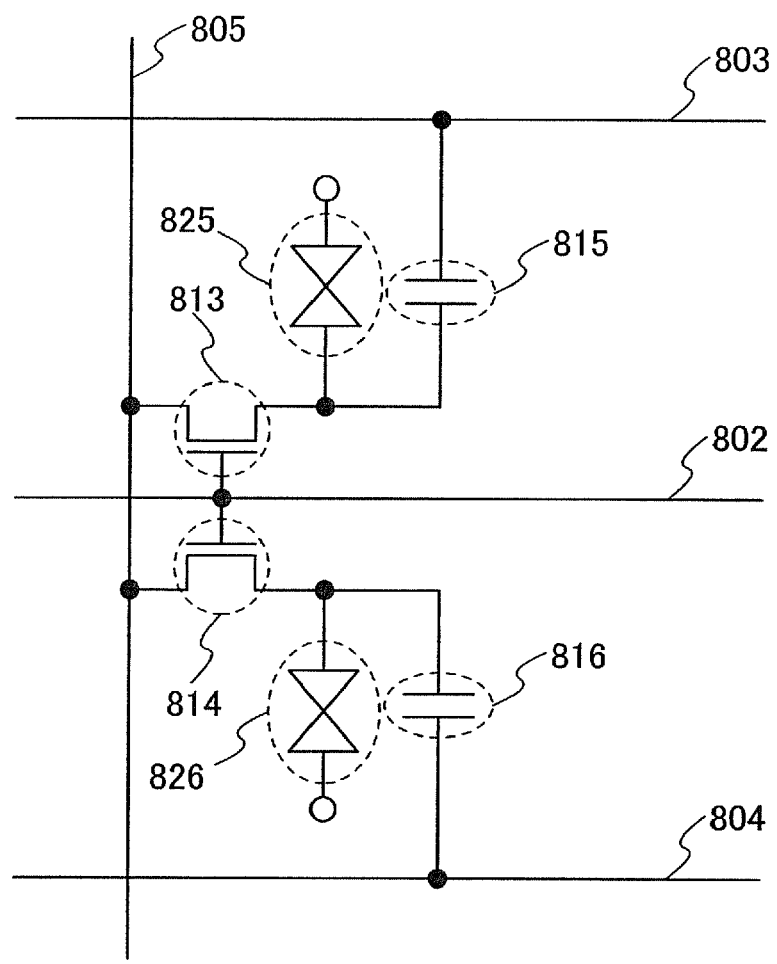
FIG. 28 illustrates the liquid crystal display device to which the present invention can be applied.

FIG. 28 illustrates an equivalent circuit of the above-described pixel structure. Gates of the thin film transistor 813 and the thin film transistor 814 are both connected to a wiring 802 functioning as a scan line. One of a source and a drain each of the thin film transistor 813 and the thin film transistor 814 is connected to the wiring 805, and the other thereof is connected to the wiring 803 and the wiring 804 via the storage capacitor portion 815 or the storage capacitor portion 816. In FIG. 28, when a potential of a wiring 803 functioning as a capacitor line and a potential of a wiring 804 functioning as a capacitor line are different, operations of a liquid crystal element 825 and a liquid crystal element 826 can be made different. That is, the viewing angle is increased by individually controlling the potentials of the wiring 803 and the wiring 804.

When voltage is applied to the pixel electrode 810 provided with the slit 811 (the potential of the pixel electrode 810 is different from the potential of the counter electrode 819), electric field distortion is generated near the slit 811 to produce an oblique electric field. When the slits 811 and the protrusions 821 on the substrate 801 side are alternately provided, an oblique electric field is effectively generated, so that alignment of the liquid crystals can be controlled. Therefore, directions of alignment of the liquid crystals are made to be different depending on location. That is, the viewing angle of the liquid crystal panel is increased by domain multiplication.

Next, a VA-mode liquid crystal display device, which is different from the above-described device, is described with reference to FIGS. 29 to 32.

Figure 29:
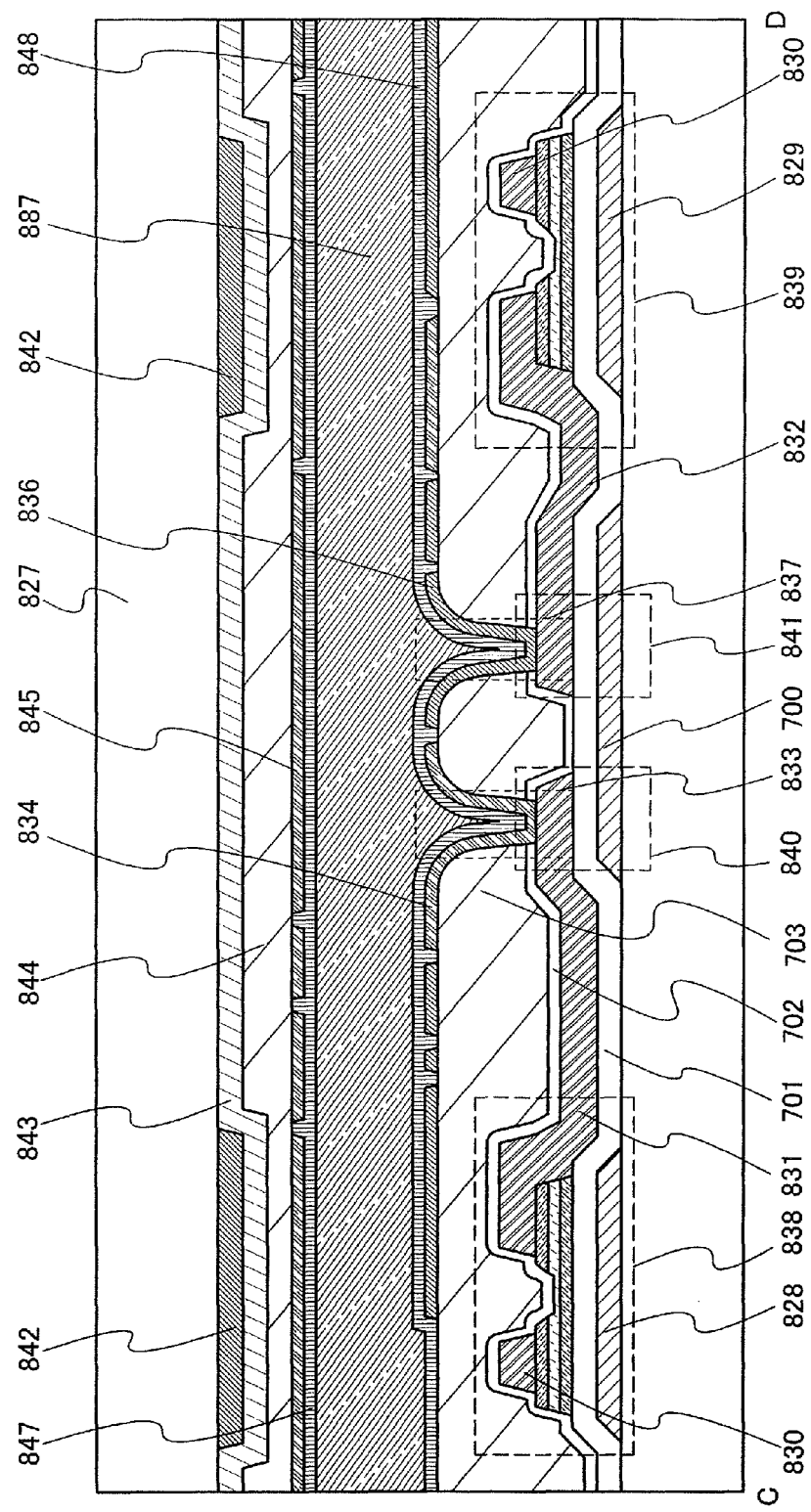
FIG. 29 illustrates a liquid crystal display device to which the present invention can be applied.
Figure 31:
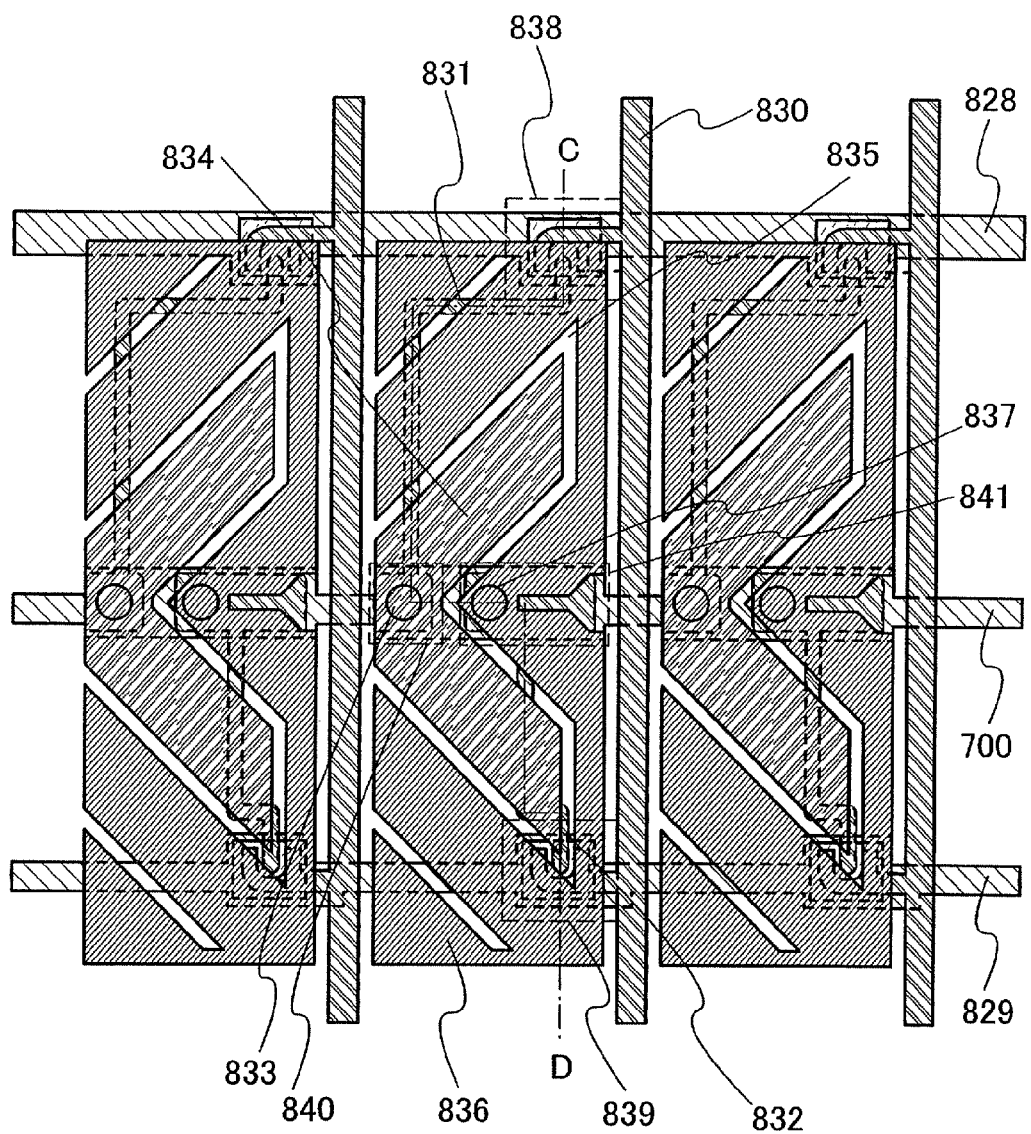
FIG. 31 illustrates the liquid crystal display device to which the present invention can be applied.
Figure 32:
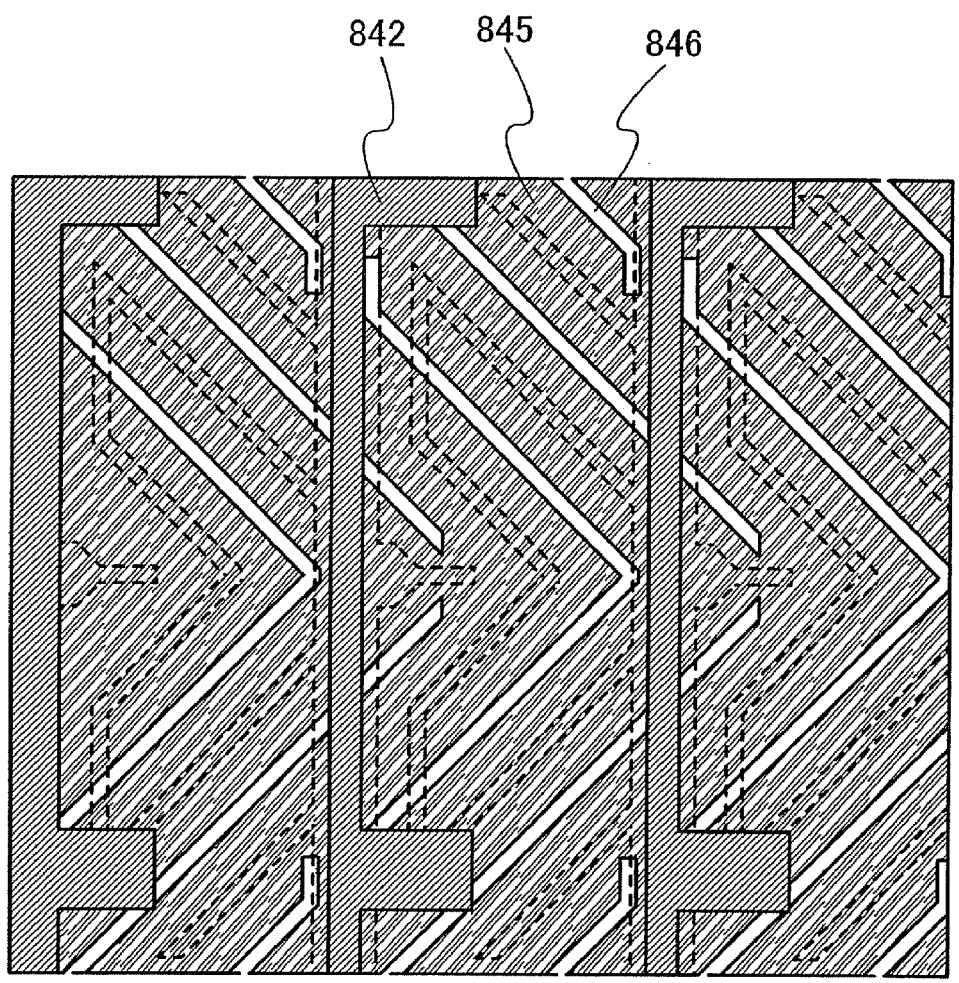
FIG. 32 illustrates the liquid crystal display device to which the present invention can be applied.

FIG. 31 is a top plan view of a side of a substrate over which a pixel electrode is formed. FIG. 29 illustrates a cross-sectional structure taken along the line C-D in FIG. 31. In addition, FIG. 32 is a top plan view of a side of a substrate on which a counter electrode is formed. Hereinafter, description is made with reference to these drawings.

Figure 30:
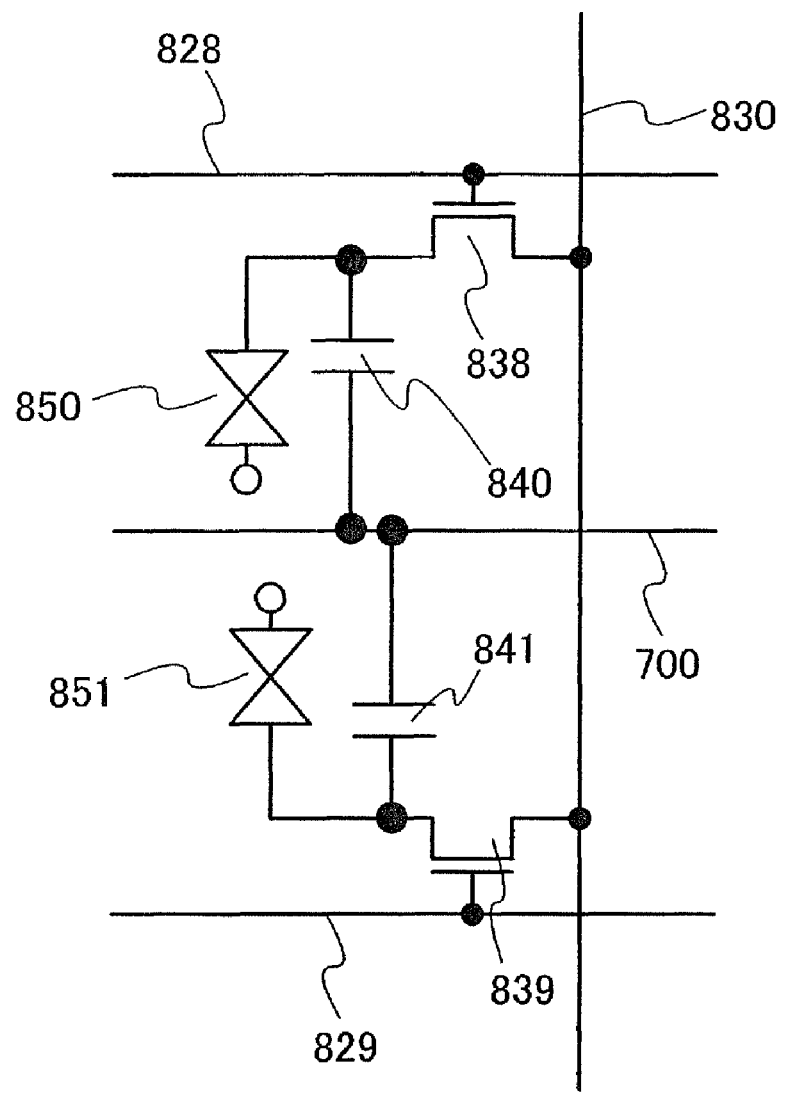
FIG. 30 illustrates the liquid crystal display device to which the present invention can be applied.

In each of the pixels of the liquid crystal display device, which are illustrated in FIGS. 29 to 32, one pixel includes a plurality of pixel electrodes and a thin film transistor is connected to each of the plurality of pixel electrodes. That is, the pixel is a multi-domain pixel. The thin film transistors are driven by different gate signals. In other words, signals supplied to the respective pixel electrodes can be controlled independently (FIG. 30).

A pixel electrode 834 is connected to a thin film transistor 838 by a wiring 831 through an opening portion 833. A pixel electrode 836 is connected to a thin film transistor 839 by a wiring 832 through an opening portion 837. A wiring 828 functioning as a scan line which is connected to a gate electrode of the thin film transistor 838 and a wiring 829 functioning as a scan line which is connected to a gate electrode of the thin film transistor 839 are separated so that different gate signals can be supplied to the gate electrodes. On the other hand, as for a signal line, a wiring 830 is shared by the thin film transistor 838 and the thin film transistor 839. As each of the thin film transistor 838 and the thin film transistor 839, a thin film transistor formed according to a manufacturing method of the above-described embodiment modes can be used as appropriate.

Note that a storage capacitor portion 840 is connected to the thin film transistor 838. A storage capacitor portion 841 is connected to the thin film transistor 839. The storage capacitor portion 840 includes the wiring 831, the wiring 700 and the insulating layer 701 interposed therebetween. The storage capacitor portion 841 includes the wiring 832, the wiring 700, and the insulating layer 701 interposed therebetween. The insulating layer 701 serves as a gate insulating layer of the thin film transistor 838 and the thin film transistor 839.

Note that an opening portion 833 and an opening portion 837 are formed to penetrate the insulating layer 702 and the insulating layer 703 covering the thin film transistor 838 and the thin film transistor 839.

Note that the wiring 700 serves as a capacitor line, and is kept at a constant potential (common potential).

The pixel electrode 834 and the pixel electrode 836 have different shapes (FIG. 31) and are separated by the slit 835. Specifically, the pixel electrode 836 is provided so as to surround the external side of the pixel electrode 834 with a V shape. Timings of voltage application are varied between the pixel electrode 834 and the pixel electrode 836 by using the thin film transistor 838 and the thin film transistor 839, so that alignment of liquid crystals can be controlled. FIG. 30 illustrates an equivalent circuit of this pixel structure. When different gate signals are supplied to the wiring 828 and the wiring 829, operation timings of the thin film transistor 838 and the thin film transistor 839 can be varied.

A counter substrate 827 is provided with a light-shielding layer 842, a coloring layer 843, and a counter electrode 845. In addition, a planarization layer 844 is formed between the coloring layer 843 and the counter electrode 845 and prevents alignment disorder of the liquid crystals. FIG. 32 is a top plan view of the counter substrate side. The counter electrode 845 is shared between different pixels and is provided with a slit 846. When the slit 846 and the slit 835 on the pixel electrodes 834 and 836 side are alternately provided, an oblique electric field is effectively generated, so that alignment of the liquid crystals can be controlled. Therefore, directions of alignment of the liquid crystals can be different in a first liquid crystal element 850 and a second liquid crystal element 851, and a wide viewing angle can be realized.

The first liquid crystal element 850 is formed by overlapping of the pixel electrode 834 having an alignment film 848, a liquid crystal layer 849, and the counter electrode 845 having an alignment film 847. In addition, the second liquid crystal element 851 is formed by overlapping of the pixel electrode 836 having the alignment film 848, the liquid crystal layer 849, and the counter electrode 845 having an alignment film 847. Therefore, in each of the pixel structures shown in FIGS. 29 to 32, a multi-domain structure in which the first liquid crystal element 850 and the second liquid crystal element 851 are provided in one pixel is formed.

The present invention can also be applied to a horizontal electric field-mode liquid crystal display device. A horizontal electric field-mode is a mode in which a liquid crystal layer is driven to express grayscale by horizontally applying an electric field to liquid crystal molecules in a cell. According to a horizontal electric field-mode, the viewing angle can be widened to approximately 180 degrees. Hereinafter, a horizontal electric field-mode liquid crystal display device to which the present invention is applied is described with reference to FIGS. 33 and 34.

Figure 33:
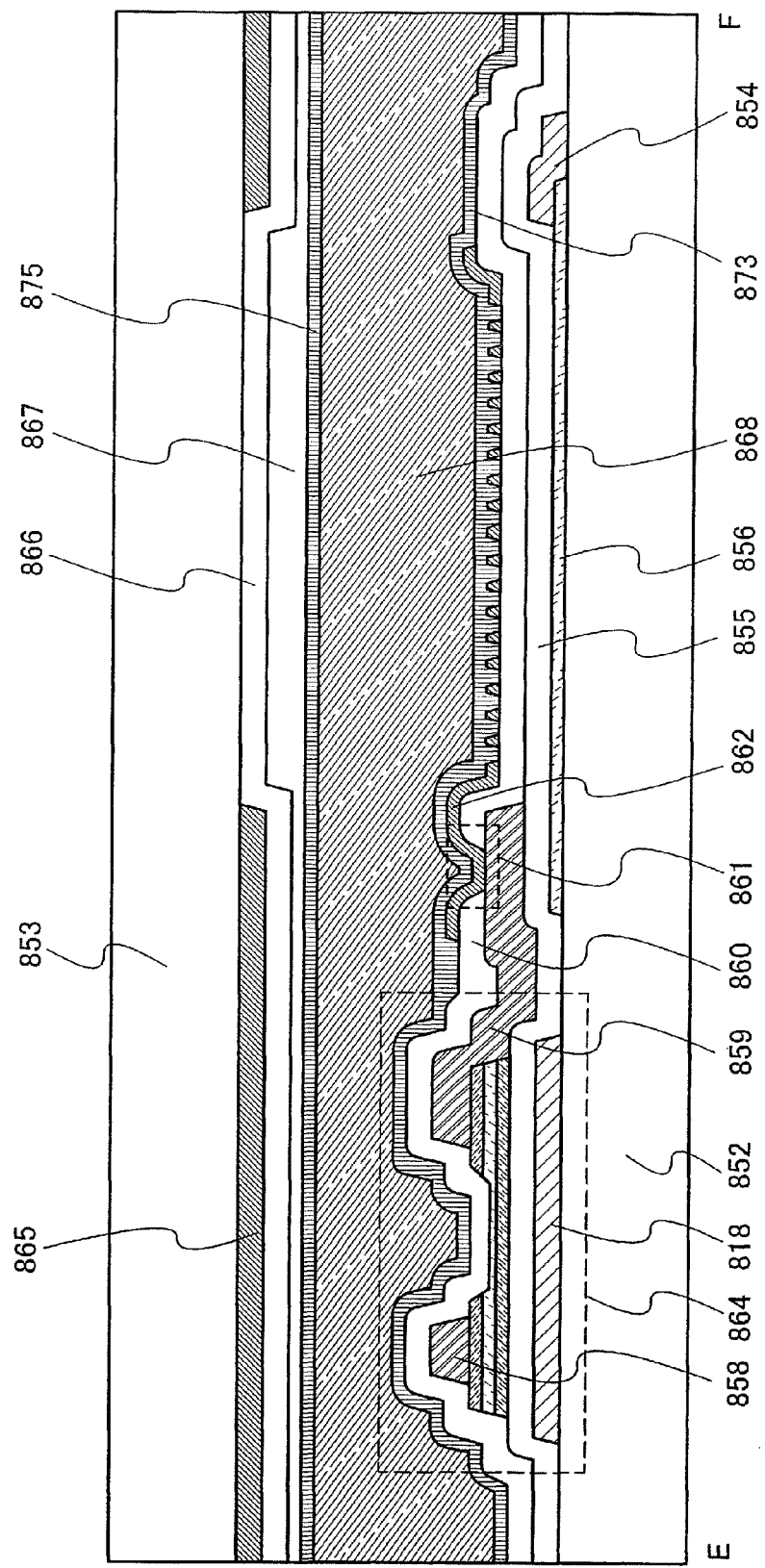
FIG. 33 illustrates a liquid crystal display device to which the present invention can be applied.

FIG. 33 illustrates a state in which a substrate 852 over which a thin film transistor 864, and a pixel electrode 862 connected to the thin film transistor 864 are provided and a substrate 853 which is opposite to the substrate 852, face with each other, and liquid crystals are injected therebetween. The substrate 853 is provided with a light-shielding layer 865, a coloring layer 866, and a planarization layer 867. Although a pixel electrode is provided over the substrate 852, a pixel electrode is not provided on the substrate 853. A liquid crystal layer 868 is provided by injection of liquid crystals between the substrate 852 and the substrate 853. Note that the substrate 852 has an alignment film 873, the substrate 853 has the alignment film 875, and the alignment film 875 and the alignment film 873 are provided in contact with the liquid crystal layer 868.

A counter electrode 856, a wiring 854 functioning as a capacitor line which is connected to the counter electrode 856, and the thin film transistor 864 are formed over the substrate 852. A thin film transistor formed according to any of the above embodiment modes can be used as the thin film transistor 864 as appropriate. The counter electrode 856 can be formed using a material which is similar to that of the pixel electrode layer described in Embodiment Mode 2. In addition, the counter electrode 856 is formed in a shape which is compartmentalized roughly in a pixel shape. Note that a first insulating layer 855 is formed over the counter electrode 856 and the wiring 854. The first insulating layer 855 is formed over the wiring 818 serving as a gate electrode of the thin film transistor 864, and the first insulating layer 855 serves as a gate insulating layer of the thin film transistor 864.

A source electrode and a drain electrode of the thin film transistor 864 and a wiring 858 and a wiring 859 which are connected to the source electrode and the drain electrode of the thin film transistor 864 are formed over the first insulating layer 855. The wiring 858 is a signal line to which a video signal is input in a liquid crystal display device. The wiring 858 is a wiring extending in one direction, is connected to one of source and drain regions of the thin film transistor 864 and serves as one of the source electrode and the drain electrode. The wiring 859 is connected to the other of the source electrode and the drain electrode, and the pixel electrode 862.

A second insulating layer 860 is formed over the wiring 858 and the wiring 859. In addition, the pixel electrode 862 connected to the wiring 859 through an opening portion 861 formed in the second insulating layer 860 is provided over the second insulating layer 860. The pixel electrode 862 is formed using a material which is similar to that of the pixel electrode layer described in Embodiment Mode 2.

As described above, the thin film transistor 864 and the pixel electrode 862 connected to the thin film transistor 864 are provided over the substrate 852. Note that a storage capacitor is formed between the counter electrode 856 and the pixel electrode 862.

Figure 34:
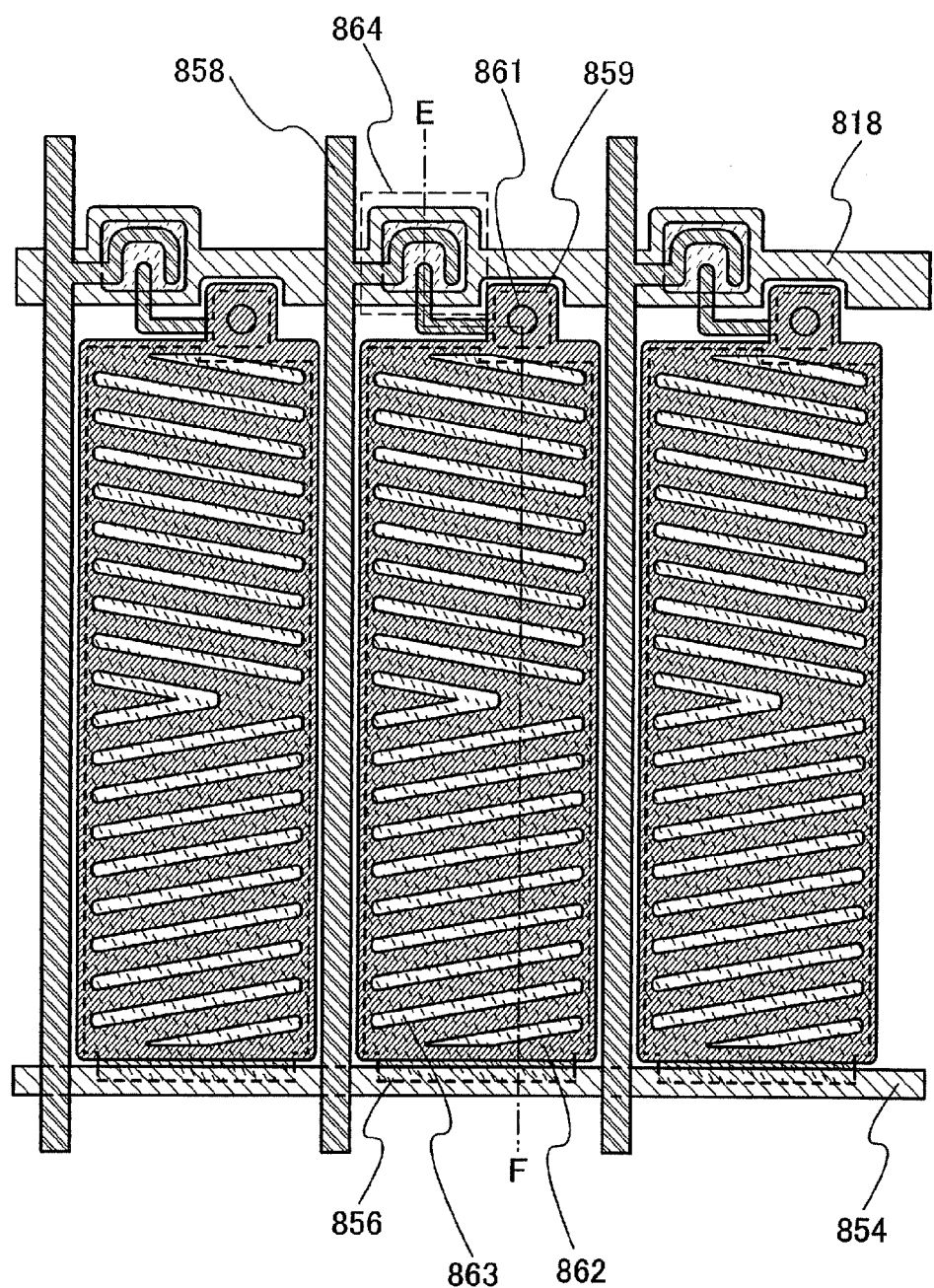
FIG. 34 illustrates the liquid crystal display device to which the present invention can be applied.

FIG. 34 is a plan view showing the structure of the pixel electrodes. The pixel electrode 862 is provided with a slit 863. The slit 863 is used for controlling alignment of the liquid crystals. In this case, an electric field is generated between the counter electrode 856 and the pixel electrode 862. The first insulating layer 855 is formed between the counter electrode 856 and the pixel electrode 862 and has a thickness of approximately 50 nm to 200 nm, which is much thinner than the liquid crystal layer having a thickness of 2 μm to 10 μm. Accordingly, an electric field is generated in a parallel direction (in a horizontal direction) to the substrate 852. Alignment of the liquid crystals can be changed by the electric field. The liquid crystal molecules are horizontally rotated by utilizing the electric field which is approximately parallel to the substrate. In this case, since the liquid crystal molecules are parallel to the substrate in any state, contrast or the like is hardly affected by change in angle of viewing. That is, a wide viewing angle can be realized. Further, since both the counter electrode 856 and the pixel electrode 862 are light-transmitting electrodes, a high aperture ratio can be obtained.

Next, a horizontal electric field-mode liquid crystal display device, which is different from the above-described device, is described with reference to FIG. 35 and FIG. 36.

Figure 35:
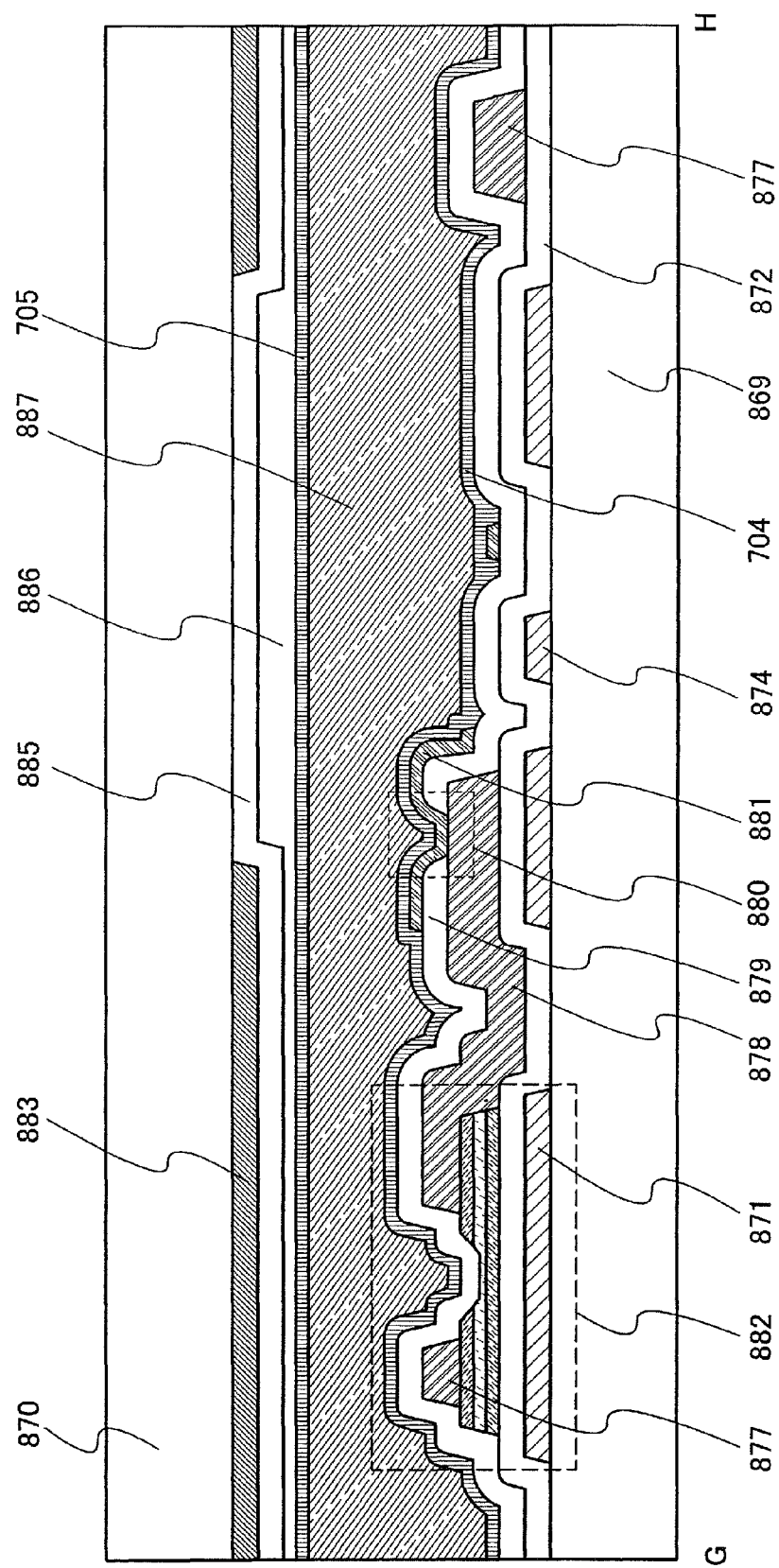
FIG. 35 illustrates a liquid crystal display device to which the present invention can be applied.
Figure 36:
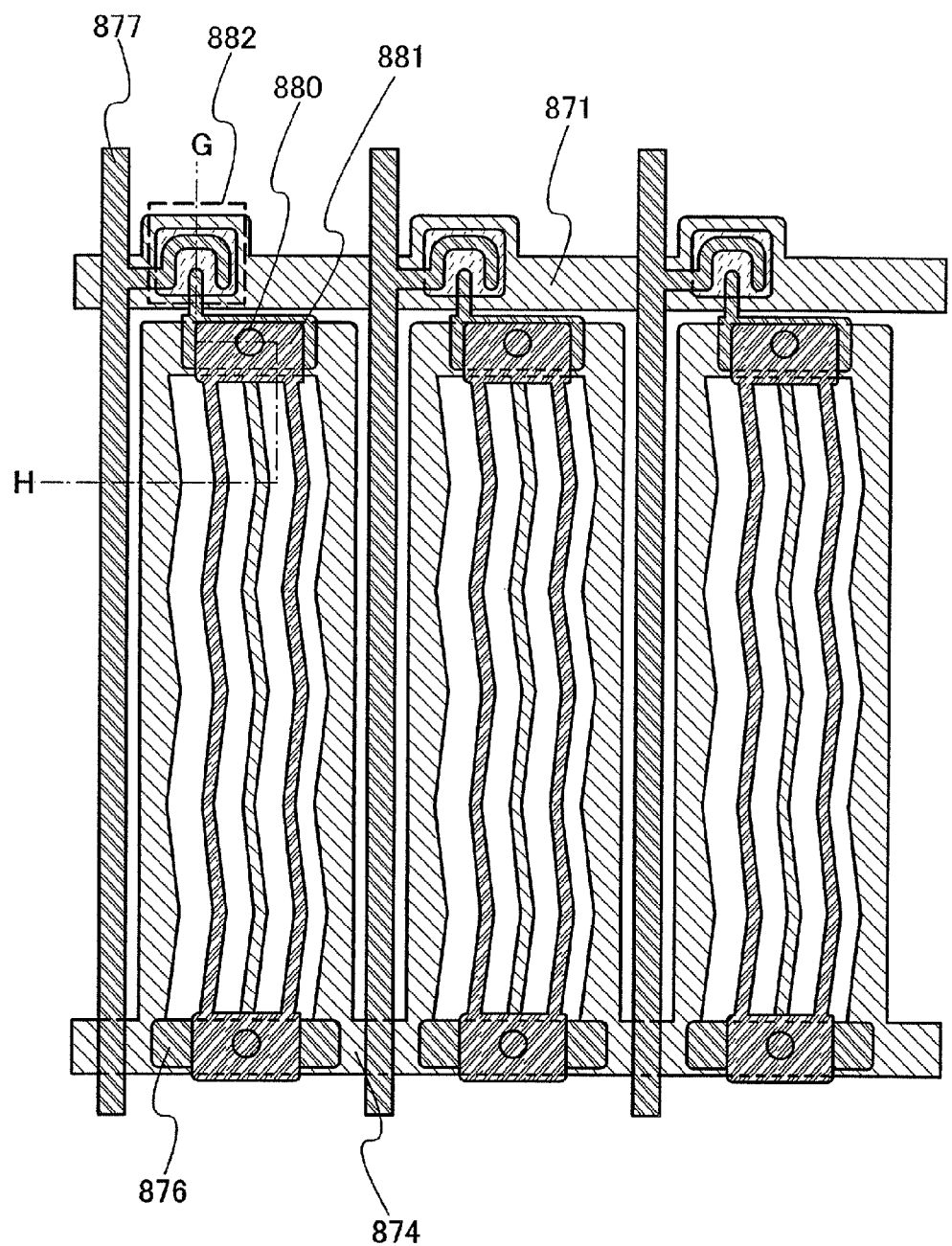
FIG. 36 illustrates the liquid crystal display device to which the present invention can be applied.

FIG. 35 and FIG. 36 each show a pixel structure of a horizontal-electric field mode liquid crystal display device. FIG. 36 is a top plan view. FIG. 35 illustrates a cross-sectional structure taken along the line G-H in FIG. 36.

FIG. 35 illustrates a state in which a substrate 869 over which a thin film transistor 882 and a pixel electrode 881 connected to the thin film transistor 882 are provided and a substrate 870 which is opposite to the substrate 869 face with each other and liquid crystals are injected therebetween. The substrate 870 is provided with a light-shielding layer 883, a coloring layer 885, a planarization layer 886, and the like. Although a pixel electrode is provided over the substrate 869, a pixel electrode is not provided on the substrate 870. A liquid crystal layer 887 is provided by injection of liquid crystals between the substrate 869 and the substrate 870. Note that the substrate 869 has an alignment film 704, the substrate 870 has the alignment film 705, and the alignment film 704 and the alignment film 705 are provided in contact with the liquid crystal layer 887.

The substrate 869 is provided with a wiring 874 kept at a common potential and the thin film transistor 882 formed according to any of the methods described in the above embodiment modes. The wiring 874 can be formed at the same time and in the same step as a scan line 871 of the thin film transistor 882. A counter electrode (common electrode) is formed in the same layer as the wiring 874 and formed in a shape which is compartmentalized roughly in a pixel shape.

A wiring 877 and a wiring 878 which each are connected to a source electrode and a drain electrode of the thin film transistor 882 are formed over a first insulating layer 872. Note that the first insulating layer 872 serves as a gate insulating layer of the thin film transistor 882. The wiring 877 is a signal line to which a video signal is input in a liquid crystal display device. The wiring 877 is a wiring extending in one direction, is connected to one of source and drain region of the thin film transistor 882 and serves as one of the source electrode and the drain electrode thereof. The wiring 878 is connected to the other of the source electrode and the drain electrode and the pixel electrode 881. Note that a thin film transistor formed according to any of the methods in the above-described embodiment modes can be used as the thin film transistor 882 as appropriate.

A second insulating layer 879 is formed over the wiring 877 and the wiring 878. In addition, the pixel electrode 881 connected to the wiring 878 through an opening portion 880 formed in the second insulating layer 879 is formed over the second insulating layer 879. The pixel electrode 881 is formed using a material which is similar to that of the pixel electrode layer described in Embodiment Mode 2. Note that as illustrated in FIG. 36, the pixel electrode 881 is formed so as to generate a horizontal electric field between the pixel electrode 881 and a comb-shaped electrode which is formed at the same time as the wiring 874. Further, the pixel electrode 881 is formed so that comb-shaped portions of the pixel electrode 881 and the counter electrode (common electrode) which is formed at the same time as the wiring 874 are alternately provided.

Alignment of the liquid crystals can be controlled by an electric field which is substantially parallel to the substrate, generated by a potential difference between a potential of the pixel electrode 881 and a potential of the wiring 874. The liquid crystal molecules are horizontally rotated by utilizing the electric field which is approximately parallel to the substrate, whereby the alignment of the liquid crystals can be controlled. In this case, since the longitudinal axes of the liquid crystal molecules are substantially parallel to the substrate in any state, contrast or the like is hardly affected by change in angle of viewing. Therefore, a wide viewing angle can be realized.

As described above, the thin film transistor 882 and the pixel electrode 881 connected to the thin film transistor 882 are provided over the substrate 869. A storage capacitor is formed by providing the first insulating layer 872 between the wiring 874 and a capacitor electrode 876. The capacitor electrode 876 which is formed in the same layer as the wiring 877 and the pixel electrode 881 are connected through an opening portion 880.

The present invention can also be applied to a TN-mode liquid crystal display device. Thus, a mode of a TN-mode liquid crystal display device to which the present invention is applied is described below with reference to FIG. 37 and FIG. 38.

Figure 37:
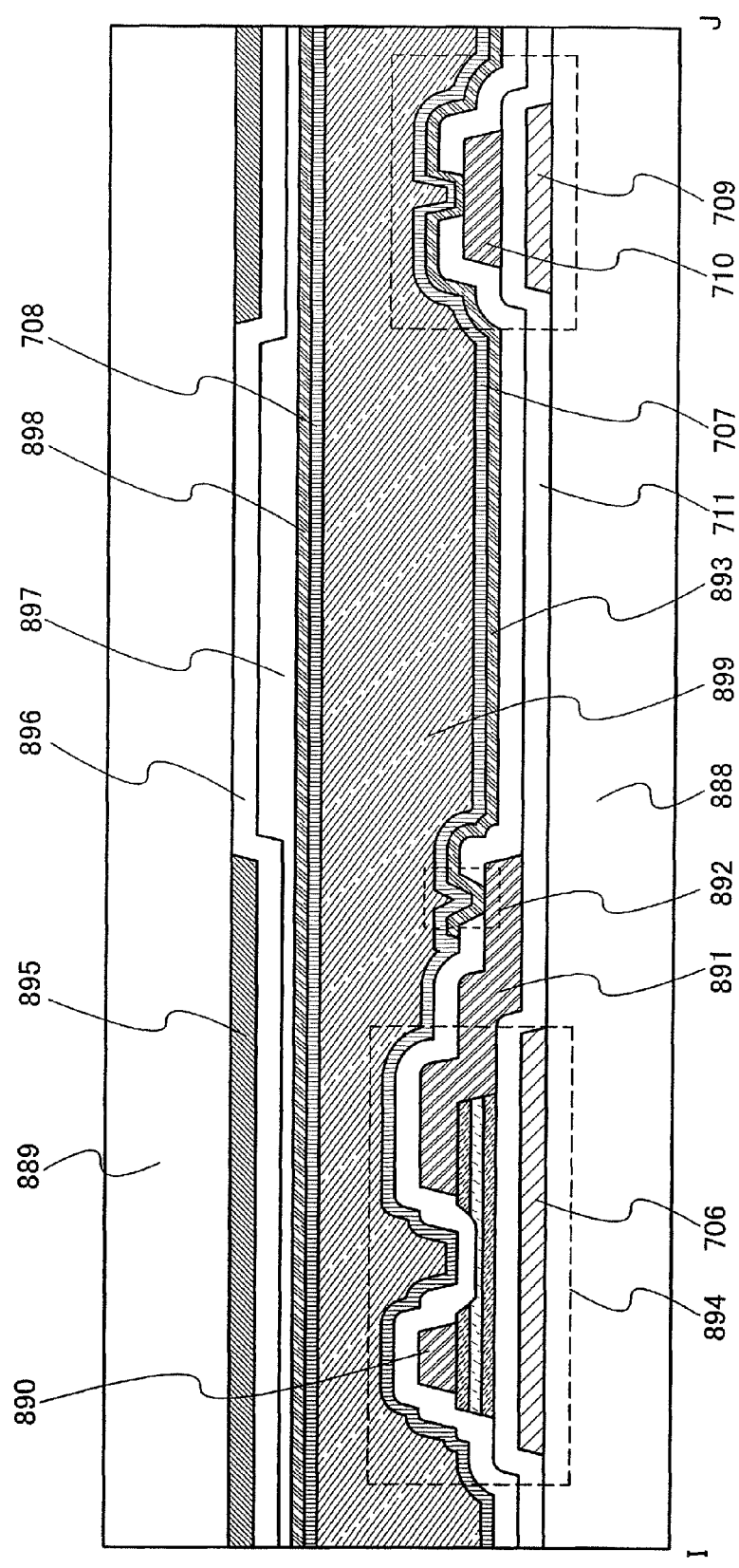
FIG. 37 illustrates a liquid crystal display device to which the present invention can be applied.
Figure 38:
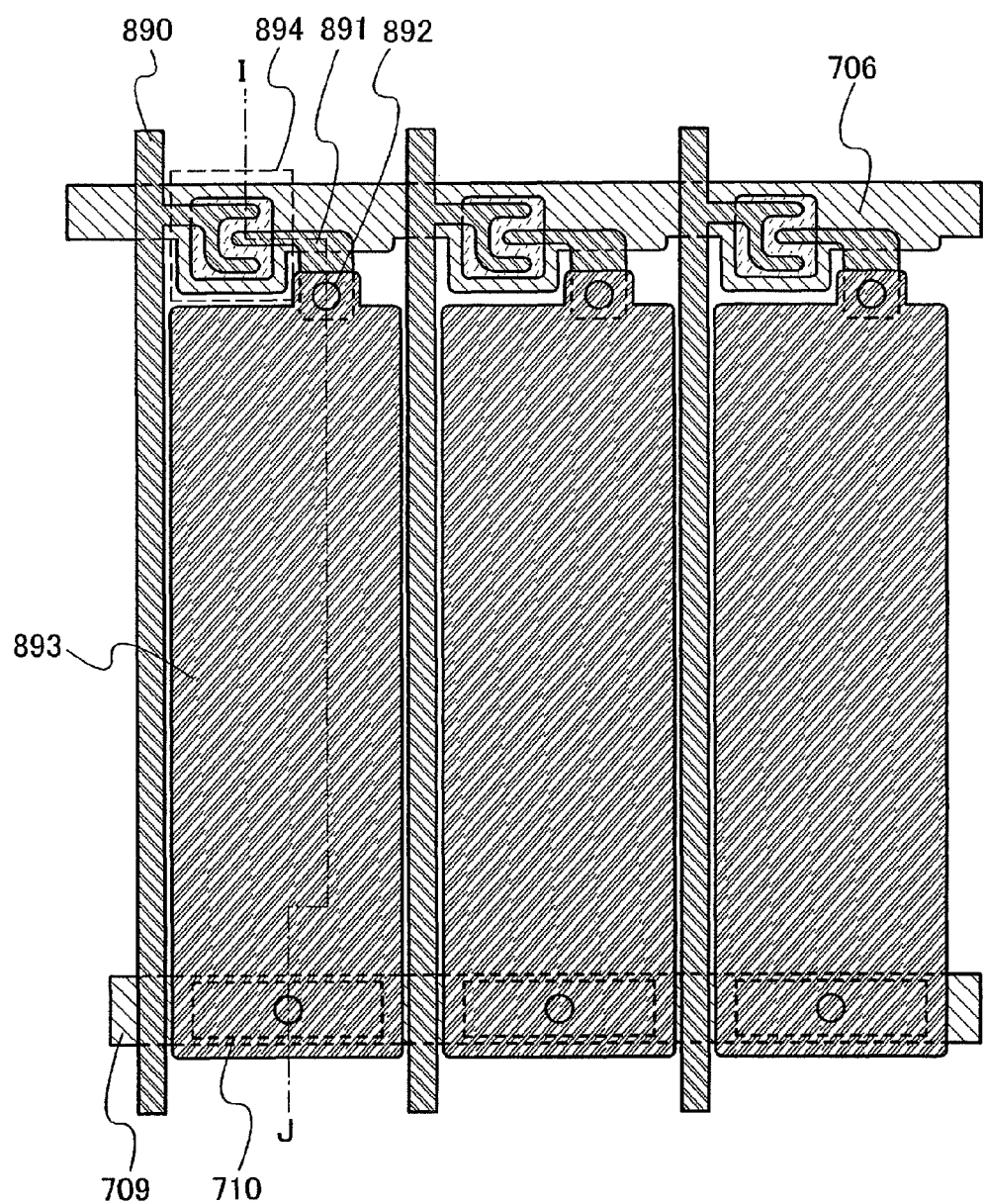
FIG. 38 illustrates the liquid crystal display device which to which the present invention can be applied.

FIG. 37 and FIG. 38 each show a pixel structure of a TN-mode liquid crystal display device. FIG. 38 is a top plan view. FIG. 37 illustrates a cross-sectional structure taken along the line I-J in FIG. 38. Hereinafter, description is made with reference to FIG. 37 and FIG. 38.

Over a substrate 888, a pixel electrode 893 is connected to a thin film transistor 894 by a wiring 891 through an opening portion 892. The wiring 890 functioning as a signal line is connected to the thin film transistor 894. The wiring 706 serves as a scan line. Note that a thin film transistor formed according to any of the methods in the above embodiment modes can be used as the thin film transistor 894 as appropriate.

The pixel electrode 893 is formed using a material which is similar to that of the pixel electrode layer described in Embodiment Mode 2.

A substrate 889 opposite to the substrate 888 is provided with a light-shielding layer 895, a coloring layer 896, and a counter electrode 898. In addition, a planarization layer 897 is formed between the coloring layer 896 and the counter electrode 898 and prevents alignment disorder of the liquid crystals. A liquid crystal layer 899 is provided between the pixel electrode 893 and the counter electrode 898. Note that an alignment film 707 is provided between the liquid crystal layer 899 and the pixel electrode 893, and an alignment film 708 is provided between the liquid crystal layer 899 and the counter electrode 898.

A liquid crystal element is formed by overlapping of the pixel electrode 893, the liquid crystal layer 899, and the counter electrode 898.

A shielding layer (a black matrix) or a coloring layer serving as a color filter may be provided over a substrate 888. Further, a polarizing plate is attached to a surface (rear surface) of the substrate 888, which is opposite to a surface over which the thin film transistor and the like are provided. A polarizing plate is attached to a surface (rear surface) of the substrate 889, which is opposite to a surface on which the counter electrode 898 and the like are formed.

A material which is similar to that of the pixel electrode 893 can be used as the counter electrode 898 as appropriate.

The storage capacitor includes the wiring 709, the wiring 710 and the insulating layer 711 interposed therebetween.

Note that in the referred drawings in the above description, gate electrodes and scan lines are formed in the same layers and are denoted by the same reference numerals. Similarly, source electrodes, drain electrodes, and signal lines are formed in the same layers and are denoted by the same reference numerals.

Through the above-described steps, the liquid crystal display device can be manufactured. The thin film transistor included in the liquid crystal display device in this embodiment mode is formed according to any of the methods of the above-described embodiment modes. Therefore, since the thin film transistor has a very small amount of off current and high reliability in electric characteristics, the liquid crystal display device described in this embodiment mode can have high contrast and high visibility.

Embodiment Mode 9

The present invention can be applied not only to a liquid crystal display device but also a light-emitting device. In this embodiment mode, a manufacturing process of a light-emitting device is described with reference to FIGS. 39A and 39B and FIGS. 40A to 40C. A light-emitting element utilizing electroluminescence is used for a light-emitting device. Light-emitting elements utilizing electroluminescence are classified according to whether a light-emitting material is an organic compound or an inorganic compound. In general, the former is referred to as organic EL elements and the latter as inorganic EL elements.

In an organic EL element, when voltage is applied to a light-emitting element, carriers (electrons and holes) are injected from a pair of electrodes into a layer containing a light-emitting organic compound, and current flows therethrough. Then, recombination of these carriers (the electrons and holes) allows the light-emitting organic compound to form an excited state and to emit light when the carriers in the organic compound return from the excited state to a ground state. Due to such a mechanism, such a light-emitting element is referred to as a current-excitation type light-emitting element.

Inorganic EL elements are classified into a dispersion type inorganic EL element and a thin-film type inorganic EL element depending on their element structures. A dispersion type inorganic EL element has a light-emitting layer where particles of a light-emitting material are dispersed in a binder, and its light emission mechanism is donor-acceptor recombination type light emission which utilizes a donor level and an acceptor level. A thin-film type inorganic EL element has a structure where a light-emitting layer is sandwiched between dielectric layers, which are further sandwiched between a pair of electrodes, and its light emission mechanism is localized type light emission which utilizes inner-shell electron transition of metal ions.

Note that here, an organic EL element is used as a light-emitting element. In addition, a thin film transistor formed according to any of the methods of the above-described embodiment modes is used as a thin film transistor which controls driving of a light-emitting element.

A thin film transistor 901 and a thin film transistor 902 are formed over a substrate 900, as illustrated in FIG. 39A. In FIG. 39A, an insulating layer 903 functioning as a protective layer is formed over the thin film transistors 901 and 902, and an insulating layer 904 is formed over the insulating layer 903. The insulating layer 904 is provided for flattening a top surface. The insulating layer 903 may be formed using silicon oxide, silicon nitride, silicon oxynitride or the like, for example. The insulating layer 904 is preferably formed using an organic resin such as acrylic, polyimide, or polyamide, or siloxane.

A conductive layer 905 is formed over the insulating layer 904. The conductive layer 905 functions as a pixel electrode. In the case where the thin film transistor of a pixel is an n-channel transistor, it is preferable to form a cathode as the pixel electrode. On the other hand, in the case where the thin film transistor is a p-channel transistor, it is preferable to form an anode as the pixel electrode. Specifically, in a case a cathode serves as a pixel electrode, a material with low work function, such as Ca, Al, CaF, MgAg, or AlLi, may be used.

Next, as illustrated in FIG. 39B, a partition 906 is formed over the insulating layer 904 and a side face (an end portion) of the conductive layer 905. The partition 906 has an opening portion and the conductive layer 905 is exposed in the opening portion. The partition 906 is formed with an organic resin layer, an inorganic insulating layer, or organic polysiloxane. More preferably, the partition 906 is formed using a photosensitive material, the partition 906 over the conductive layer 905 is exposed to light so that an opening portion is formed. In this case, a sidewall of the opening portion is preferably formed as a tilted surface with continuous curvature.

Next, a light-emitting layer 907 is formed so as to be in contact with the conductive layer 905 in the opening portion of the partition 906. The light-emitting layer 907 may be formed with either a single-layer structure or a stacked-layer structure of a plurality of layers.

Then, a conductive layer 908 is formed so as to cover the light-emitting layer 907. The conductive layer 908 is referred to as a common electrode. In a case where the conductive layer 905 is formed using a material for a cathode, the conductive layer 908 is formed using a material used to form an anode. The conductive layer 908 can be formed of a light-transmitting conductive layer using any of the light-transmitting conductive materials described in Embodiment Mode 2 for the pixel electrode layer. As the conductive layer 908, a titanium nitride layer or a titanium layer may be used. In FIG. 39B, indium tin oxide (ITO) is used for the conductive layer 908. In the opening portion of the partition 906, a light-emitting element 909 is formed by overlapping of the conductive layer 905, the light-emitting layer 907, and the conductive layer 908. After that, it is preferable to form a protective layer 910 over the conductive layer 908 and the partition 906 so that oxygen, hydrogen, moisture, carbon dioxide, and the like cannot enter the light-emitting element 909. As the protective layer 910, a silicon nitride layer, a silicon nitride oxide layer, a DLC layer, or the like can be used.

More preferably, after the steps of FIG. 39B is finished, packaging (encapsulation) is performed so that the light-emitting element is not exposed to air, using a protective film (a film, an ultraviolet curable resin film, or the like) or a cover material, which has high airtightness and causes less degassing.

Next, structures of light-emitting elements are described with reference to FIGS. 40A to 40C. Here, the case where a driving transistor is an n-channel transistor is illustrated as an example, and cross-sectional structures of pixels are described.

It is acceptable as long as light-emitting element has a transparent electrode for at least one of an anode and a cathode in order to extract light emission. There are light-emitting elements having the following structures: a top emission structure where a thin film transistor and a light-emitting element are formed over a substrate and light is extracted from a side opposite to the substrate; a bottom emission structure where light is extracted from the substrate side; and a dual emission structure where light is extracted from both the substrate side and the side opposite to the substrate. The present invention can be applied to a light-emitting element with any of the emission structures.

Figure 40A:
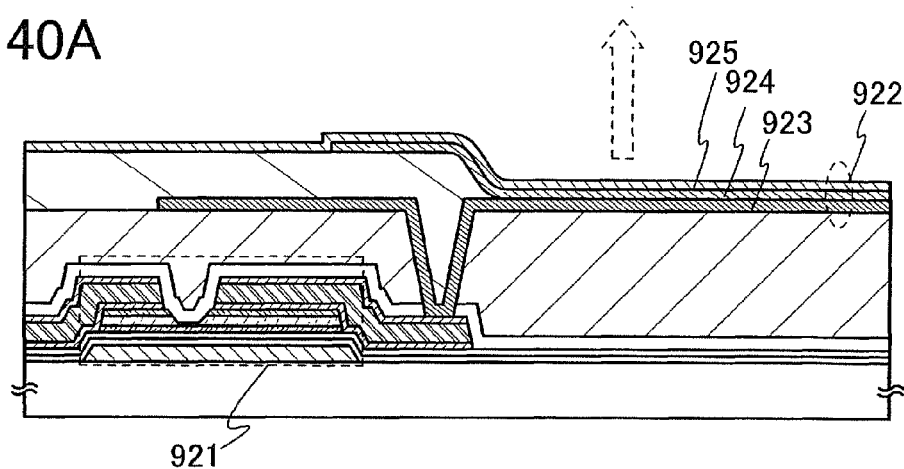
FIGS. 40A to 40C illustrate light-emitting devices to which the present invention can be applied.

FIG. 40A illustrates a light-emitting element having a top emission structure. FIG. 40A is a cross-sectional view of a pixel in the case where a driving transistor 921 is an n-channel thin film transistor and light is emitted from a light-emitting element 922 to an anode 925 side. In FIG. 40A, a cathode 923 of the light-emitting element 922 is electrically connected to the driving transistor 921, and a light-emitting layer 924 and the anode 925 are sequentially stacked over the cathode 923. The cathode 923 may be formed using a conductive material that has a low work function and can reflect light (for example, Ca, Al, CaF, MgAg, AlLi, or the like). The light-emitting layer 924 may be formed using either a single-layer structure or a stacked-layer structure of a plurality of layers. In the case of using a plurality of layers, an electron injection layer, an electron transport layer, a light-emitting layer, a hole transport layer, and/or a hole injection layer are stacked in that order over the cathode 923. Note that all these layers are not necessarily provided. The anode 925 is formed using a light-transmitting conductive layer which transmits light, and for example, a light-transmitting conductive layer of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

A region where the light-emitting layer 924 is sandwiched between the cathode 923 and the anode 925 corresponds to the light-emitting element 922. In the case of the pixel shown in FIG. 40A, light is emitted from the light-emitting element 922 to the anode 925 side, as indicated by an outlined arrow.

Figure 40B:
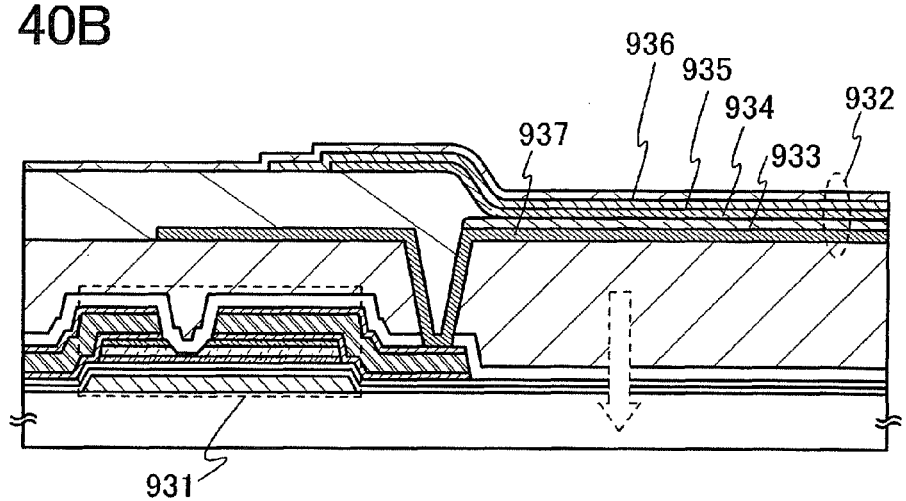

FIG. 40B illustrates a light-emitting element having a bottom emission structure. FIG. 40B is a cross-sectional view of a pixel in the case where a driving transistor 931 is an n-channel thin film transistor and light is emitted from a light-emitting element 922 to a cathode 933 side. In FIG. 40B, the cathode 933 of the light-emitting element 922 is formed over a light-transmitting conductive layer 937 which is electrically connected to the driving transistor 931, and a light-emitting layer 934 and an anode 935 are sequentially stacked over the cathode 933. Note that in the case where the anode 935 has light-transmitting properties, a shielding layer 936 for reflecting or shielding light may be formed so as to cover the anode 935. In a manner similar to that of the case of FIG. 40A, the cathode 933 may be a conductive layer formed using a conductive layer having a low work function, and a known material can be used therefor. Note that the thickness is set such that light can be transmitted therethrough (preferably about 5 nm to 30 nm). For example, aluminum having a thickness of 20 nm can be used as the cathode 933. In a manner similar to that of the case of FIG. 40A, the light-emitting layer 934 can be formed using either a single-layer structure or a stacked-layer structure of a plurality of layers. Although the anode 935 does not need to be able to transmit light, the anode 935 can be formed using a light-transmitting conductive material in a manner similar to that of FIG. 40A. The light-shielding layer 936 can be formed using, for example, a metal layer which reflects light, or the like. However, the present invention is not limited to this. For example, a resin to which a black pigment is added can also be used.

A region where the light-emitting layer 934 is sandwiched between the cathode 933 and the anode 935 corresponds to the light-emitting element 932. In the case of the pixel shown in FIG. 40B, light is emitted from the light-emitting element 932 to the cathode 933 side as indicated by an outlined arrow.

Figure 40C:
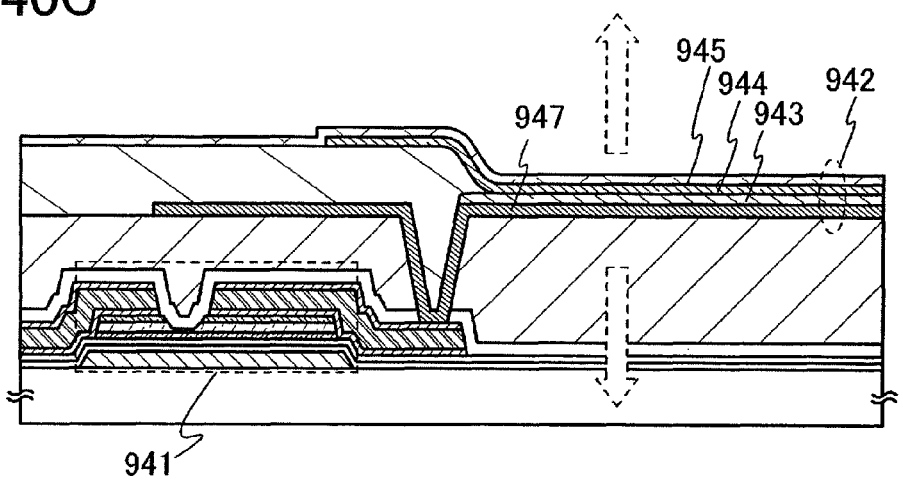

Next, FIG. 40C illustrates a light-emitting element having a dual emission structure. In FIG. 40C, a cathode 943 of a light-emitting element 942 is formed over a light-transmitting conductive layer 947 which is electrically connected to a driving transistor 941, and a light-emitting layer 944 and an anode 945 are sequentially stacked over the cathode 943. In a manner similar to that of FIG. 40A, the cathode 943 can be formed using a conductive layer having a low work function, and a known material can be used therefor. Note that the thickness is set such that light is transmitted therethrough. For example, an aluminum film formed to a thickness of about 20 nm can be used as the cathode 943. In a manner similar to that of FIG. 40A, the light-emitting layer 944 may be formed using either a single-layer structure or a stacked-layer structure of a plurality of layers. In a manner similar to that of FIG. 40A, the anode 945 can be formed using a light-transmitting conductive material.

A region where the cathode 943, the light-emitting layer 944, and the anode 945 overlap with each other corresponds to the light-emitting element 942. In the case of the pixel shown in FIG. 40C, light is emitted from the light-emitting element 942 to both the anode 945 side and the cathode 943 side as indicated by outlined arrows.

Note that although an organic EL element is described here as a light-emitting element, an inorganic EL element can also be used as a light-emitting element.

Note that although the example in which a thin film transistor (a driving transistor) which controls driving of a light-emitting element is directly connected to the light-emitting element is described in this embodiment mode, a transistor for controlling current may be connected between the driving transistor and the light-emitting element.

Note that the light-emitting device described in this embodiment mode is not limited to the structures shown in FIGS. 40A to 40C, and can be modified in various ways based on the technical idea of the present invention.

Through the above-described steps, the light-emitting device can be manufactured. A thin film transistor formed according to any of the methods of the above-described embodiment modes is used as the thin film transistor included in the light-emitting device of this embodiment mode. Therefore, since the thin film transistor has small off current and high reliability in electric characteristics, the light-emitting device described in this embodiment mode can have high contrast and high visibility.

Embodiment Mode 10

Next, a mode of a display panel which is incorporated in the display device described in Embodiment Mode 8 or a light-emitting panel which is incorporated in the light-emitting device described in Embodiment Mode 9 is described with reference to drawings.

In a liquid crystal display device or light-emitting device of the present invention, a signal line driver circuit and a scan line driver circuit which are connected to a pixel portion are preferably provided over a different substrate (e.g., a semiconductor substrate or an SOI substrate) and connected. However, the signal line driver circuit and the scan line driver circuit may be formed over the same substrate as a pixel circuit, instead of providing the signal line driver circuit and the scan line driver circuit over a different substrate. Note that in this embodiment mode, a liquid crystal display device and a light-emitting device are collectively referred to as a display device.

Note that a connection method of a substrate which is separately formed is not particularly limited, and a known COG method, wire bonding method, TAB method, or the like can be used. Further, a connection position is not particularly limited to a certain position as long as electric connection is possible. Moreover, a controller, a CPU, a memory, and/or the like may be formed separately and connected to the pixel circuit.

Figure 41:
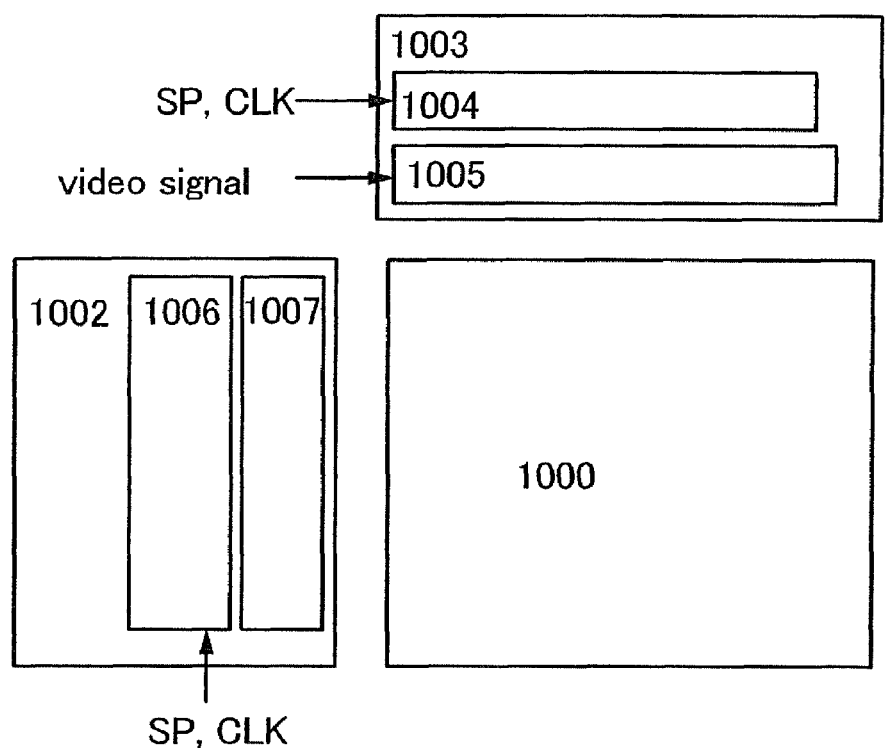
FIG. 41 is a block diagram illustrating a structure of a display device to which the present invention can be applied.

FIG. 41 is a block diagram of a display device of the present invention. The display device shown in FIG. 41 includes a pixel portion 1000 including a plurality of pixels each provided with a display element, a scan line driver circuit 1002 which selects each pixel, and a signal line driver circuit 1003 which controls input of a video signal to a selected pixel.

Note that the display device of the present invention is not limited to the structure shown in FIG. 41. That is, a signal line driver circuit used in the present invention is not limited to a structure including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

The signal line driver circuit 1003 shown in FIG. 41 includes a shift register 1004 and an analog switch 1005. A clock signal (CLK) and a start pulse signal (SP) are input to the shift register 1004. When the clock signal (CLK) and the start pulse signal (SP) are input, a timing signal is generated in the shift register 1004 and the timing single is input into the analog switch 1005.

In addition, a video signal is supplied to the analog switch 1005. The analog switch 1005 samples the video signal in accordance with the input timing signal and supplies the sampled signal to a signal line of the next stage.

The scan line driver circuit 1002 shown in FIG. 41 includes a shift register 1006 and a buffer 1007. The scan line driver circuit 1002 may include a level shifter. In the scan line driver circuit 1002, when the clock signal (CLK) and the start pulse signal (SP) are input to the shift register 1006, a selection signal is produced. The produced selection signal is buffered and amplified by the buffer 1007, and the buffered and amplified signal is supplied to a corresponding scan line. Gates of transistors in all pixels of one line are connected to the scan line. Further, since the transistors in the pixels of one line should be turned on at the same time in the operation, a buffer through which large current can flow is used as the buffer 1007.

In a full-color display device, when video signals corresponding to R (red), G (green), and B (blue) are sequentially sampled and supplied to a corresponding signal line, the number of terminals for connecting the shift register 1004 and the analog switch 1005 corresponds to approximately ⅓ of the number of terminals for connecting the analog switch 1005 and the signal line of the pixel portion 1000. Accordingly, when the analog switch 1005 and the pixel portion 1000 are formed over the same substrate, the number of terminals used for connecting substrates which are separately formed can be suppressed compared to the case where the analog switch 1005 and the pixel portion 1000 are formed over different substrates. Thus, occurrence probability of defective connection can be suppressed, and thus yield can be improved.

Note that although the scan line driver circuit 1002 in FIG. 41 includes the shift register 1006 and the buffer 1007, the present invention is not limited to this. The scan line driver circuit 1002 may be formed using only the shift register 1006.

Note that the structures of the signal line driver circuit and the scan line driver circuit are not limited to the structure shown in FIG. 41, which are merely one mode of the display device of the present invention.

Figure 43A:
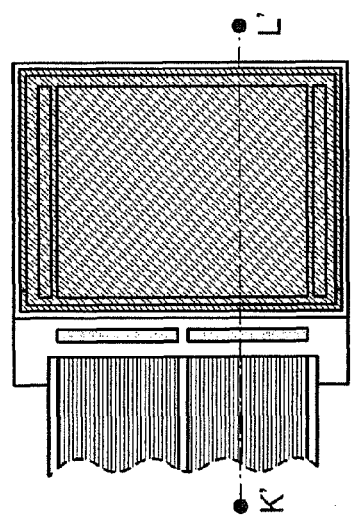
FIGS. 43A and 43B are a top view and a cross-sectional view, respectively, illustrating a light-emitting display panel according to an aspect of the present invention.
Figure 43B:
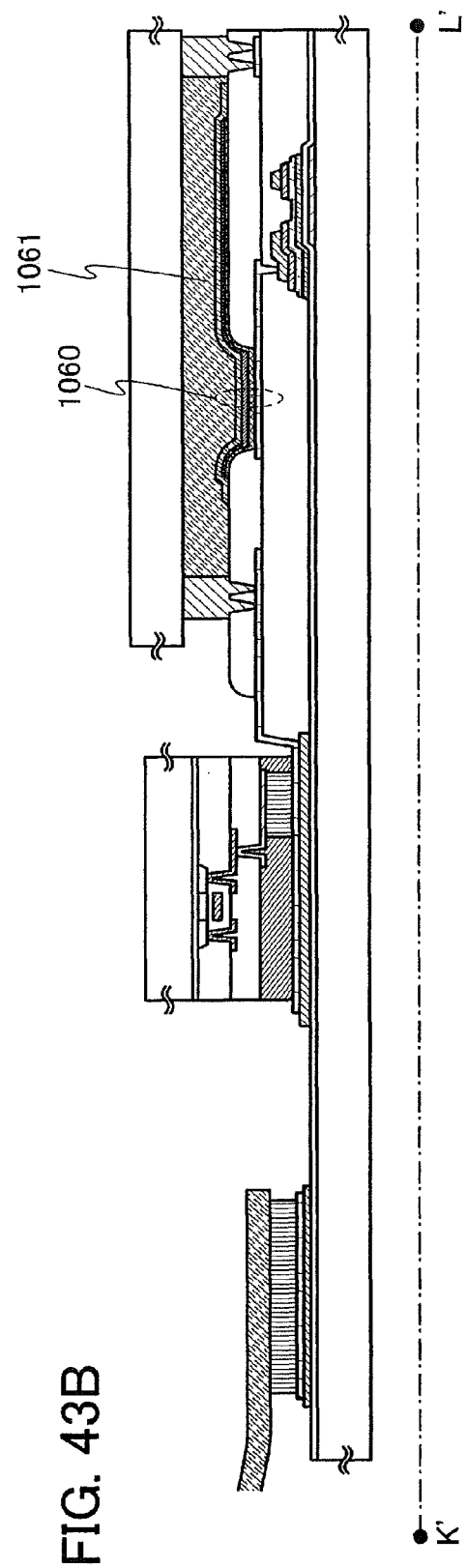

Next, appearance and cross sections of a liquid crystal display panel, and a light-emitting panel, each of which is one mode of the display device of the present invention are described with reference to FIGS. 42A and 42B and FIGS. 43A and 43B. FIG. 42A is a top view of a panel, in which a transistor 1050 having a microcrystalline semiconductor layer and a liquid crystal element 1053 which are formed over a first substrate 1041 are sealed between the first substrate 1041 and a second substrate 1046 by a sealant 1045. FIG. 42B is a cross-sectional view taken along the line K-L in FIG. 42A. FIGS. 43A and 43B illustrate a light-emitting device. Note that only portions which are different from those in FIGS. 42A and 42B are denoted by reference numerals in FIGS. 43A and 43B.

The sealant 1045 is provided so as to surround a pixel portion 1042 and a scan line driver circuit 1044 which are provided over the first substrate 1041. The second substrate 1046 is provided over the pixel portion 1042 and the scan line driver circuit 1044. Thus, the pixel portion 1042 and the scan line driver circuit 1044 are sealed together with a liquid crystal layer 1048 or a filler 1061 by the first substrate 1041, the sealant 1045, and the second substrate 1046. Further, a signal line driver circuit 1043 is mounted on a region over the first substrate 1041, which is different from the region surrounded by the sealant 1045. Note that the signal line driver circuit 1043 is formed with transistors having a polycrystalline semiconductor layer formed over a separately prepared substrate. Note that although an example in which the signal line driver circuit 1043 including a transistor using a polycrystalline semiconductor layer is attached to the first substrate 1041 is described in this embodiment mode, a signal line driver circuit may be formed using a transistor using a single crystal semiconductor and attached to the first substrate 1041. FIG. 42B illustrates a transistor 1049 formed using a polycrystalline semiconductor layer, which is included in the signal line driver circuit 1043.

The pixel portion 1042 provided over the first substrate 1041 includes a plurality of transistors, and in FIG. 42B, a thin film transistor 1050 included in the pixel portion 1042 is exemplified. The scan line driver circuit 1044 also includes a plurality of thin film transistors, and in FIG. 42B, the transistor 1049 included in the signal line driver circuit 1043 is exemplified. In this embodiment mode, as for the light-emitting device, a case where the transistor 1050 is a driving transistor is described, but the transistor 1050 may be a current control transistor or an erasing transistor in the light-emitting device. The transistor 1050 corresponds to a transistor using a microcrystalline semiconductor layer.

A pixel electrode 1052 included in the liquid crystal element 1053 is electrically connected to the transistor 1050 via a wiring 1058. A counter electrode 1057 of the liquid crystal element 1053 is formed on the second substrate 1046. A portion where the pixel electrode 1052, the counter electrode 1057, and the liquid crystal layer 1048 overlap with each other corresponds to the liquid crystal element 1053.

In addition, a pixel electrode included in a light-emitting element 1060 is electrically connected to a source electrode or a drain electrode of the transistor 1050 through a wiring. In addition, in this embodiment mode, a common electrode of the light-emitting element 1060 and a light-transmitting conductive material layer are electrically connected. Note that the structure of the light-emitting element 1060 is not limited to the structure shown in this embodiment mode. The structure of the light-emitting element 1060 can be changed as appropriate in accordance with a direction of light extracted from the light-emitting element 1060, polarity of the transistor 1050, or the like.

Note that as a material of each of the first substrate 1041 and the second substrate 1046, glass, metal (typically stainless steel), ceramics, plastics, or the like can be used. As plastics, a FRP (fiberglass-reinforced plastics) plate, a PVF (polyvinyl fluoride) film, a polyester film, an acrylic resin film or the like can be used. Alternatively, a sheet in which aluminum foil is interposed between PVF films or polyester films can be used.

A spacer 1051 is a bead spacer and is provided for controlling a distance (a cell gap) between the pixel electrode 1052 and the counter electrode 1057. Note that a spacer obtained by selectively etching an insulating layer may be used. That is, a post spacer may be used.

A variety of signals (potentials) supplied to the pixel portion 1042 and the scan line driver circuit 1044, and the signal line driver circuit 1043 which is formed separately are supplied from an FPC (Flexible Printed Circuit) 1047 through the lead wiring 1054 and the lead wiring 1055.

In this embodiment mode, a connection terminal 1056 is formed using the same conductive layer as the pixel electrode 1052 included in the liquid crystal element 1053. Further, the lead wiring 1054 and the lead wiring 1055 are formed using the same conductive layer as the wiring 1058.

The connection terminal 1056 is electrically connected to a terminal included in the FPC 1047 through an anisotropic conductive layer 1059.

Note that although not illustrated, the liquid crystal display device shown in this embodiment mode includes alignment films and polarizing plates, and may also include a color filter, a light-shielding layer or the like.

In this embodiment mode, the connection terminal 1056 is formed using the same conductive layer as the pixel electrode included in the light-emitting element 1060. However, this is not a limiting example.

Note that the second substrate through which light from the light-emitting element 1060 is extracted should have a light-transmitting property. In this case, a light-transmitting substrate such as a glass substrate, a plastic substrate, a polyester film, or an acrylic film is used.

As the filler 1061, an inert gas such as nitrogen or argon, an ultraviolet curable resin, a thermosetting resin, or the like can be used. For example, PVC (polyvinyl chloride), acrylic, polyimide, an epoxy resin, a silicone resin, PVB (polyvinyl butyral), EVA (ethylene vinyl acetate) or the like can be used. In this embodiment mode, for example, nitrogen may be used.

An optical film such as a polarizing plate, a circular polarizing plate (including an elliptical polarizing plate), a retardation plate (a $\lambda/4$ plate, a $\lambda/2$ plate), or a color filter may be provided as appropriate over a light-emitting surface of the light-emitting element. Further, an anti-reflection layer may be provided over a polarizing plate or a circularly polarizing plate.

This embodiment mode can be combined with any of the structures described in the other embodiment modes.

Embodiment Mode 11

Figure 44A:
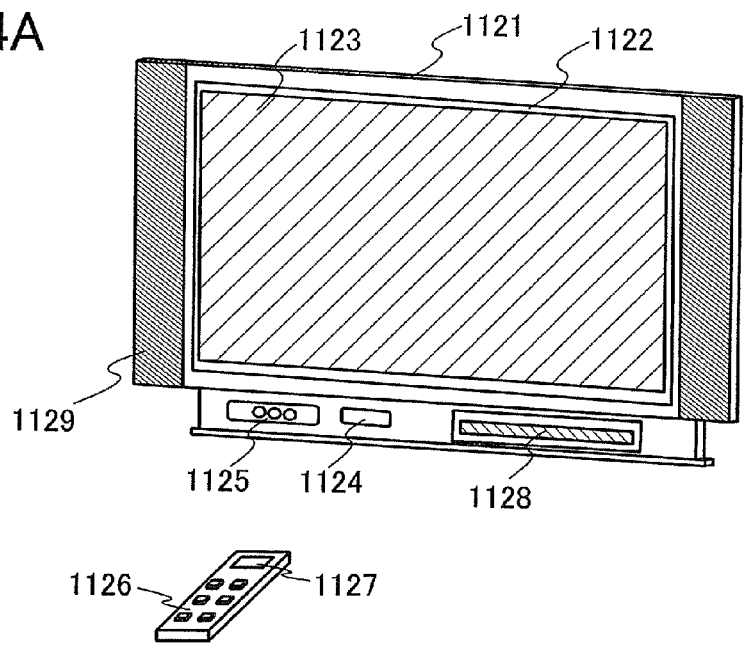
FIGS. 44A to 44C are perspective views illustrating electronic devices having display devices according to an aspect of the present invention.
Figure 44B:
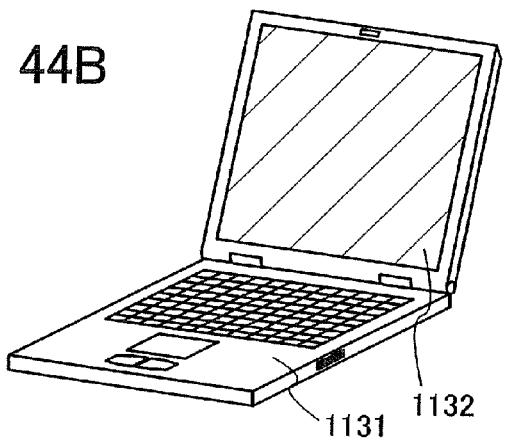
Figure 44C:
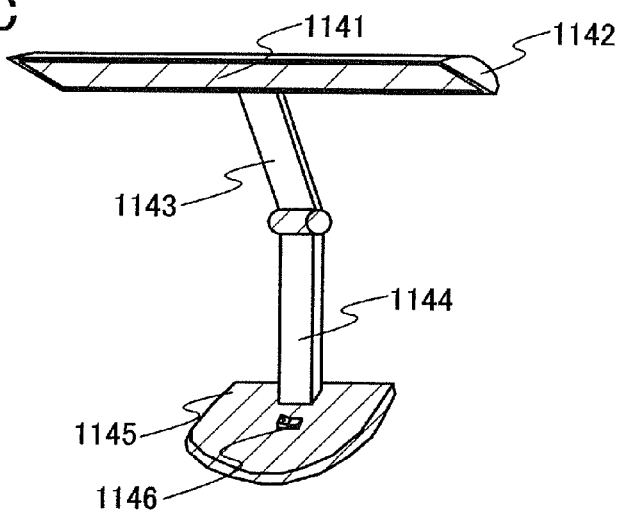

As described in the above embodiment modes, an active matrix display module can be manufactured according to the present invention. Note that a display panel provided with an FPC is called a display module. That is, the present invention can be applied to any of electronic devices in which such an active matrix liquid crystal module is incorporated in a display portion. Examples of such electronic devices are cameras such as video cameras and digital cameras, head-mounted displays (goggle-type displays), car navigation systems, projectors, car stereos, personal computers, portable information terminals (e.g., mobile computers, mobile phones, or electronic books), and the like. FIGS. 44A to 44C show examples of such electronic devices.

FIG. 44A illustrates a television set. A television set can be completed by incorporating a display module in a housing, as illustrated in FIG. 44A. A main screen 1123 is formed using the display module, and a speaker portion 1129, operation switches, and the like are provided as its accessory equipment.

As illustrated in FIG. 44A, a display panel 1122 using a display element is incorporated in a housing 1121. When a receiver 1125 is used, including reception of general TV broadcast, communication of information can also be performed in one way (from a transmitter to a receiver) or in two ways (between a transmitter and a receiver, or between receivers) by connection to a wired or wireless communication network through a modem 1124. The television set can be operated by switches incorporated in the housing or by a remote controller 1126. A display portion 1127 displaying information to be output may also be provided in this remote controller 1126.

In addition, in the television set, a structure for displaying a channel, sound volume, or the like may be added by forming a subscreen 1128 with a second display panel in addition to the main screen 1123. In this structure, the main screen 1123 may be formed with a liquid crystal display panel having a wide viewing angle, and the subscreen 1128 may be formed with a liquid crystal display panel capable of displaying with low power consumption. In addition, when the subscreen 1128 may be a liquid crystal display panel capable of flashing on and off, power consumption can be decreased. Further, power consumption can also reduced by using a light-emitting device for the subscreen.

Figure 45:
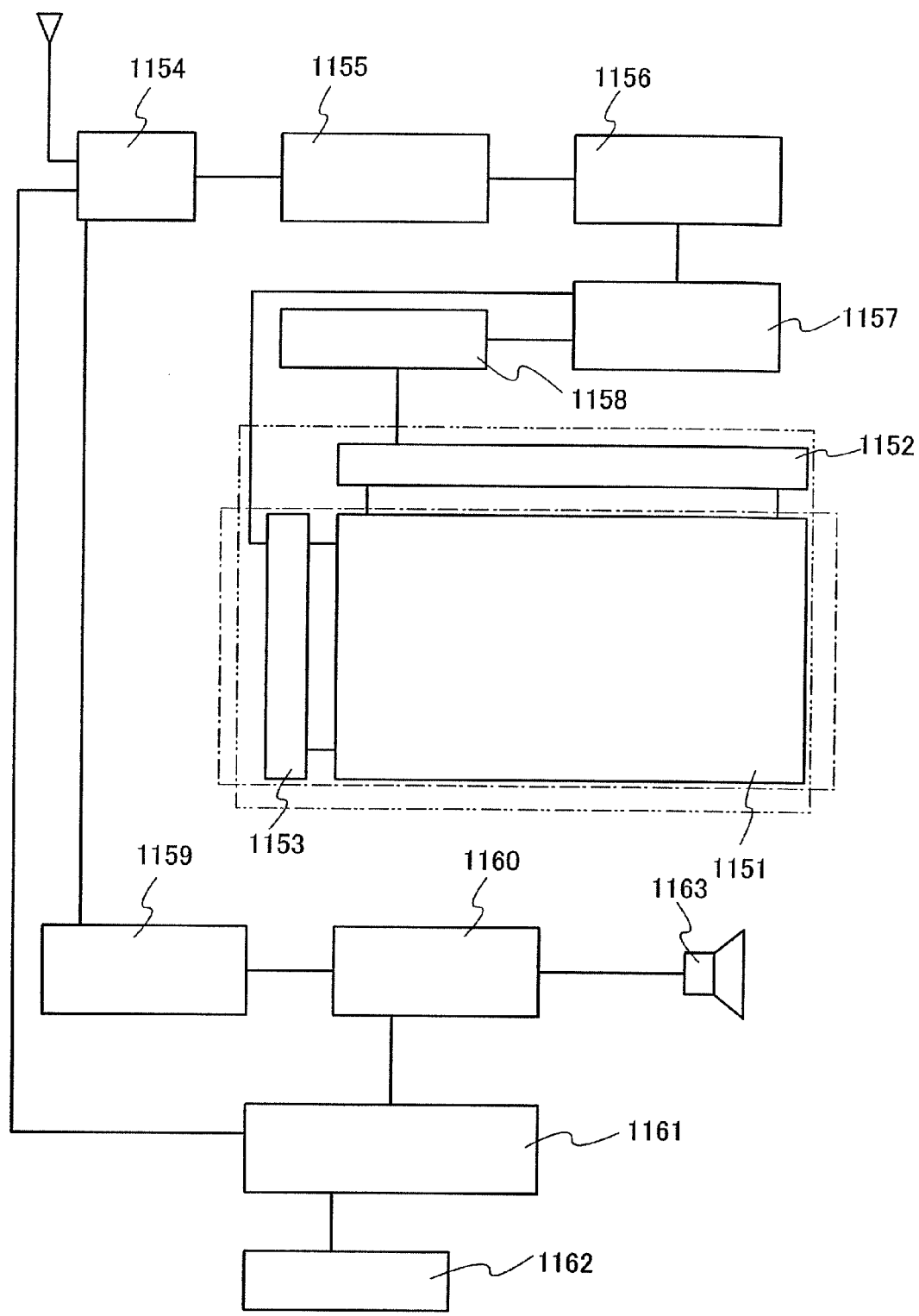
FIG. 45 illustrates an electronic device having a display device according to an aspect of the present invention.

FIG. 45 is a block diagram showing a main structure of a television set which can be applied to the television set illustrated in FIG. 44A. A pixel portion 1151 is formed in a display panel. A signal line driver circuit 1152 and a scan line driver circuit 1153 may be connected as described in any of the other embodiment modes.

As structures of other external circuits, a video signal amplifier circuit 1155 amplifying a video signal among signals received by a tuner 1154, a video signal processing circuit 1156 converting signals output from the video signal amplifier circuit 1155 into chrominance signals corresponding to respective colors of red, green, and blue, a control circuit 1157 for converting the video signal into a signal which meets input specifications of a driver IC, and the like are provided on an input side of the video signal. The control circuit 1157 outputs signals to both a scan line side and a signal line side. In the case of digital driving, a signal dividing circuit 1158 may be provided on the signal line side and an input digital signal may be divided into m pieces to be supplied.

Among the signals received by the tuner 1154, an audio signal is transmitted to an audio signal amplifier circuit 1159, and output thereof is supplied to a speaker 1163 through an audio signal processing circuit 1160. A control circuit 1161 receives control information on a receiving station (receiving frequency) or sound volume from an input portion 1162 and transmits the signal to the tuner 1154 or the audio signal processing circuit 1160.

The present invention is applied to the television set described above, and thereby the television set can have a high contrast ratio, less unevenness in display, and low power consumption.

Needless to say, the present invention is not limited to the television set, and can be applied to various uses particularly as a large display medium such as an information display board at a train station, an airport, or the like, or an advertisement display board on the street, as well as a monitor of a personal computer. The present invention is applied to such a display medium, and thereby the display medium can have a high contrast ratio, less unevenness in display, and low power consumption.

A portable computer illustrated in FIG. 44B includes a main body 1131, a display portion 1132, and the like. According to the present invention, a portable computer including a display device having high contrast ratio, suppressed display unevenness, and low power consumption can be provided.

FIG. 44C shows a lighting equipment which serves as a desk lamp including a lighting portion 1141, a shade 1142, an adjustable arm 1143, a support 1144, a base 1145, and a power source switch 1146. The desk lamp is manufactured using the light-emitting device of the above embodiment mode for the lighting portion 1141. Note that the lighting equipment includes a ceiling light, a wall light, and the like. With use of the display device illustrated in the above embodiment mode, a lighting equipment having an advantages such as low power consumption can be obtained.

Figure 46A:
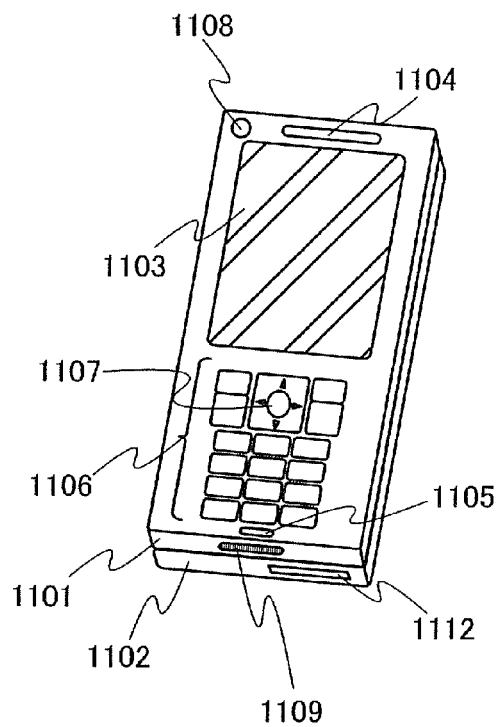
FIGS. 46A to 46C illustrate an electronic device having a display device according to an aspect of the present invention.
Figure 46B:
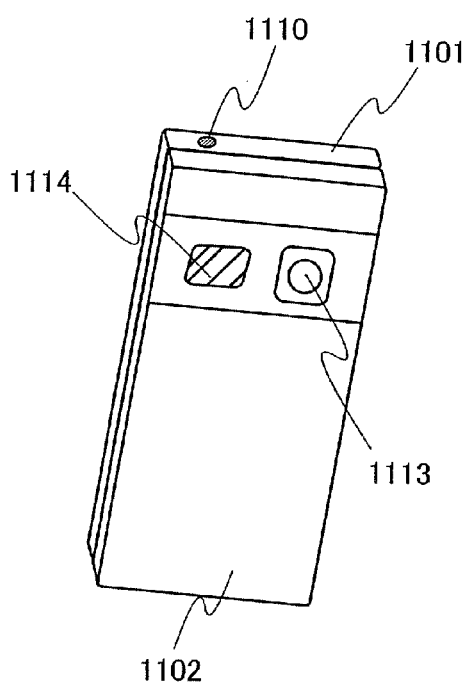
Figure 46C:
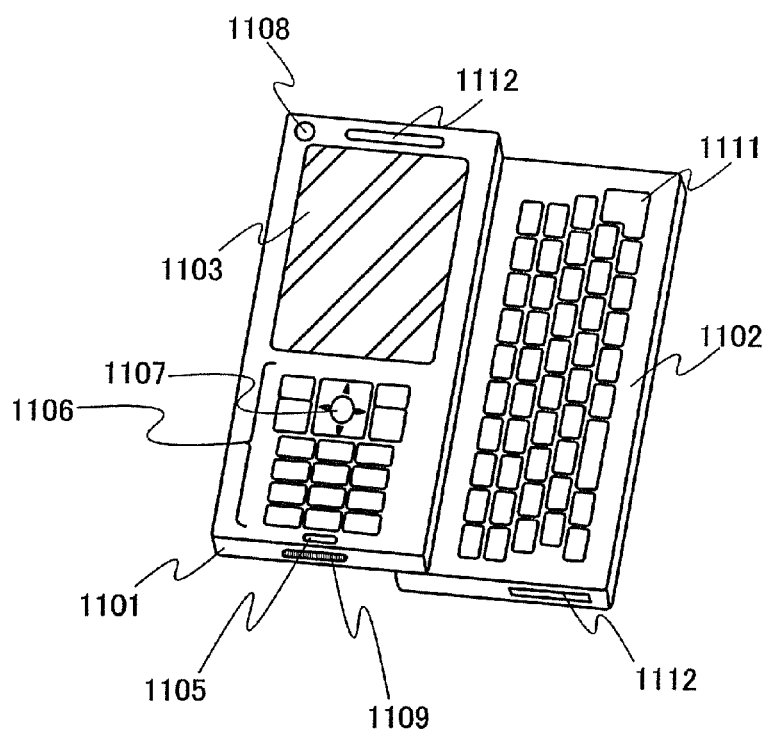

FIGS. 46A to 46C illustrate an example of a structure of a smartphone 1100 to which the present invention is applied. FIG. 46A is a front view, FIG. 46B is a rear view, and FIG. 46C is a front view in which two housings are slid. The smartphone 1100 has two housings 1101 and 1102. The smartphone 1100 has both a function of a mobile phone and a function of a portable information terminal, and incorporates a computer, and thereby it can conduct a variety of data processing in addition to verbal communication (voice calls); therefore, it is called a smartphone.

The smartphone 1100 has the two housings 1101 and 1102. The housing 1101 includes a display portion 1103, a speaker 1104, a microphone 1105, operation keys 1106, a pointing device 1107, a front camera lens 1108, a jack 1109 for an external connection terminal, an earphone terminal 1110, and the like, while the housing 1102 includes a keyboard 1111, an external memory slot 1112, a rear camera 1113, a light 1114, and the like. In addition, an antenna is incorporated in the housing 1101.

Further, in addition to the above structure, the smartphone may incorporate a non-contact IC chip, a small size memory device, or the like.

The housing 1101 and the housing 1102 which are put together to be lapped with each other (FIG. 46A) are developed by sliding as illustrated in FIG. 46C. In the display portion 1103, the display device described in the above embodiment mode can be incorporated, and a display direction can be changed depending on a use mode. Because the front camera lens 1108 is provided in the same plane as the display portion 1103, the smartphone can be used as a videophone. A still image and a moving image can be taken by the rear camera 1113 and the light 1114 by using the display portion 1103 as a viewfinder.

The speaker 1104 and the microphone 1105 can be used for videophone, recording, playback, and the like without being limited to verbal communication. With use of the operation keys 1106, operation of incoming and outgoing of calls, simple information input such as electronic mail, scrolling of a screen, cursor motion, and the like are possible.

If much information is needed to be treated, such as documentation, use as a portable information terminal, and the like, use of the keyboard 1111 is convenient. When the housing 1101 and the housing 1102 which are put together to be lapped with each other (FIG. 46A) are developed by sliding as illustrated in FIG. 46C and the smartphone is used as a portable information terminal, smooth operation can be conducted by using the keyboard 1111 and the pointing device 1107. To the jack 1109 for an external connection terminal, an AC adaptor and various types of cables such as a USB cable can be connected, and charging and data communication with a personal computer or the like are possible. Moreover, by inserting a storage medium into the external memory slot 1112, a large amount of data can be stored and moved.

In the rear surface of the housing 1102 (FIG. 46B), the rear camera 1113 and the light 1114 are provided, and a still image and a moving image can be taken by using the display portion 1103 as a viewfinder.

Further, the smartphone may have an infrared communication function, a USB port, a function of receiving one segment television broadcast, a non-contact IC chip, an earphone jack, or the like, in addition to the above-described functions and structures.

Such electronic devices as described in this embodiment mode can be manufactured by using the thin film transistor described in Embodiment Mode 1 and by applying a manufacturing method and the like described in any of Embodiment Modes 2 to 10. A thin film transistor is manufactured by any method of the above-described embodiment modes, and a display panel having the thin film transistor is incorporated in a variety of such electronic devices as in this embodiment mode. Thereby, a display portion of such electronic devices can have high contrast ratio, suppress display unevenness and have low power consumption. In addition, the display portion can have excellent visibility.

Example 1

A thin film transistor of the present invention has as small off current as $1.0 \times 10^{-11}$ (A) or less, and thus can be applied to a display panel using a large-area substrate. In Example 1, an example of a display panel using a thin film transistor of the present invention as a pixel transistor will now be described.

The display panel described in this example is a 65-inch display panel having aspect ratio of 16:9. In other words, the lateral size is 56.7 inches and the longitudinal size is 31.9 inches. The number of pixels is 4096×2160 (four times as large as full HD). Accordingly, assumed that the size of one group including one pixel (dot) for each color of RGB is substantially equal in the lateral size and the longitudinal size, the size of one group including one pixel (dot) for each color of RGB is 351 μm wide, and 375 μm long. Thus, the area of one pixel is 44000 μm².

The frame frequency is 120 Hz to conduct display with double-frame rate driving (accordingly, one frame period is 1/120 second). Further, full color display with 16777216 colors is possible with the display panel. That is, each pixel of RGB has 8-bit color information ($2^8$=256), and a pixel of one group including one pixel (dot) for each color of RGB has 24-bit color information ($2^{24}$=16777216).

Note that a vertical alignment (VA) mode is employed for a liquid crystal element and the amplitude of a video signal is set within the range of ±10 V.

At this time, when a dielectric layer constituting a capacitor element is a silicon nitride (its dielectric constant is 7) layer having a thickness of 300 nm, a capacitance of the capacitor element per unit area is $2.1 \times 10^{-16}$ (F·μm$^{-2}$). The aperture ratio is 50% and thus a capacitance of one pixel is $9.2 \times 10^{-12}$ (F).

Holding charges in the capacitor element during at least one frame period is needed so that the display panel can conduct excellent display. In this case, the allowable maximum value of voltage drop is half of an absolute value of the amplitude of the video signal for one gradation, and is obtained by (absolute value of amplitude of video signal)/{(the number of grayscales in each of RGB)×2} and is $9.8 \times 10^{-3}$ (V).

In this case, the allowable amount of changes of charges is (capacitance of one pixel)×(allowable maximum value of voltage drop), and an allowable off current is obtained by dividing the allowable amount of changes of charges by one frame period. Accordingly, the allowable off current is $1.08 \times 10^{-11}$ (A), about $1.0 \times 10^{-11}$ (A). Therefore, the off current is needed to be at least $1.0 \times 10^{-11}$ (A) or smaller. Further, $1.0 \times 10^{-12}$ (A) or smaller, which is lower by one digit, is preferable.

A panel which can be applied to the present invention is not limited to the panel described above. For example, when the amplitude of a video signal is ½, the allowable off current is ½. However, by reducing one frame period to half, the allowable off current can be made equal to the value of the above case.

As described in the above embodiment modes, a thin film transistor having off current in the above range can be manufactured according to the present invention. Accordingly, by applying the present invention, a 65-inch full-color display panel or a larger full-color display panel which can operate with double-frame rate driving can be manufactured.

This application is based on Japanese Patent Application serial no. 2007-286942 filed with Japan Patent Office on Nov. 5, 2007, the entire contents of which are hereby incorporated by reference.

REFERENCE NUMERALS

100: insulating substrate, 101: first conductive layer, 102: first insulating layer, 103: second insulating layer, 104: microcrystalline semiconductor layer, 105: amorphous semiconductor layer, 106: impurity semiconductor layer, 106A: source region, 106B: drain region, 107: second conductive layer, 107A: source electrode, 107B: drain electrode, 200: substrate, 202: gate electrode layer, 204: gate insulating layer, 206: microcrystalline semiconductor layer, 208: amorphous semiconductor layer, 210: source region and drain region, 212: source and drain electrode layer, 214: insulating layer, 216: opening portion, 218: pixel electrode layer, 221: resist mask, 222: resist mask, 250*a*: reaction chamber, 250*b*: reaction chamber, 250*c*: reaction chamber, 250*d*: reaction chamber, 253: high-frequency power supply means, 254: high-frequency power source, 256: matching box, 258: gas supply means, 258*a*: gas supply means, 258*b*: gas supply means, 258*f*: gas supply means, 258*g*: gas supply means, 258*i*: gas supply means, 258*n*: gas supply means, 260: cylinder, 262:

stop valve, 263: mass flow controller, 267: butterfly valve, 268: conductance valve, 269: turbomolecular pump, 270: dry pump, 271: cryopump, 272: road/unload chamber, 273: common chamber, 275: gate valve, 276: transport unit, 280: vacuum pump, 400: resist mask, 401: resist mask, 501: pre-coating treatment, 502: substrate carrying-in, 503: first film formation treatment, 504: vacuum evacuation, 505: second film formation treatment, 506: vacuum evacuation, 507: flush treatment, 508: third film formation treatment, 509: substrate carrying-out, 510: second film formation treatment, 511: third film formation treatment, 512: dashed line, 513: dashed line, 600: vacuum evacuation, 601: substrate carrying-in, 602: pre-base treatment, 603: formation treatment of crystal nuclei, 604: deposition treatment, 605: substrate carrying-out, 606: cleaning, 607: dashed line, 608: dashed line, 610: gate insulating layer, 611: crystal nuclei, 612: microcrystalline semiconductor layer, 612A: crystal, 613: amorphous layer, 700: wiring, 701: insulating layer, 702: insulating layer, 703: insulating layer, 704: alignment film, 705: alignment film, 706: wiring, 707: alignment film, 708: alignment film, 709: wiring, 710: wiring, 800: substrate, 801: substrate, 802: wiring, 803: wiring, 804: wiring, 805: wiring, 806: wiring, 807: insulating layer, 808: insulating layer, 809: opening portion, 810: pixel electrode, 811: slit, 812: pixel electrode, 813: thin film transistor 814: thin film transistor 815: storage capacitor portion, 816: storage capacitor portion, 817: light-shielding layer, 818: wiring, 818A: coloring layer, 818B: coloring layer, 818C: coloring layer, 819: counter electrode, 820: spacer, 821: protrusion, 822: alignment film, 823: alignment film, 824: liquid crystal layer, 825: liquid crystal element, 826: liquid crystal element, 827: substrate, 828; wiring, 829: wiring, 830: wiring, 831: wiring, 832: wiring, 833: opening portion, 834: pixel electrode, 835: slit, 836: pixel electrode, 837: opening portion, 838: thin film transistor 839: thin film transistor 840: storage capacitor portion, 841: storage capacitor portion, 842: light-shielding layer, 843: coloring layer, 844: planarizing layer, 845: counter electrode, 846: slit, 847: alignment film, 848: alignment film, 849: liquid crystal layer, 850: liquid crystal element, 851: liquid crystal element, 852: substrate, 853: substrate, 854: wiring, 855: first insulating layer, 856: counter electrode, 858: wiring, 859: wiring, 860: second insulating layer, 861: opening portion, 862: pixel electrode, 863: slit, 864: thin film transistor 865: light-shielding layer, 866: coloring layer, 867: planarizing layer, 868: liquid crystal layer, 869: substrate, 870: substrate, 871: scan line, 872: first insulating layer, 873: alignment film, 874: wiring, 875: alignment film, 876: capacitor electrode, 877: wiring, 878: wiring, 879: second insulating layer, 880: opening portion, 881: pixel electrode, 882: thin film transistor 883: light-shielding layer, 884: opening portion, 885: coloring layer, 886: planarizing layer, 887: liquid crystal layer, 888: substrate, 889: substrate, 890: wiring, 891: wiring, 892: opening portion, 893: pixel electrode, 894: thin film transistor 895: light-shielding layer, 896: coloring layer, 897: planarizing layer, 898: counter electrode, 899: liquid crystal layer, 900: substrate, 901: thin film transistor 902: thin film transistor 903: insulating layer, 904: insulating layer, 905: conductive layer, 906: partition, 907: light-emitting layer, 908: conductive layer, 909: light-emitting element, 910: protective layer, 921: driving transistor, 922: light-emitting element, 923: cathode, 924: light-emitting layer, 925: anode, 931: driving transistor, 932: light-emitting element, 933: cathode, 934: light-emitting layer, 935: anode, 936: light-shielding layer, 937: conductive layer, 941: driving transistor, 942: light-emitting element, 943: cathode, 944: light-emitting layer, 945: anode, 947: conductive layer, 1000: pixel portion, 1002: scan line driver circuit, 1003: signal line driver circuit, 1004: shift register, 1005: analog switch, 1006: shift register, 1007: buffer, 1041: substrate, 1042: pixel portion, 1043: signal line driver circuit, 1044: scan line driver circuit, 1045: sealant, 1046: substrate, 1047: FPC, 1048: liquid crystal layer, 1049: transistor, 1050: transistor, 1051: spacer, 1052: pixel electrode, 1053: liquid crystal element, 1054: wiring, 1055: wiring, 1056: connection terminal, 1057: counter electrode, 1058: wiring, 1059: anisotropic conductive layer, 1060: light-emitting element, 1061: filler, 1100: smartphone, 1101: housing, 1102: housing, 1103: display portion, 1104: speaker, 1105: microphone, 1106: operation key, 1107: pointing device, 1108: front camera lens, 1109: jack for external connection terminal, 1110: earphone terminal, 1111: keyboard, 1112: external memory slot, 1113: rear camera, 1114: light, 1121: housing, 1122: display panel, 1123: main screen, 1124: modem, 1125: receiver, 1126: remote controller, 1127: display portion, 1128: sub screen, 1129: speaker portion, 1131: main body, 1132: display portion, 1141: lighting portion, 1142: shade, 1143: adjustable arm, 1144: support, 1145: base, 1146: power source switch, 1151: pixel portion, 1152: signal line driver circuit, 1153: scan line driver circuit, 1154: tuner, 1155: video signal amplifier circuit, 1156: video signal processing circuit, 1157: control circuit, 1158: signal divider circuit, 1159: audio signal amplifier circuit, 1160: audio signal processing circuit, 1161: control circuit, 1162: input portion, 1163: speaker.

The invention claimed is:

1. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively,
wherein a thickness of a part of the amorphous semiconductor layer overlapping the source region and the drain region is 60 nm or more and less than 80 nm, and a thickness of a part of the amorphous semiconductor layer overlapping a channel formation region is 10 nm or more and less than 30 nm,
wherein a side face of the drain region is present in substantially the same plane as a side face of the recession portion,
wherein the side face of the recession portion is tapered, and
wherein a taper angle which is made by a plane of a bottom surface of the recession portion and the side face of the recession portion and is defined in the amorphous semiconductor layer is within the range of 10° to 50°.

2. The thin film transistor according to claim 1, wherein current flowing between the source region and the drain region is $1.0 \times 10^{-12}$ (A) or smaller in an off state.

3. The thin film transistor according to claim 1, wherein the microcrystalline semiconductor layer includes silicon.

4. The thin film transistor according to claim 1, wherein the amorphous semiconductor layer includes silicon.

5. The thin film transistor according to claim 1, wherein the thin film transistor is incorporated into a display device.

6. The thin film transistor according to claim 1, wherein the microcrystalline semiconductor layer includes an element imparting one conductivity type.

7. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively,
wherein a thickness of a part of the amorphous semiconductor layer overlapping the source region and the drain region is 60 nm or more and less than 80 nm, and a thickness of a part of the amorphous semiconductor layer overlapping a channel formation region is 30 nm or more and less than 50 nm,
wherein a side face of the drain region is present in substantially the same plane as a side face of the recession portion,
wherein the side face of the recession portion is tapered, and
wherein a taper angle which is made by a plane of a bottom surface of the recession portion and the side face of the recession portion and is defined in the amorphous semiconductor layer is within the range of 10° to 70°.

8. The thin film transistor according to claim 7, wherein current flowing between the source region and the drain region is $1.0 \times 10^{-12}$ (A) or smaller in an off state.

9. The thin film transistor according to claim 7, wherein the microcrystalline semiconductor layer includes silicon.

10. The thin film transistor according to claim 7, wherein the amorphous semiconductor layer includes silicon.

11. The thin film transistor according to claim 7, wherein the thin film transistor is incorporated into a display device.

12. The thin film transistor according to claim 7, wherein the microcrystalline semiconductor layer includes an element imparting one conductivity type.

13. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively,
wherein a thickness of a part of the amorphous semiconductor layer overlapping the source region and the drain region is 80 nm or more and less than 100 nm, and a thickness of a part of the amorphous semiconductor layer overlapping a channel formation region is 10 nm or more and less than 30 nm,
wherein a side face of the drain region is present in substantially the same plane as a side face of the recession portion,
wherein the side face of the recession portion is tapered, and
wherein a taper angle which is made by a plane of a bottom surface of the recession portion and the side face of the recession portion and is defined in the amorphous semiconductor layer is within the range of 10° to 50°.

14. The thin film transistor according to claim 13, wherein current flowing between the source region and the drain region is $1.0 \times 10^{-12}$ (A) or smaller in an off state.

15. The thin film transistor according to claim 13, wherein the microcrystalline semiconductor layer includes silicon.

16. The thin film transistor according to claim 13, wherein the amorphous semiconductor layer includes silicon.

17. The thin film transistor according to claim 13, wherein the thin film transistor is incorporated into a display device.

18. The thin film transistor according to claim 13, wherein the microcrystalline semiconductor layer includes an element imparting one conductivity type.

19. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively,
wherein a thickness of a part of the amorphous semiconductor layer overlapping the source region and the drain region is 100 nm or more and less than 140 nm, and a thickness of a part of the amorphous semiconductor layer overlapping a channel formation region is 10 nm or more and less than 30 nm,
wherein a side face of the drain region is present in substantially the same plane as a side face of the recession portion,
wherein the side face of the recession portion is tapered, and
wherein a taper angle which is made by a plane of a bottom surface of the recession portion and the side face of the recession portion and is defined in the amorphous semiconductor layer is within the range of 10° to 70°.

20. The thin film transistor according to claim 19, wherein current flowing between the source region and the drain region is $1.0 \times 10^{-12}$ (A) or smaller in an off state.

21. The thin film transistor according to claim 19, wherein the microcrystalline semiconductor layer includes silicon.

22. The thin film transistor according to claim 19, wherein the amorphous semiconductor layer includes silicon.

23. The thin film transistor according to claim 19, wherein the thin film transistor is incorporated into a display device.

24. The thin film transistor according to claim 19, wherein the microcrystalline semiconductor layer includes an element imparting one conductivity type.

25. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively,
wherein a thickness of a part of the amorphous semiconductor layer overlapping the source region and the drain region is 140 nm or more and less than 160 nm, and a thickness of a part of the amorphous semiconductor layer overlapping a channel formation region is 10 nm, wherein a side face of the drain region is present in substantially the same plane as a side face of the recession portion, wherein the side face of the recession portion is tapered, and wherein a taper angle which is made by a plane of a bottom surface of the recession portion and the side face of the recession portion and is defined in the amorphous semiconductor layer is 10°.

26. The thin film transistor according to claim 25, wherein current flowing between the source region and the drain region is $1.0 \times 10^{-12}$ (A) or smaller in an off state.

27. The thin film transistor according to claim 25, wherein the microcrystalline semiconductor layer includes silicon.

28. The thin film transistor according to claim 25, wherein the amorphous semiconductor layer includes silicon.

29. The thin film transistor according to claim 25, wherein the thin film transistor is incorporated into a display device.

30. The thin film transistor according to claim 25, wherein the microcrystalline semiconductor layer includes an element imparting one conductivity type.

31. A thin film transistor comprising:
a gate electrode;
a gate insulating layer covering the gate electrode;
a microcrystalline semiconductor layer over the gate insulating layer;
an amorphous semiconductor layer having a recession portion over the microcrystalline semiconductor layer;
a source region and a drain region which are provided over the amorphous semiconductor layer; and
a source electrode and a drain electrode which are in contact with and over the source region and the drain region, respectively, wherein a thickness of a part of the amorphous semiconductor layer overlapping the source region and the drain region is 40 nm or more and less than 160 nm, and a thickness of a part of the amorphous semiconductor layer overlapping a channel formation region is thinner than that of a thickness of the part of the amorphous semiconductor layer overlapping the source region and the drain region, wherein a side face of the drain region is present in substantially the same plane as a side face of the recession portion, wherein the side face of the recession portion is tapered, and wherein a taper angle which is made by a plane of a bottom surface of the recession portion and the side face of the recession portion and is defined in the amorphous semiconductor layer is within the range of 10° to 90°.

32. The thin film transistor according to claim 31, wherein current flowing between the source region and the drain region is $1.0 \times 10^{-12}$ (A) or smaller in an off state.

33. The thin film transistor according to claim 31, wherein the microcrystalline semiconductor layer includes silicon.

34. The thin film transistor according to claim 31, wherein the amorphous semiconductor layer includes silicon.

35. The thin film transistor according to claim 31, wherein the thin film transistor is incorporated into a display device.

36. The thin film transistor according to claim 31, wherein the microcrystalline semiconductor layer includes an element imparting one conductivity type.

* * * * *

UNITED STATES PATENT AND TRADEMARK OFFICE
CERTIFICATE OF CORRECTION

PATENT NO.         : 8,253,138 B2
APPLICATION NO.    : 12/263702
DATED              : August 28, 2012
INVENTOR(S)        : Shunpei Yamazaki et al.

It is certified that error appears in the above-identified patent and that said Letters Patent is hereby corrected as shown below:

At column 10, line 36, "mm" should be --nm--;

At column 10, line 47, "mm" should be --nm--;

At column 10, line 48, "mm" should be --nm--;

At column 10, line 58, "mm" should be --nm--;

At column 11, line 24, "mm" should be --nm--;

At column 42, line 16, "mm" should be --nm--.

Signed and Sealed this
Twentieth Day of November, 2012

David J. Kappos
*Director of the United States Patent and Trademark Office*